US012733367B2

(12) United States Patent
Yoon et al.

(10) Patent No.: US 12,733,367 B2
(45) Date of Patent: *Sep. 8, 2026

(54) ORGANIC LIGHT EMITTING DEVICE

(71) Applicant: LG DISPLAY CO., LTD., Seoul (KR)

(72) Inventors: Seung-Hee Yoon, Paju-si (KR); Sang-Beom Kim, Paju-si (KR); In-Bum Song, Paju-si (KR); Shiren Kazushi, Paju-si (KR); Sasada Yasuyuki, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 737 days.

This patent is subject to a terminal disclaimer.

(21) Appl. No.: 17/329,602

(22) Filed: May 25, 2021

(65) Prior Publication Data

US 2021/0384444 A1 Dec. 9, 2021

(30) Foreign Application Priority Data

May 29, 2020 (KR) ........................ 10-2020-0065138
May 17, 2021 (KR) ........................ 10-2021-0063693

(51) Int. Cl.
*C07B 59/00* (2006.01)
*C07F 5/02* (2006.01)
(Continued)

(52) U.S. Cl.
CPC .............. *H10K 59/32* (2023.02); *C09K 11/06* (2013.01); *H10K 85/623* (2023.02);
(Continued)

(58) Field of Classification Search
CPC ............. H10K 85/6572; H10K 85/623; H10K 85/624; H10K 85/636; H10K 85/654;
(Continued)

(56) References Cited

U.S. PATENT DOCUMENTS

2002/0076576 A1* 6/2002 Li ........................ H10K 85/342 428/917
2011/0121269 A1* 5/2011 Lecloux .................. C07C 15/28 564/426
(Continued)

FOREIGN PATENT DOCUMENTS

CN 110577511 A 12/2019
CN 110857296 A 3/2020
(Continued)

OTHER PUBLICATIONS

Partial Translation First Office Action Report dated Aug. 11, 2023, issued in China Patent Application No. 202110591166.5.
(Continued)

*Primary Examiner* — Rachel Simbana
(74) *Attorney, Agent, or Firm* — Morgan, Lewis & Bockius LLP

(57) ABSTRACT

The present disclosure relates to an organic light emitting device that includes a substrate; and an organic light emitting diode positioned on the substrate and including a first electrode; a second electrode facing the first electrode; a first emitting material layer including a first host of an anthracene derivative and a first dopant of a boron derivative and positioned between the first and second electrodes; and an electron blocking layer including an electron blocking material of a heteroaryl-substituted amine derivative and positioned between the first electrode and the first emitting material layer, wherein an anthracene core of the first host is deuterated.

17 Claims, 5 Drawing Sheets

(51) Int. Cl.

| | |
|---|---|
| ***C09K 11/06*** | (2006.01) |
| ***H10K 50/11*** | (2023.01) |
| ***H10K 50/18*** | (2023.01) |
| ***H10K 50/19*** | (2023.01) |
| ***H10K 59/12*** | (2023.01) |
| ***H10K 59/32*** | (2023.01) |
| ***H10K 59/38*** | (2023.01) |
| ***H10K 85/60*** | (2023.01) |

(52) U.S. Cl.
CPC ......... *H10K 85/624* (2023.02); *H10K 85/636* (2023.02); *H10K 85/654* (2023.02); *H10K 85/6572* (2023.02); *H10K 85/6574* (2023.02); *H10K 85/658* (2023.02); *H10K 50/18* (2023.02); *H10K 59/12* (2023.02)

(58) Field of Classification Search
CPC .... H10K 85/6574; H10K 50/18; H10K 50/11; H10K 85/322; H10K 85/615; H10K 85/657; H10K 59/12; H10K 59/38; H10K 59/32; H10K 71/00; H10K 85/622; H10K 85/626; H10K 85/631; H10K 85/633; C09K 11/06; C09K 2211/1011; C09K 2211/1014; C09K 2211/1022; C09K 2211/1029; C09K 2211/1055; C07B 59/002; C07F 5/02
See application file for complete search history.

(56) References Cited

U.S. PATENT DOCUMENTS

| | | | | |
|---|---|---|---|---|
| 2015/0171356 | A1* | 6/2015 | Nakamura ......... | H10K 85/6572 257/40 |
| 2016/0118592 | A1* | 4/2016 | Park ..................... | H10K 59/123 257/40 |
| 2017/0162790 | A1* | 6/2017 | Kato ...................... | C09K 11/06 |
| 2017/0244047 | A1 | 8/2017 | Lee et al. | |
| 2018/0166647 | A1* | 6/2018 | Shin ...................... | H10K 59/32 |
| 2018/0301629 | A1* | 10/2018 | Hatakeyama ........ | H10K 85/657 |
| 2019/0074451 | A1* | 3/2019 | Lee ...................... | H10K 85/654 |
| 2021/0053998 | A1 | 2/2021 | Kim et al. | |
| 2021/0163411 | A1 | 6/2021 | Li et al. | |

FOREIGN PATENT DOCUMENTS

| | | | |
|---|---|---|---|
| KR | 10-2017-0130434 | A | 11/2017 |
| KR | 10-2018-0067321 | A | 6/2018 |
| KR | 10-2020-0019272 | A | 2/2020 |
| WO | 2020022751 | A1 | 1/2020 |

OTHER PUBLICATIONS

Office Action Report dated May 29, 2025, issued in Korean Intellectual Property Application No. 10-2021-0063693.

* cited by examiner

ORGANIC LIGHT EMITTING DEVICE

CROSS-REFERENCE TO RELATED APPLICATIONS

The present application claims the benefit of Korean Patent Application No. 10-2020-0065138 filed in the Republic of Korea on May 29, 2020, and Korean Patent Application No. 10-2021-063693 filed in the Republic of Korea on May 17, 2021, all which are hereby incorporated by reference in their entirety.

TECHNICAL FIELD

The present disclosure relates to an organic light emitting device, and more specifically, to an organic light emitting diode (OLED) having enhanced emitting efficiency and lifespan and an organic light emitting device including the same.

DISCUSSION OF THE RELATED ART

As requests for a flat panel display device having a small occupied area have been increased, an organic light emitting display device including an OLED has been the subject of recent research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

For example, the organic light emitting display device may include a red pixel region, a green pixel region and a blue pixel region, and the OLED may be formed in each of the red, green and blue pixel regions.

However, the OLED in the blue pixel does not provide sufficient emitting efficiency and lifespan such that the organic light emitting display device has a limitation in the emitting efficiency and the lifespan.

SUMMARY

Accordingly, embodiments of the present disclosure are directed to an OLED and an organic light emitting device including the OLED that substantially obviate one or more of the problems associated with the limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as in the appended drawings.

To achieve these and other advantages in accordance with the purpose of the embodiments of the present disclosure, as embodied and broadly described herein, an organic light emitting device comprises a substrate; and an organic light emitting diode positioned on the substrate and including a first electrode; a second electrode facing the first electrode; a first emitting material layer including a first host of an anthracene derivative and a first dopant of a boron derivative and positioned between the first and second electrodes; and an electron blocking layer including an electron blocking material and positioned between the first electrode and the first emitting material layer, wherein an anthracene core of the first host is deuterated, and the first dopant is represented by Formula 3: [Formula 3]

[Formula 3]

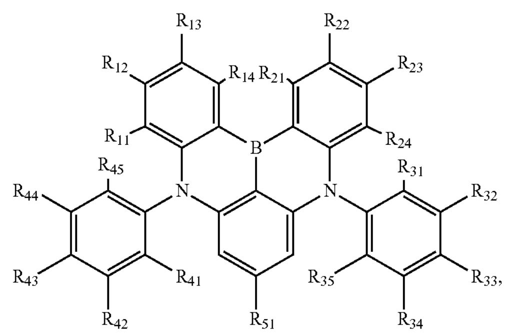

in Formula 3, each of $R_{11}$ to $R_{14}$, each of $R_{21}$ to $R_{24}$, each of $R_{31}$ to $R_{35}$ and each of $R_{41}$ to $R_{45}$ is selected from the group of hydrogen, deuterium (D), C1 to C10 alkyl, C6 to C30 aryl, C6 to C30 arylamino and C5 to C30 heteroaryl, and wherein $R_{51}$ is selected from the group consisting of C12 to C30 arylamino unsubstituted or substituted with at least one of deuterium and C1 to C10 alkyl and non-substituted or deuterated C5 to C30 heteroaryl, wherein the electron blocking material is represented by Formula 5:

[Formula 5]

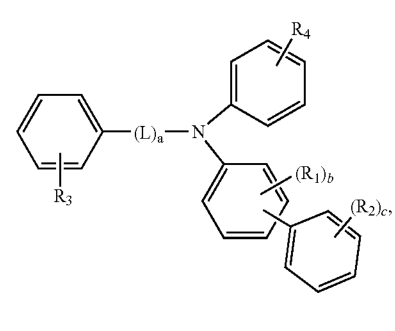

wherein in Formula 5, L is C6~C30 arylene group, wherein $R_1$ and $R_2$ is C1 to C10 alkyl, or adjacent two of $R_1$ and $R_2$ or adjacent two of $R_2$ form a fused ring unsubstituted or substituted with $C_1$-$C_{10}$ alkyl, wherein $R_3$ is C5~C30 hetero aryl group, and $R_4$ is hydrogen or C6~C30 aryl, and wherein "a" is 0 or 1, "b" is an integer of 0 to 4, and "c" is an integer of 0 to 5.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain principles of the present disclosure.

DETAILED DESCRIPTION

Reference will now be made in detail to some of the examples and preferred embodiments, which are illustrated in the accompanying drawings.

Figure 1:
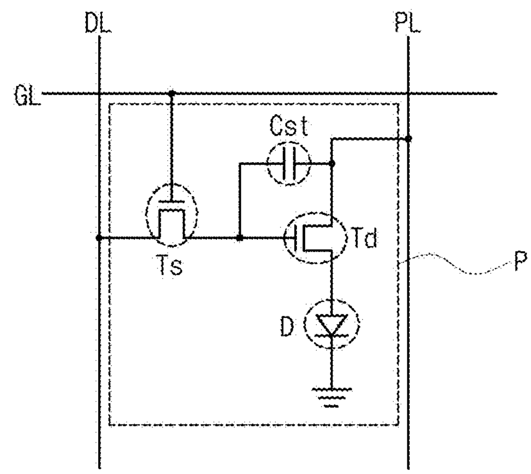
FIG. 1 is a schematic circuit diagram illustrating an organic light emitting display device of the present disclosure.

FIG. 1 is a schematic circuit diagram illustrating an organic light emitting display device of the present disclosure.

As illustrated in FIG. 1, a gate line GL and a data line DL, which cross each other to define a pixel (pixel region) P, and a power line PL are formed in an organic light emitting display device. A switching thin film transistor (TFT) Ts, a driving TFT Td, a storage capacitor Cst and an OLED D are formed in the pixel region P. The pixel region P may include a red pixel, a green pixel and a blue pixel.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied to a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Td. The OLED D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
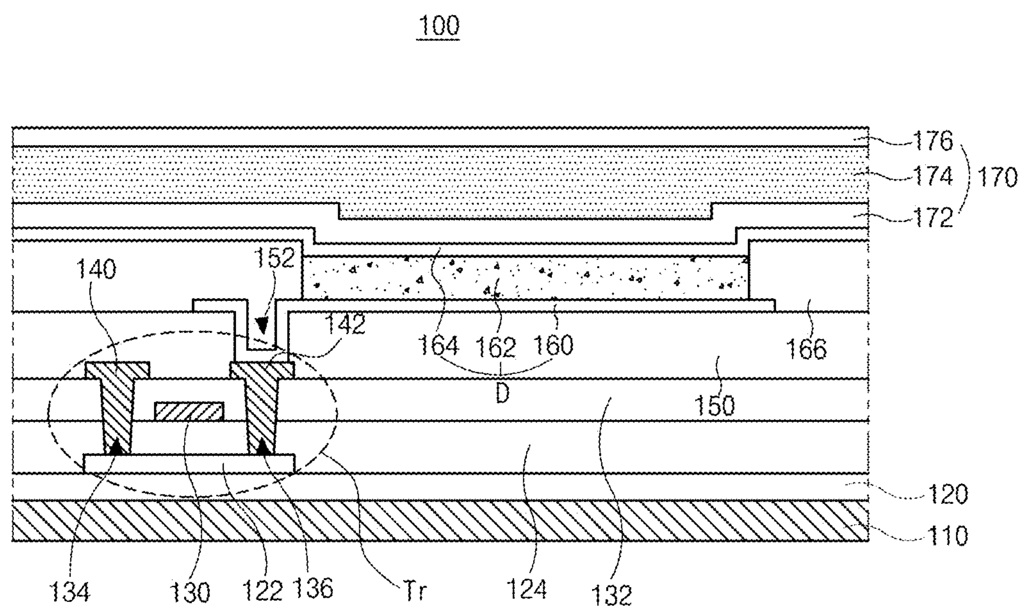
FIG. 2 is a schematic cross-sectional view illustrating an organic light emitting display device according to a first embodiment of the present disclosure.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D connected to the TFT Tr. For example, the organic light emitting display device 100 may include a red pixel, a green pixel and a blue pixel, and the OLED D may be formed in each of the red, green and blue pixels. Namely, the OLEDs D emitting red light, green light and blue light may be provided in the red, green and blue pixels, respectively.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the OLED device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel and exposes a center of the first electrode 160 in the pixel.

An organic emitting layer 162 is formed on the first electrode 160. The organic emitting layer 162 may have a single-layered structure of an emitting material layer including an emitting material. To increase an emitting efficiency of the OLED D and/or the organic light emitting display device 100, the organic emitting layer 162 may have a multi-layered structure.

The organic emitting layer 162 is separated in each of the red, green and blue pixels. As illustrated below, the organic emitting layer 162 in the blue pixel includes an emitting material layer (EML) including a host of an anthracene derivative (anthracene compound), a core of which is deuterated, and a dopant of a boron derivative (boron compound) and an electron blocking layer (EBL) including an amine derivative substituted by heteroaryl (e.g., "heteroaryl-substituted amine derivative"). As a result, the emitting efficiency and the lifespan of the OLED D in the blue pixel are improved.

In addition, the organic emitting layer 162 may further include a hole blocking layer (HBL) including at least one of a hole blocking material of an azine derivative and a hole blocking material of a benzimidazole derivative. As a result, the emitting efficiency and the lifespan of the OLED D are further improved.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg) or Al—Mg alloy.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

A polarization plate (not shown) for reducing an ambient light reflection may be disposed over the top-emission type OLED D. For example, the polarization plate may be a circular polarization plate.

In addition, a cover window (not shown) may be attached to the encapsulation film 170 or the polarization plate. In this instance, the substrate 110 and the cover window have a flexible property such that a flexible display device may be provided.

Figure 3:
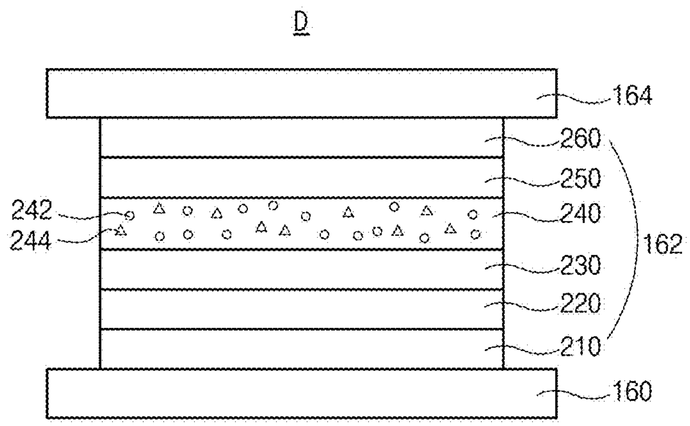
FIG. 3 is a schematic cross-sectional view illustrating an OLED having a single emitting part for the organic light emitting display device according to the first embodiment of the present disclosure.

FIG. 3 is a schematic cross-sectional view illustrating an OLED having a single emitting part for the organic light emitting display device according to the first embodiment of the present disclosure.

As illustrated in FIG. 3, the OLED D includes the first and second electrodes 160 and 164, which face each other, and the organic emitting layer 162 therebetween. The organic emitting layer 162 includes an EML 240 between the first and second electrodes 160 and 164, an EBL 230 between the first electrode 160 and the EML 240, and an HBL 250 between the EML 240 and the second electrode 164.

The first electrode 160 may be formed of a conductive material having a relatively high work function to serve as an anode. The second electrode 164 may be formed of a conductive material having a relatively low work function to serve as a cathode.

In addition, the organic emitting layer 162 may further include a hole transporting layer (HTL) 220 between the first electrode 160 and the EBL 230.

Moreover, the organic emitting layer 162 may further include a hole injection layer (HIL) 210 between the first electrode 160 and the HTL 220 and an electron injection layer (EIL) 260 between the second electrode 164 and the HBL 250.

In the OLED D of the present disclosure, the HBL 250 may include at least one of a hole blocking material of an azine derivative and a hole blocking material of a benzimidazole derivative. The hole blocking material has an electron transporting property such that an electron transporting layer may be omitted. The HBL 250 directly contacts the EIL 260. Alternatively, the HBL may directly contact the second electrode without the EIL 260. However, an electron transporting layer may be formed between the HBL 250 and the EIL 260.

The EML 240 of the organic emitting layer 162 includes the host 242 of an anthracene derivative and the dopant 244 of a boron derivative and provides blue emission. In this instance, the core of the anthracene derivative is deuterated. In addition, a part or all of hydrogens in the boron derivative may be deuterated.

Namely, in the EML 240, the anthracene core of the host 242 is deuterated. The dopant 244 may not be deuterated or may be partially or entirely deuterated.

The host 242 of the deuterated anthracene derivative may be represented by Formula 1:

[Formula 1]

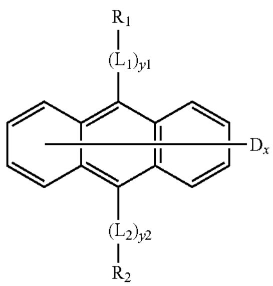

In Formula 1, each of $R_1$ and $R_2$ may be independently $C_6$~$C_{30}$ aryl group or $C_5$~$C_{30}$ heteroaryl group, and $R_1$ and $R_2$ may be same or different. Each of $L_1$ and $L_2$ may be independently $C_6$~$C_{30}$ arylene group, and $L_1$ and $L_2$ may be same or different. In addition, x is an integer of 1 to 8, and each of y1 and y2 is an integer of 0 or 1.

Namely, the anthracene moiety as a core of the host 242 is substituted by deuterium (D), and the substituent except the anthracene moiety is not deuterated.

For example, $R_1$ and $R_2$ may be selected from the group consisting of phenyl, naphthyl, fluorenyl, pyridyl, quinolinyl, dibenzofuranyl, dibenzothiophenyl, phenanthrenyl, carbazolyl and carbolinyl, and $L_1$ and $L_2$ may be selected from the group consisting of phenylene and naphthylene. In addition, x may be 8.

In an exemplary embodiment, the host 242 may be a compound being one of the followings in Formula 2:

[Formula 2]

Host 1

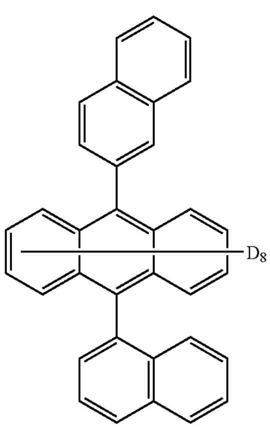

-continued

Host 2

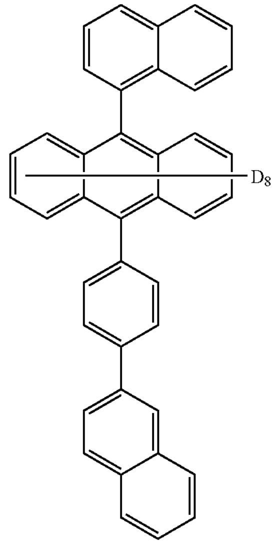

Host 3

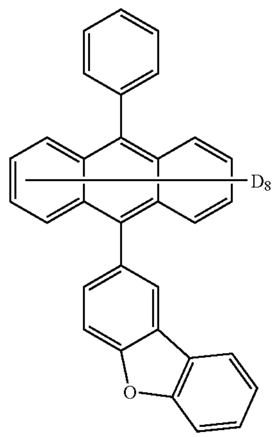

Host 4

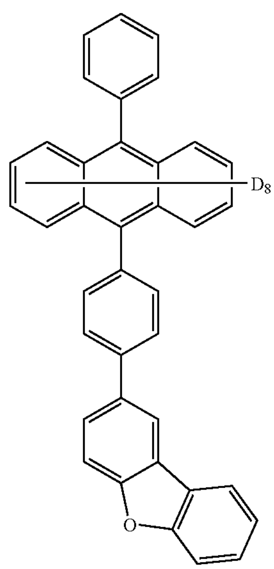

The dopant 244 of the boron derivative may be represented by Formula 3:

[Formula 3]

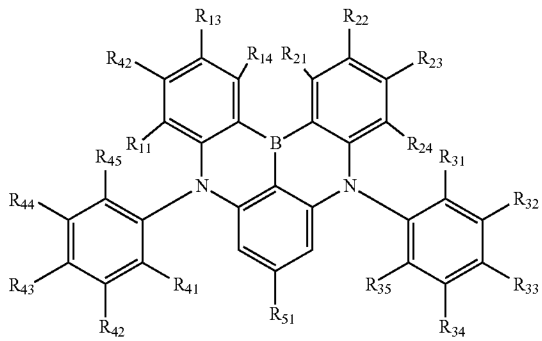

In Formula 3, each of $R_1$ to $R_{14}$, each of $R_{21}$ to $R_{24}$, each of $R_{31}$ to $R_{35}$ and each of $R_{41}$ to $R_{45}$ may be selected from the group of hydrogen, deuterium (D), C1 to C10 alkyl, C6 to C30 aryl, C6 to C30 arylamino and C5 to C30 heteroaryl, and each of $R_1$ to $R_{14}$, each of $R_{21}$ to $R_{24}$, each of $R_{31}$ to $R_{35}$ and each of $R_{41}$ to $R_{45}$ may be same or different. $R_{51}$ may be selected from the group consisting of C12 to C30 arylamino unsubstituted or substituted with at least one of deuterium and C1 to C10 alkyl and non-substituted or deuterated C5 to C30 heteroaryl.

In the boron derivative as the dopant 244, the benzene ring, which is combined to boron atom and two nitrogen atoms, is substituted by one of C12 to C30 arylamino unsubstituted or substituted with at least one of deuterium and C1 to C10 alkyl and non-substituted or deuterated C5 to C30 heteroaryl such that the emitting property of the OLED D including the dopant 244 is improved.

For example, the C1 to C10 alkyl may be one of methyl, ethyl, propyl, butyl and pentyl (amyl). The aryl may be one of phenyl and naphthyl and may be substituted by deuterium or C1 to C10 alkyl. The C12 to C30 arylamino may be one of diphenylamino, phenyl-biphenyl amino, phenyl-naphthylamino and dinaphthylamino, and the C5 to C30 heteroaryl may be one of pyridyl, quinolinyl, carbazolyl, dibenzofuranyl and dibenzothiophenyl. The arylamino, the aryl, the alkyl and the heteroaryl may be deuterated.

In more detail, each of $R_1$ to $R_{14}$, each of $R_{21}$ to $R_{24}$, each of $R_{31}$ to $R_{35}$ and each of $R_{41}$ to $R_{45}$ may be selected from the group consisting of hydrogen, deuterium, methyl, ethyl, propyl, butyl and pentyl (amyl), and $R_{51}$ may be selected from the group consisting of non-substituted or deuterated diphenylamino, non-substituted or deuterated phenyl-biphenyl amino, non-substituted or deuterated phenyl-naphthylamino, non-substituted or deuterated dinaphthylamino and non-substituted or deuterated carbazolyl.

In one embodiment, one of $R_1$ to $R_{14}$, one of $R_{21}$ to $R_{24}$, one of $R_{31}$ to $R_{35}$ and one of $R_{41}$ to $R_{45}$ may be tert-butyl or tert-pentyl (tert-amyl), and the rest of $R_1$ to $R_{14}$, the rest of $R_{21}$ to $R_{24}$, the rest of $R_{31}$ to $R_{35}$ and the rest of $R_{41}$ to $R_{45}$ may be hydrogen or deuterium, and $R_{51}$ may be deuterated diphenylamino. The OLED D includes the compound as a dopant, the emitting efficiency and the color purity of the OLED D are improved.

The dopant 244 of Formula 3 may be a compound being one of the followings in Formula 4:

[Formula 4]

Dopant 1-1

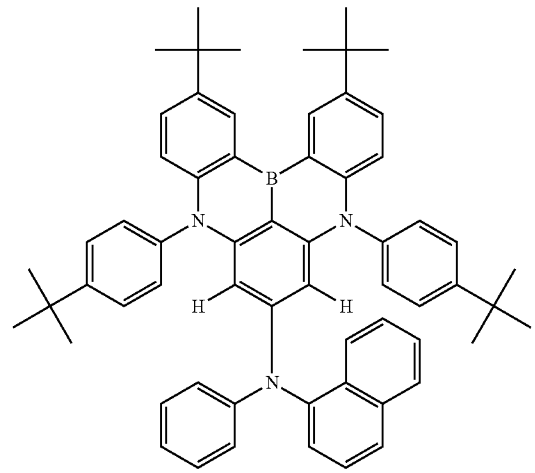

Dopant 1-2

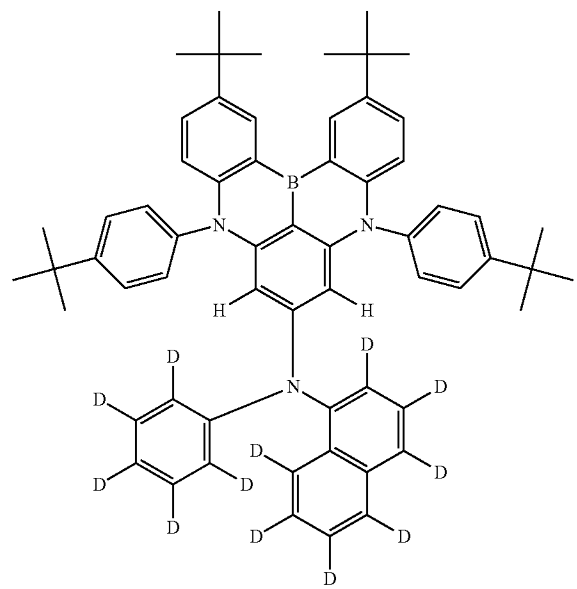

Dopant 1-3

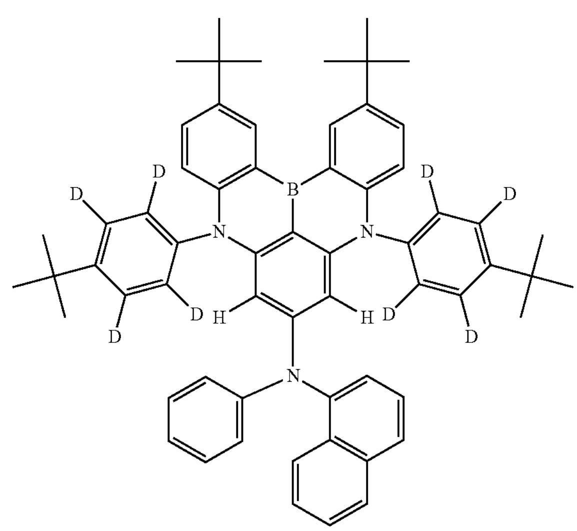

-continued
Dopant 1-4
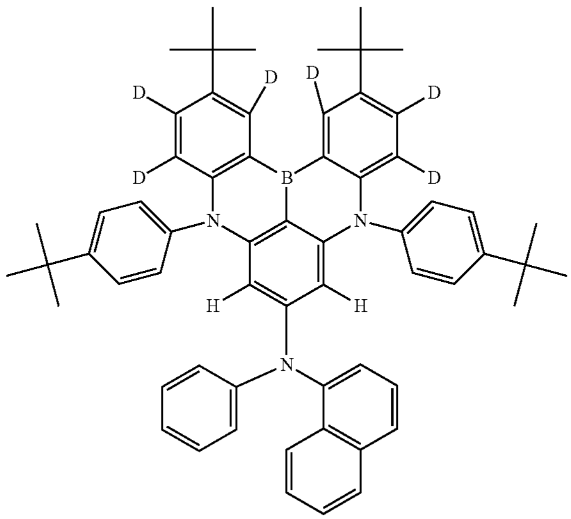
Dopant 1-5
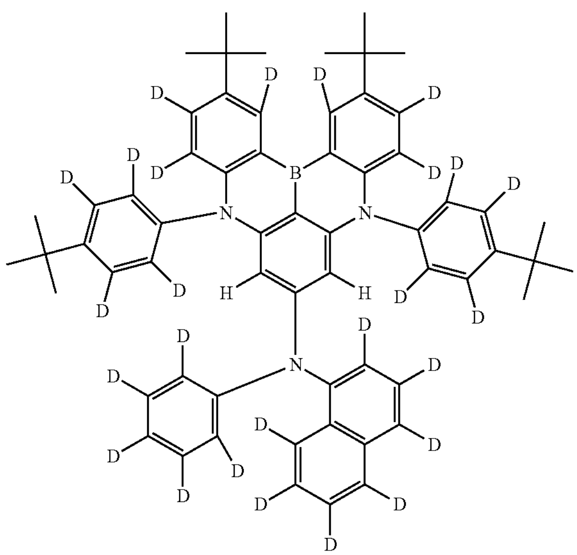
Dopant 2-1
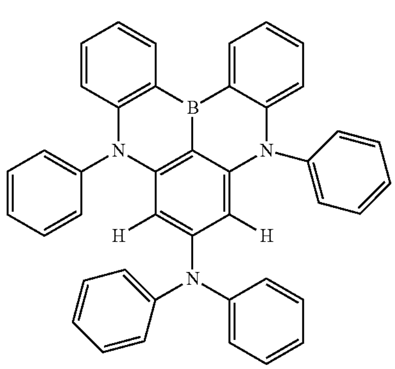
-continued
Dopant 2-2
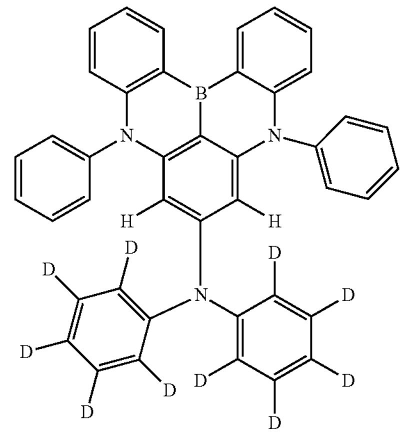
Dopant 2-3
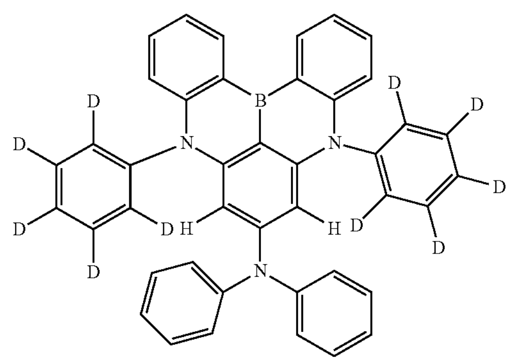
Dopant 2-4
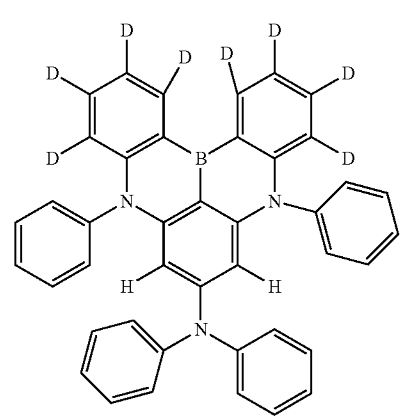

Dopant 2-5
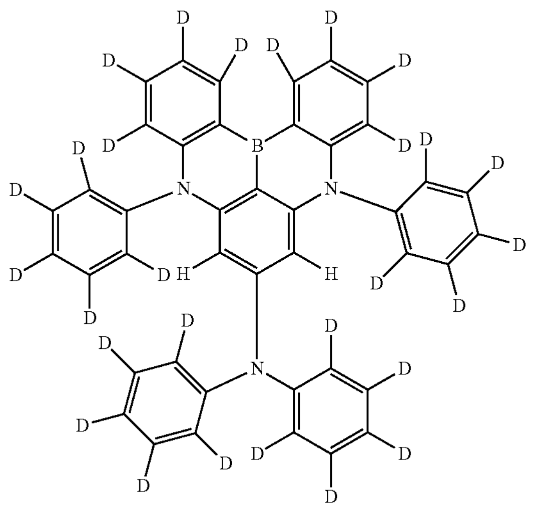
Dopant 3-1
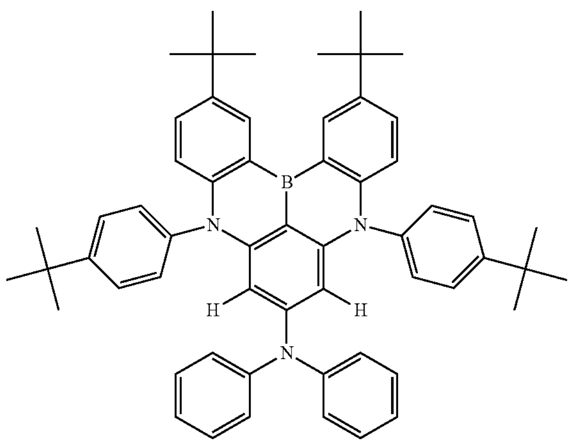
Dopant 3-2
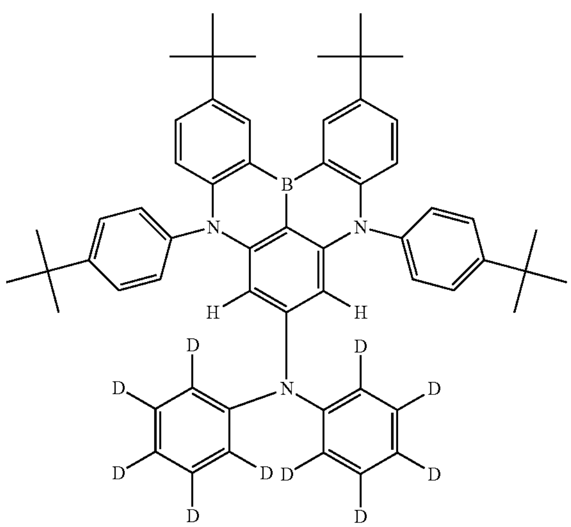
Dopant 3-3
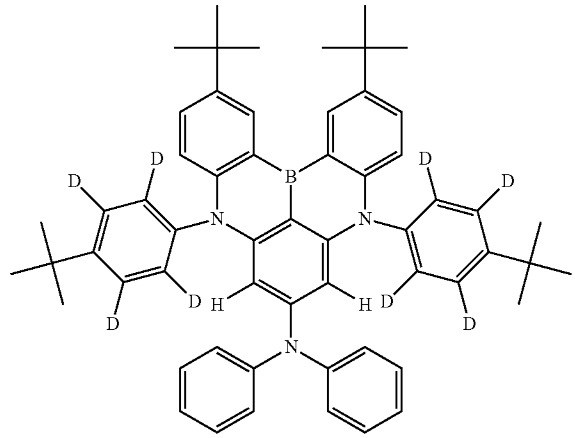
Dopant 3-4
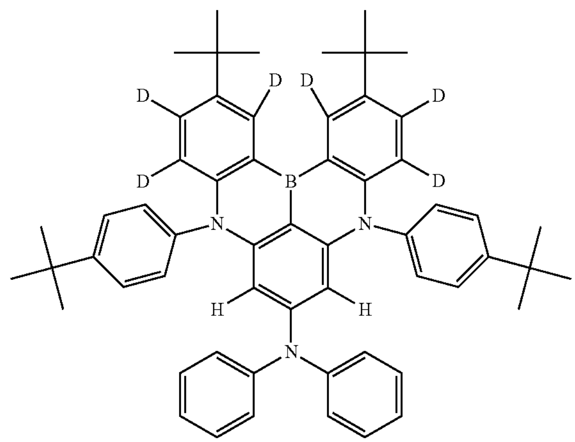
Dopant 3-5
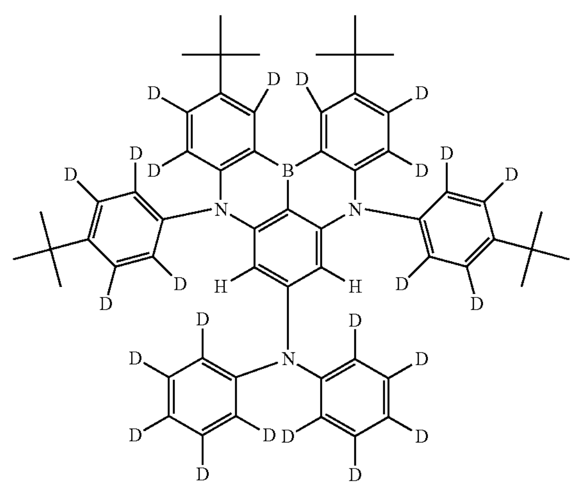

Dopant 4-1
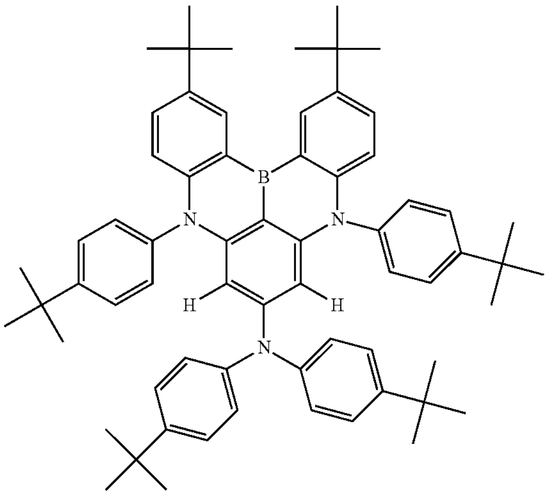
Dopant 4-2
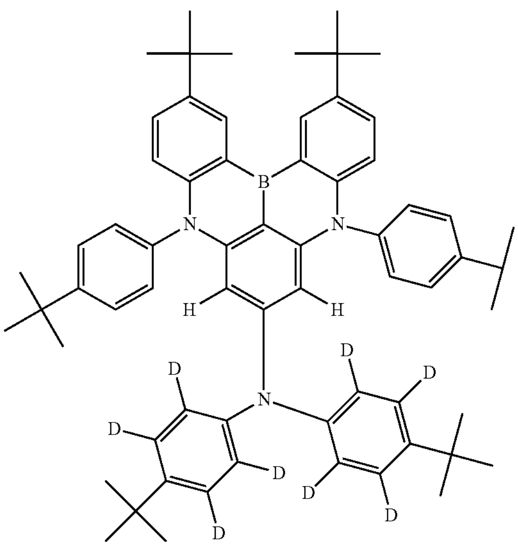
Dopant 4-3
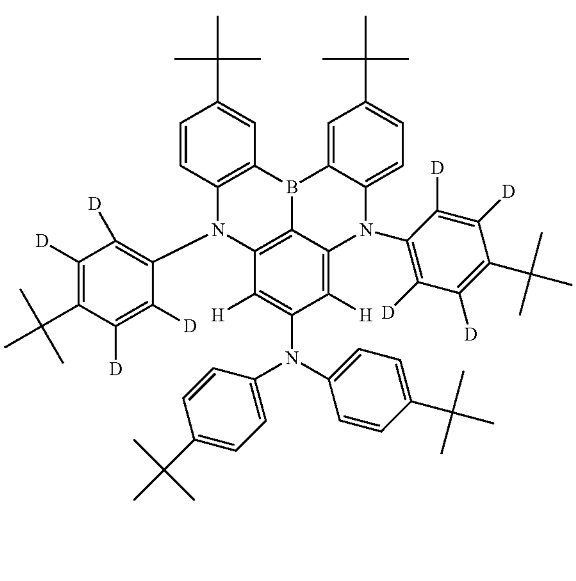
Dopant 4-4
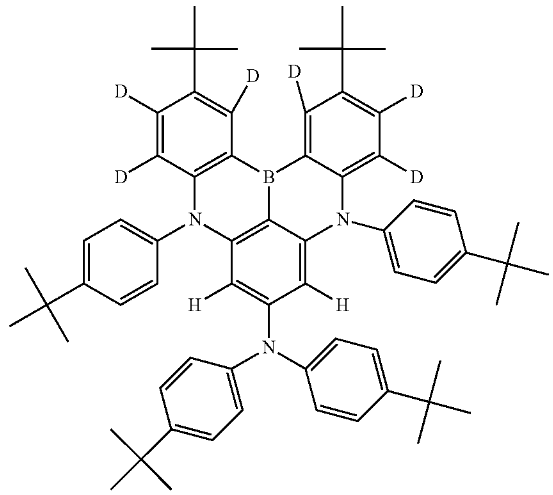
Dopant 4-5
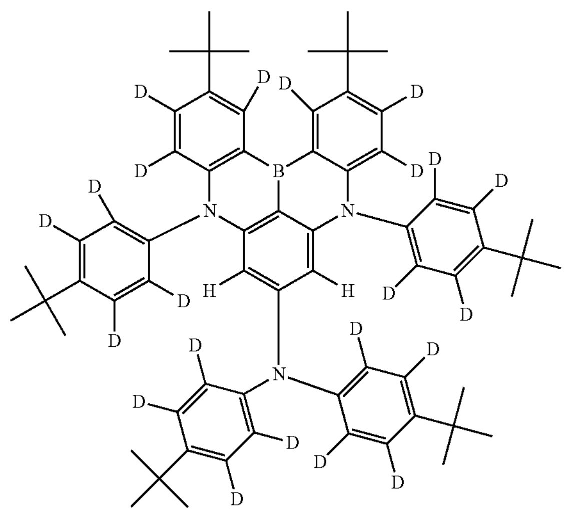
Dopant 5-1
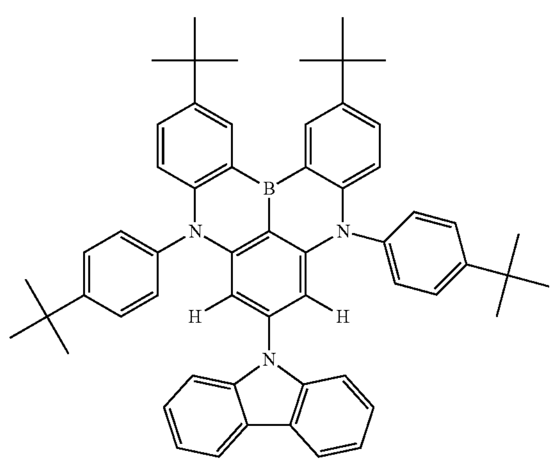

-continued
Dopant 5-2
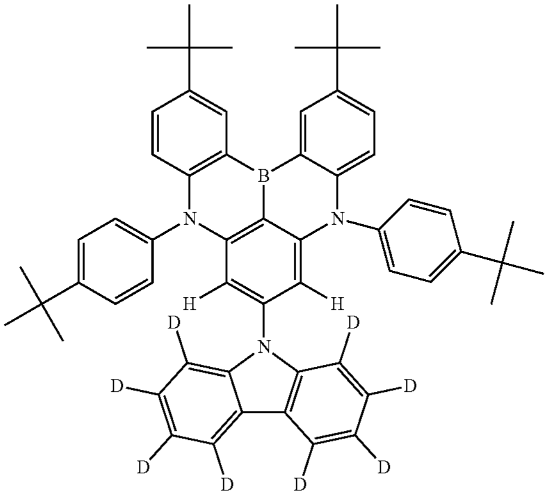
Dopant 5-3
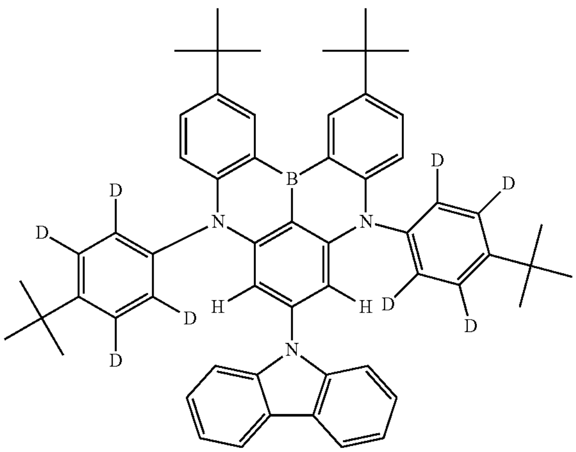
Dopant 5-4
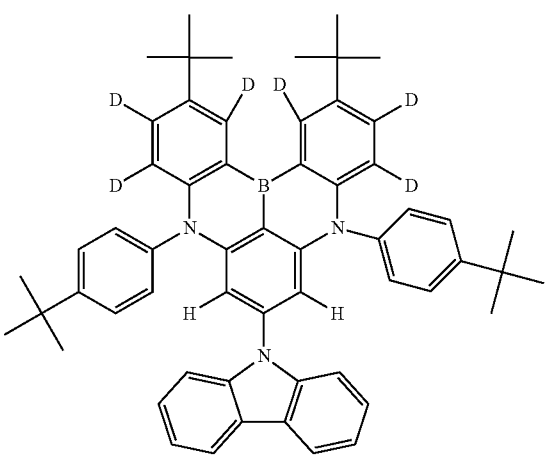
-continued
Dopant 5-5
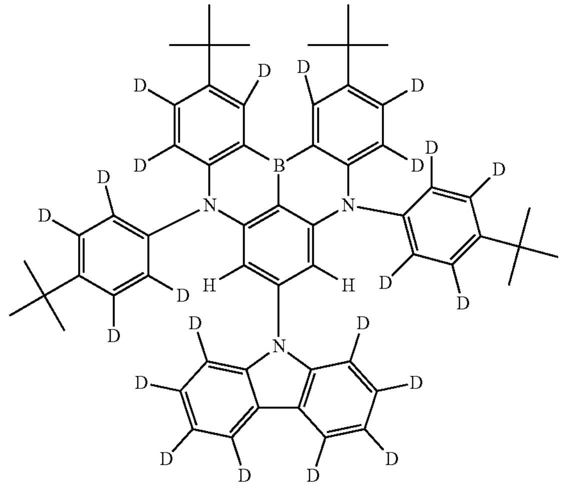
Dopant 6-1
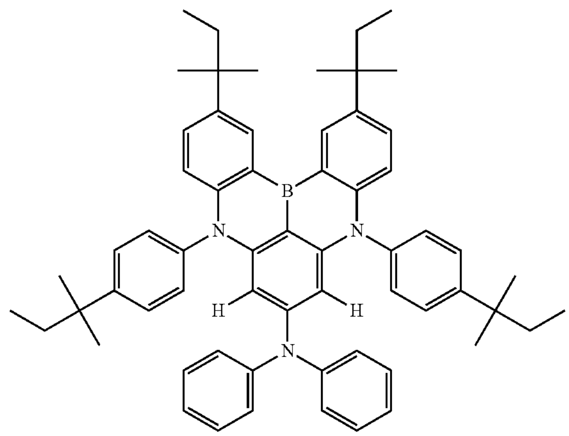
Dopant 6-2
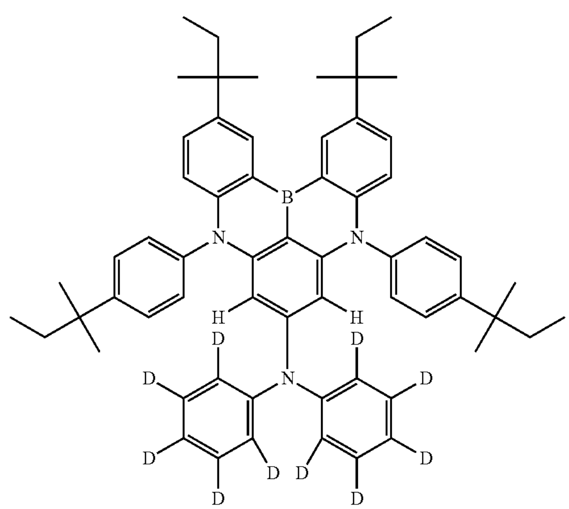

-continued
Dopant 6-3
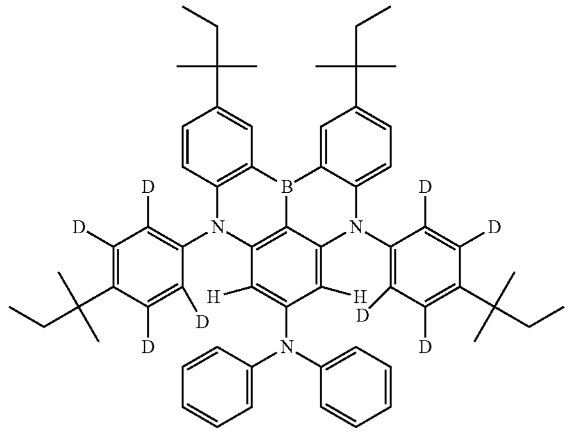
Dopant 6-4
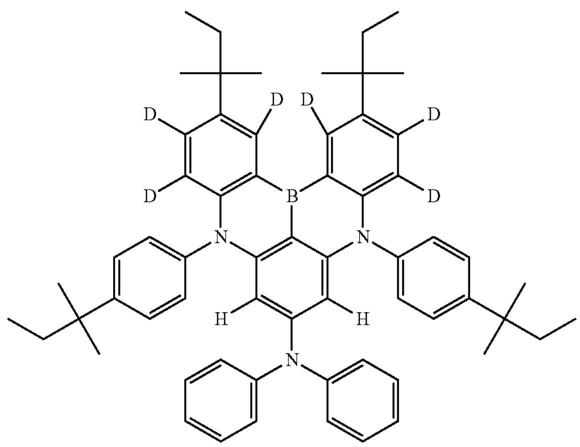
Dopant 6-5
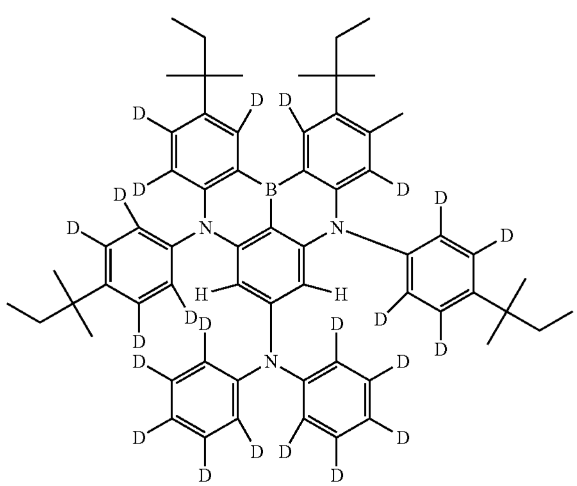
-continued
Dopant 7-1
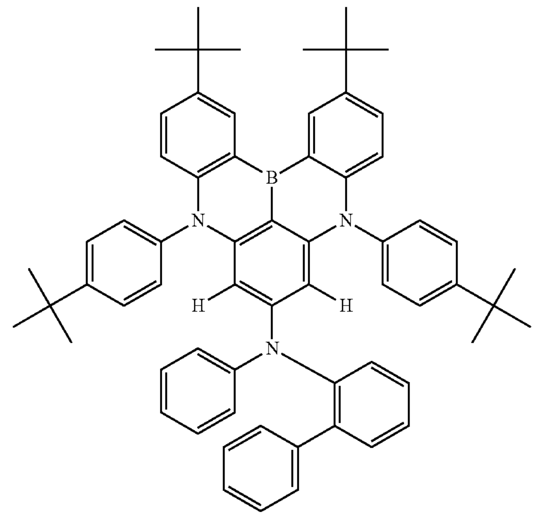
Dopant 7-2
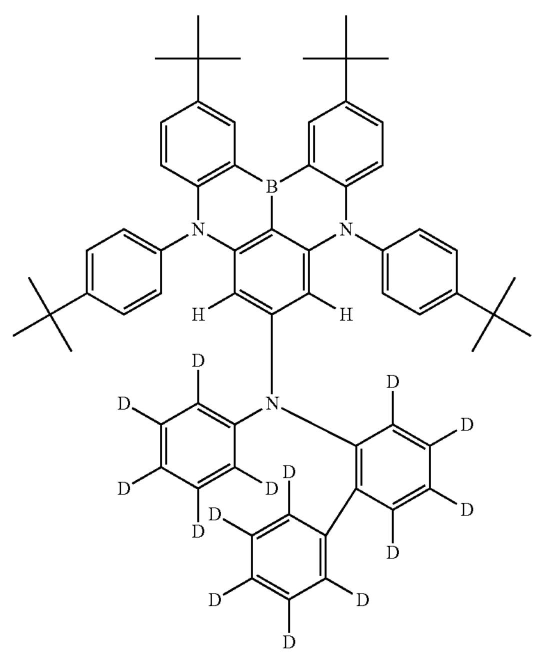

Dopant 7-3
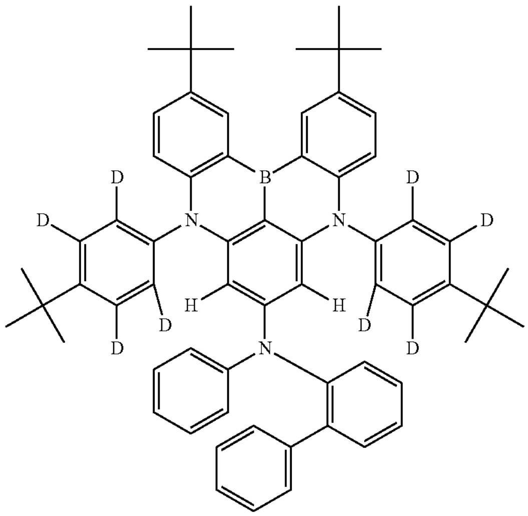
Dopant 7-4
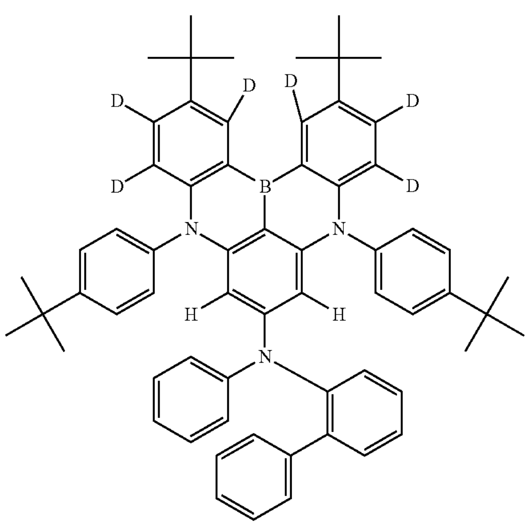
Dopant 7-5
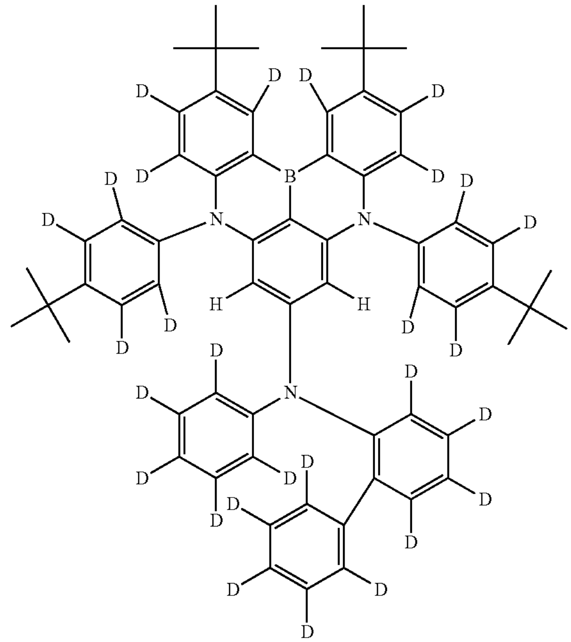
Dopant 8-1
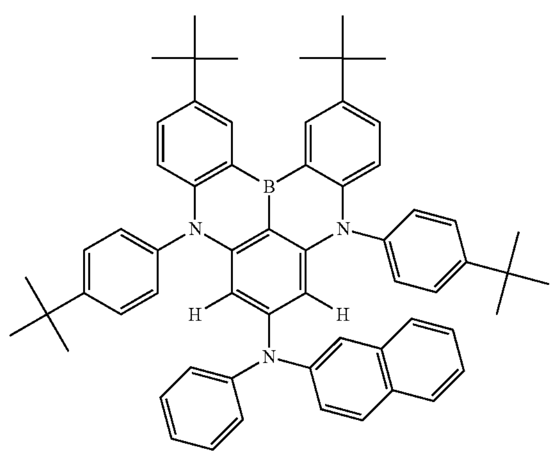

-continued
Dopant 8-2
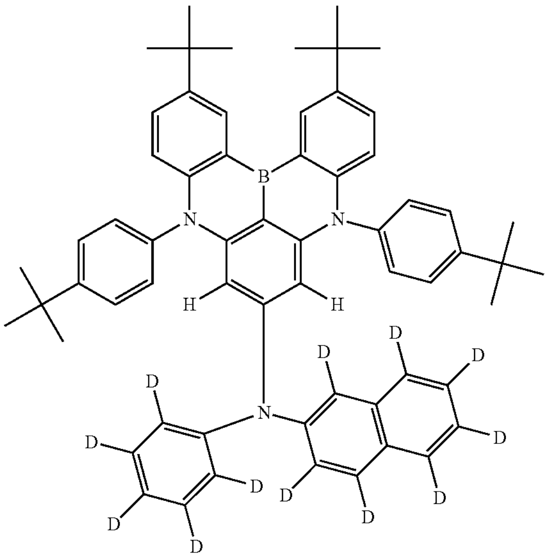
Dopant 8-3
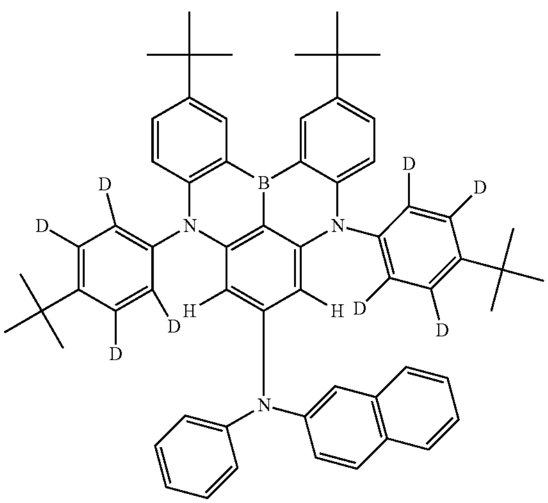
Dopant 8-4
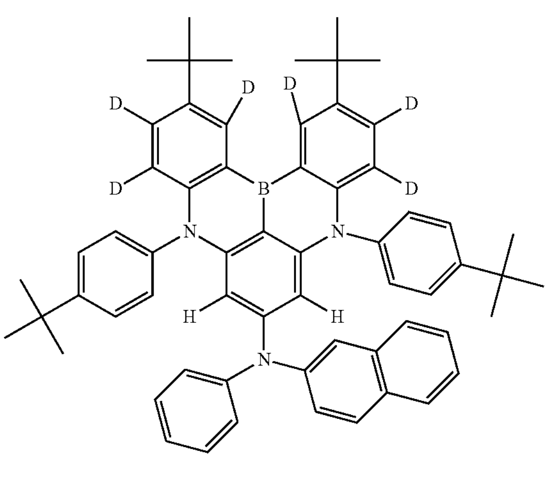
-continued
Dopant 8-5
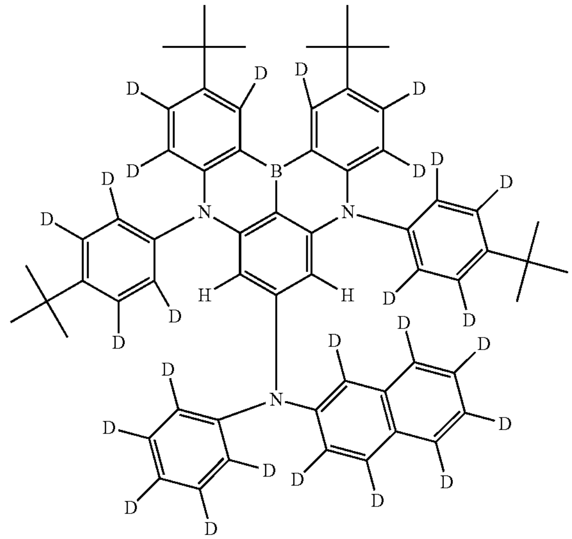
Dopant 9-1
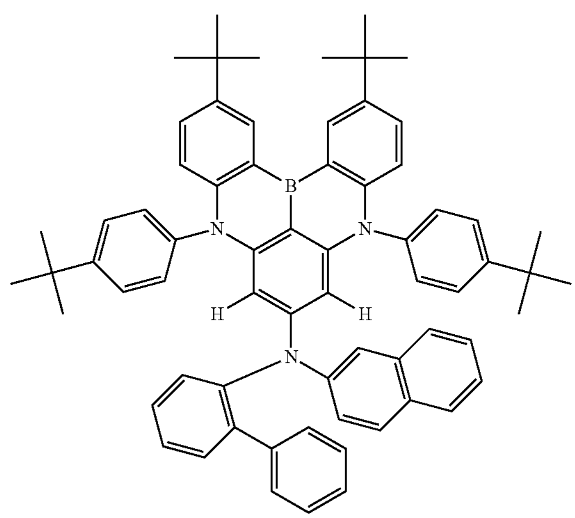

-continued
Dopant 9-2
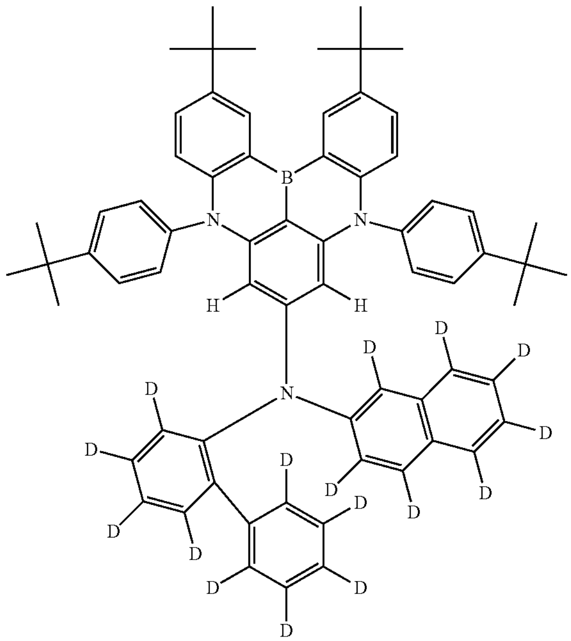
Dopant 9-3
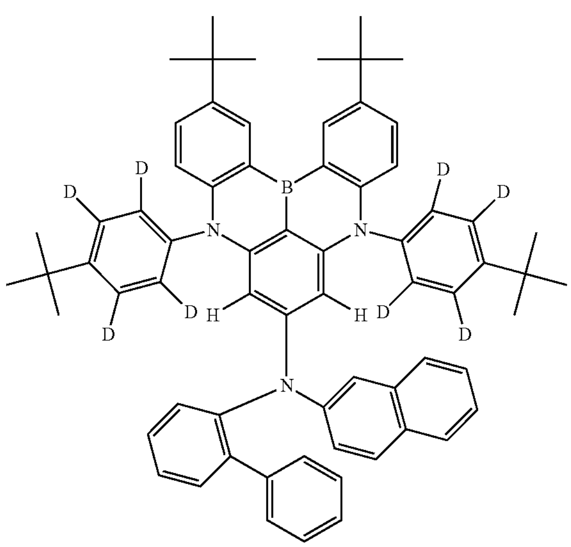
-continued
Dopant 9-4
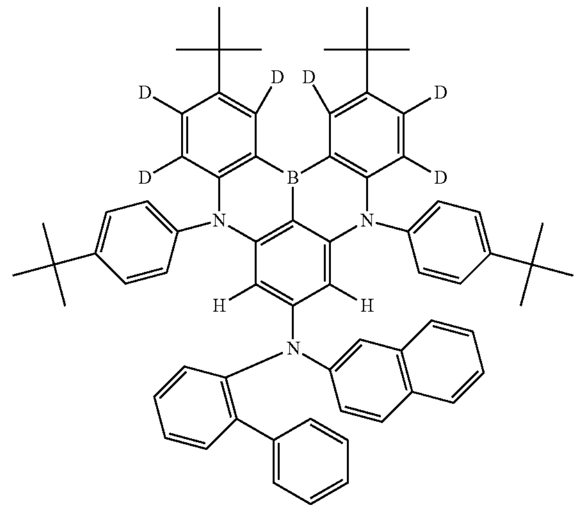
Dopant 9-5
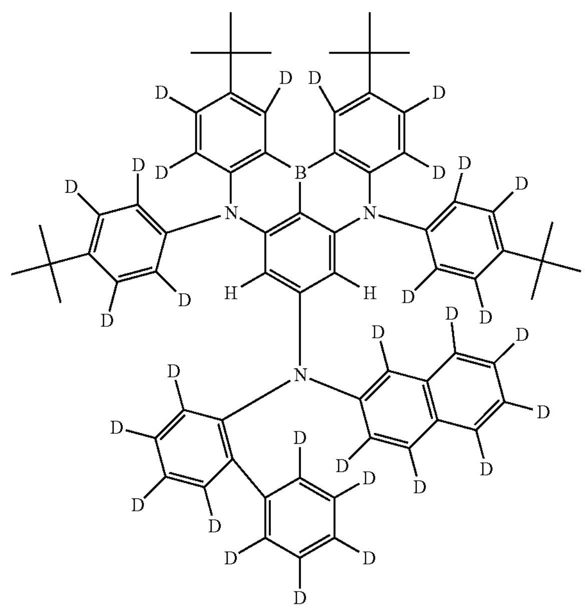
Dopant 10-1
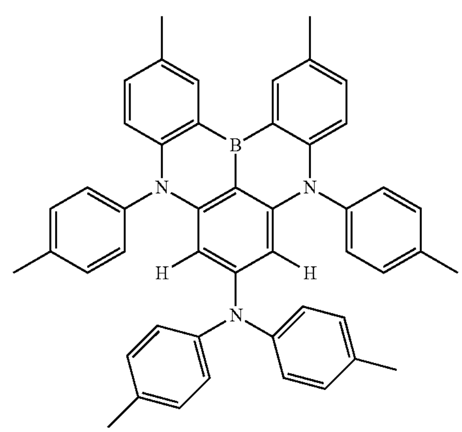

-continued

Dopant 10-2

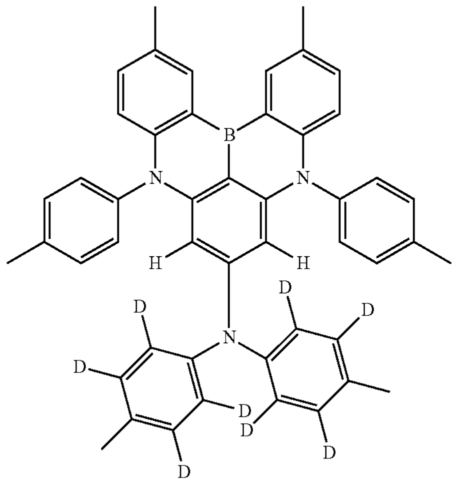

Dopant 10-3

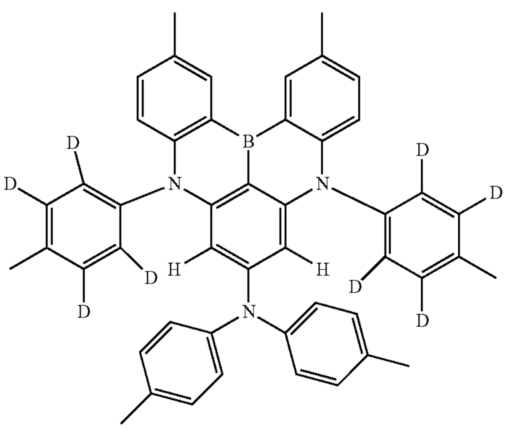

Dopant 10-4

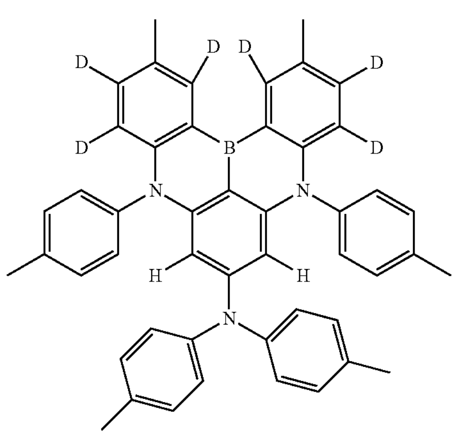

-continued

Dopant 10-5

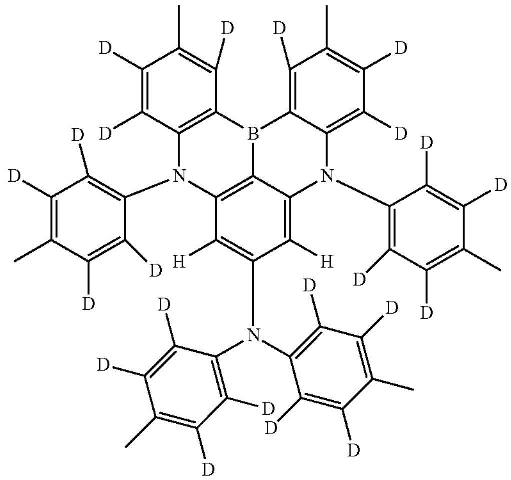

In the OLED D of the present disclosure, the host 242 may have a weight % of about 70 to 99.9, and the dopant 244 may have a weight % of about 0.1 to 30. To provide sufficient emitting efficiency and lifespan of the OLED D and the organic light emitting display device, the dopant 244 may have a weight % of about 0.1 to 10, preferably about 1 to 5.

The HIL 210 is positioned between the first electrode 160 and the HTL 220 to improve an interface property between the first electrode 160 formed of an inorganic material and the HTL 220 formed of an organic material. The HIL 210 includes a hole injection material. For example, the hole injection material may include at least one of 4,4',4"-tris(3-methylphenylamino)triphenylamine (MTDATA), 4,4',4"-tris (N,N-diphenyl-amino)triphenylamine (NATA), 4,4',4"-tris (N-(naphthalene-1-yl)-N-phenyl-amino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-Diphenyl-N,N'-bis(1-naphthyl)-1,1'-biphenyl-4,4"-diamine (NPB orNPD), 1,4,5,8,9,11-hexaazatriphenylenehexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, and a compound of Formula 12.

[Formula 12]

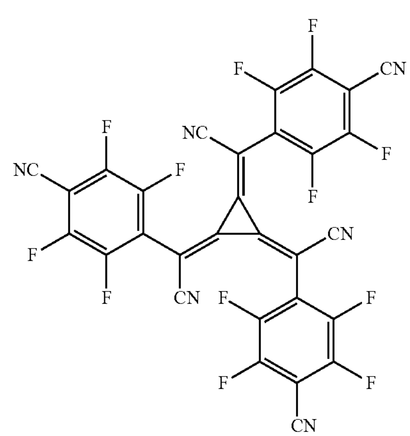

Alternatively, the HIL 210 may include a hole transporting material, which is described below, and the above hole injection material as a dopant. In this instance, the hole injection material may be doped by a weight % of about 1 to 50, preferably, about 1 to 30. Depending on the property or characteristic of the OLED, the HIL 210 may be omitted.

The HTL 220 is positioned between the HIL 210 and the EBL 230. The HTL 220 includes a hole transporting material. For example, the hole transporting material may include at least one of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine](Poly-TPD), poly[(9,9-dioctylfluorenyl-2,7-diyl)-co-(4,4'-(N-(4-sec-butylphenyl) diphenylamine))](TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-biphenyl]-4-yl)-9,9-dimethyl-N-(4-(9-phenyl-9H-carbazol-3-yl) phenyl)-9H-fluoren-2-amine, N4,N4,N4',N4'-tetra([1,1'-biphenyl]-4-yl)-[1,1'-biphenyl]-4,4'-diamine, and a compound of Formula 11.

[Formula 11]

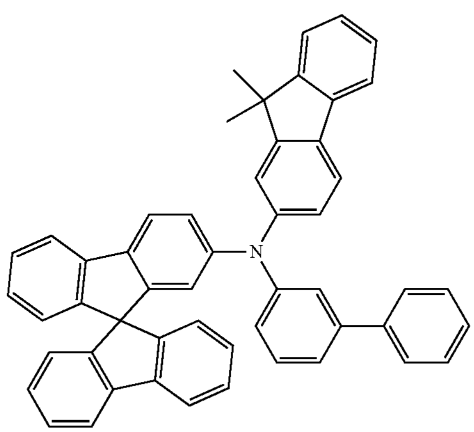

The EBL 230 is formed to prevent the electron toward the first electrode 160. The EBL 230 includes the electron blocking material of the amine derivative. The electron blocking material is represented by Formula 5:

[Formula 5]

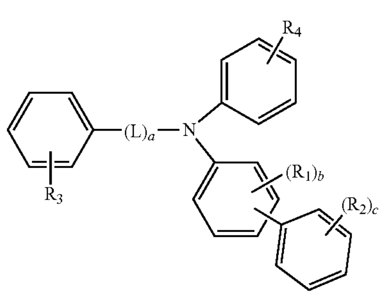

In Formula 5, L is C6~C30 arylene group. $R_1$ and $R_2$ is C1 to C10 alkyl, or adjacent two of $R_1$ and $R_2$ or adjacent two of $R_2$ form a fused ring unsubstituted or substituted with $C_1$-$C_{10}$ alkyl. $R_3$ is C5~C30 hetero aryl group, and $R_4$ is hydrogen or C6~C30 aryl. "a" is 0 or 1, "b" is an integer of 0 to 4, and "c" is an integer of 0 to 5.

For example, L is phenylene, $R_3$ is carbazolyl or dibenzofuranyl, and $R_4$ may be hydrogen, phenyl or biphenyl group. The fused ring may be unsubstituted or substituted with C1 to C1 alkyl.

Namely, the electron blocking material of the present disclosure may be a heteroaryl-substituted amine derivative (e.g., heteroaryl-substituted arylamine derivative).

The electron blocking material of Formula 5 may be one of the followings of Formula 6:

[Formula 6]

E1

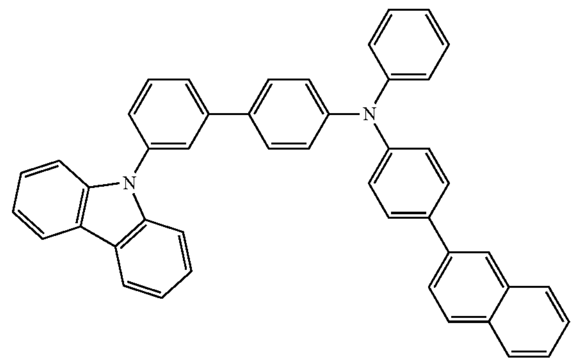

E2

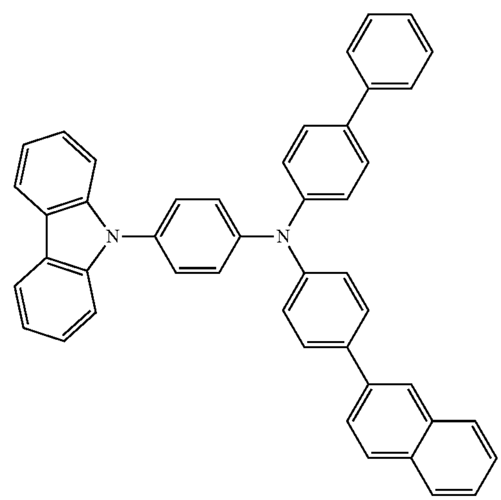

E3
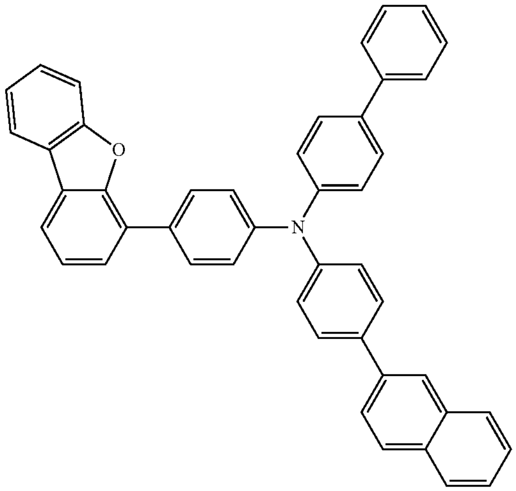
E4
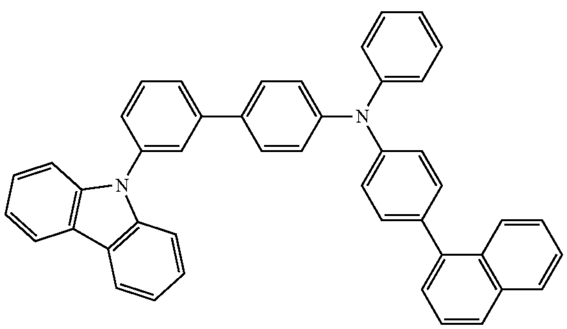
E5
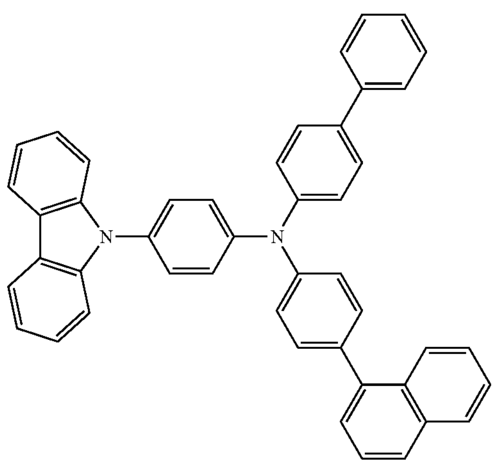
E6
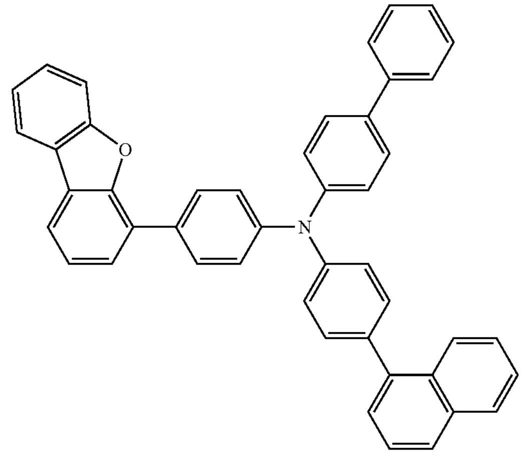
E7
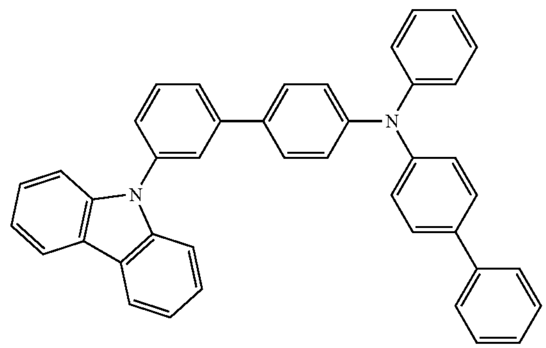
E8
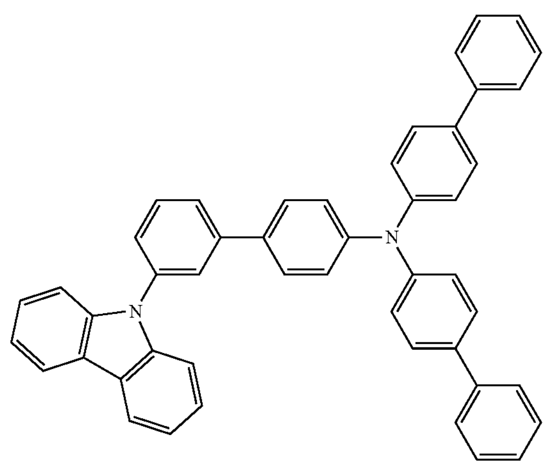

-continued
E9
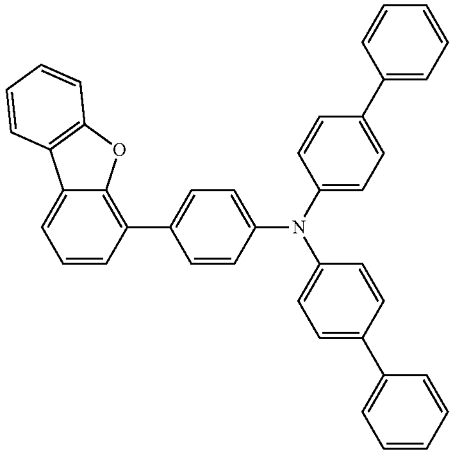
E10
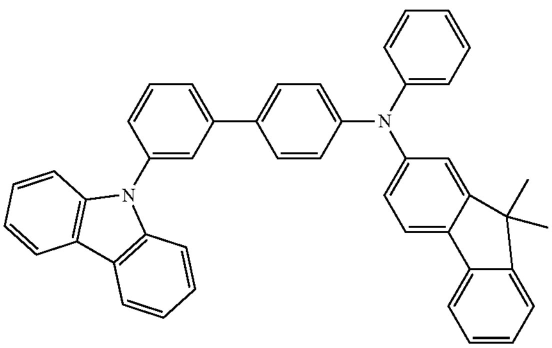
E11
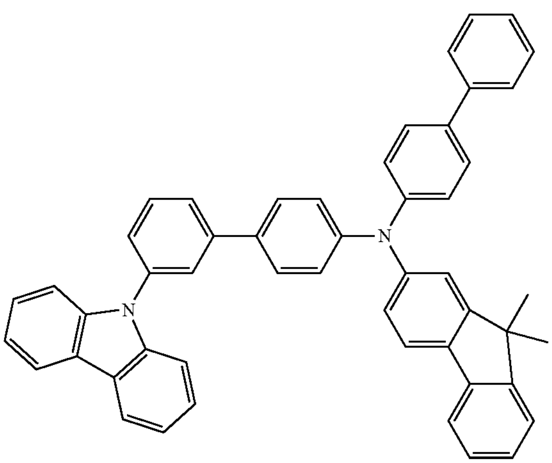
-continued
E12
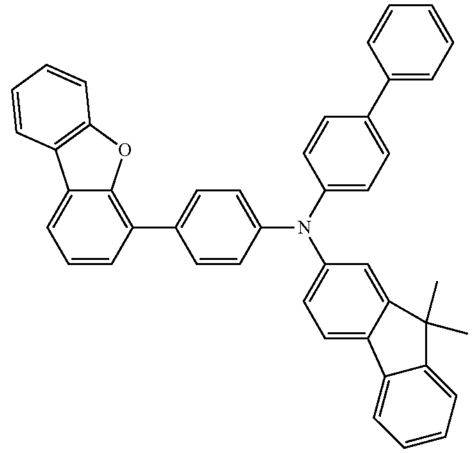
E13
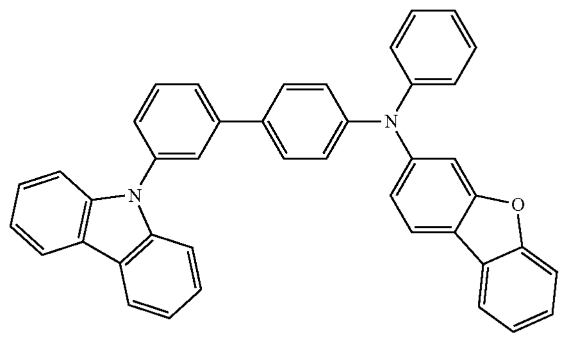
E14
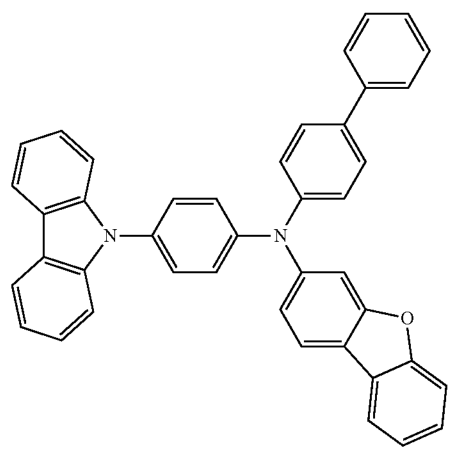

E15
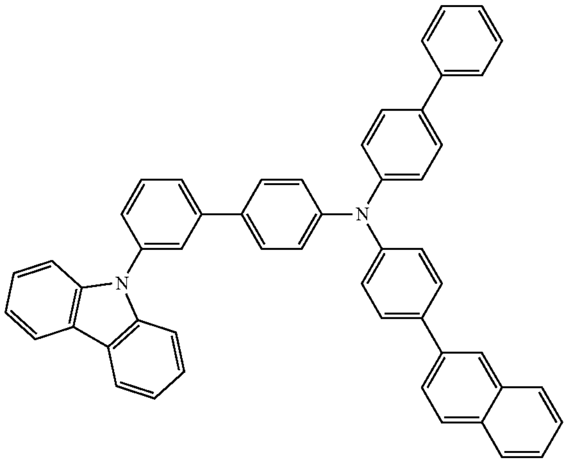
E16
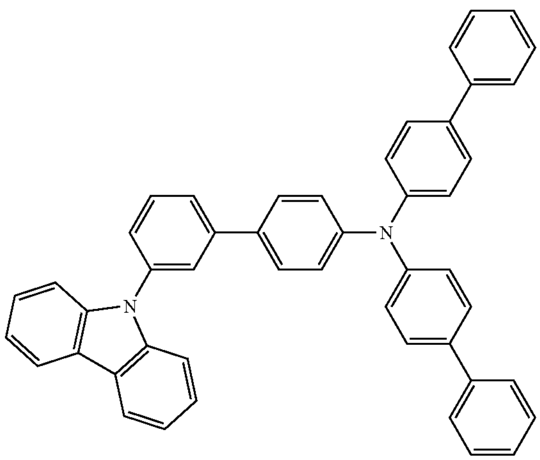
E17
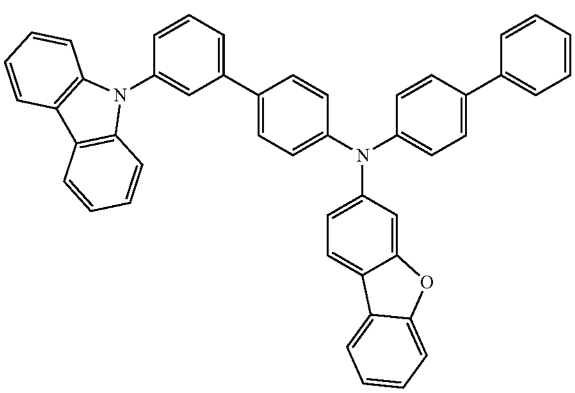
E18
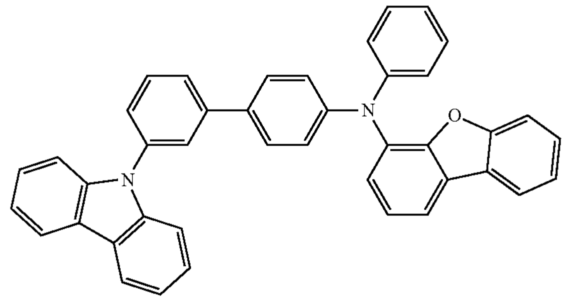
E19
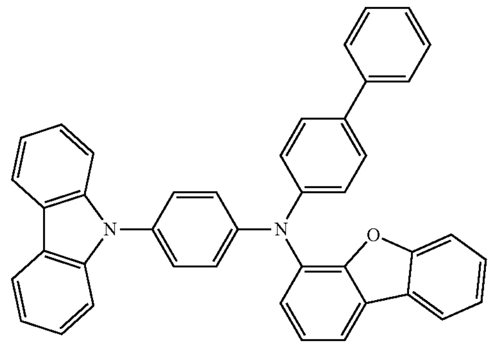
E20
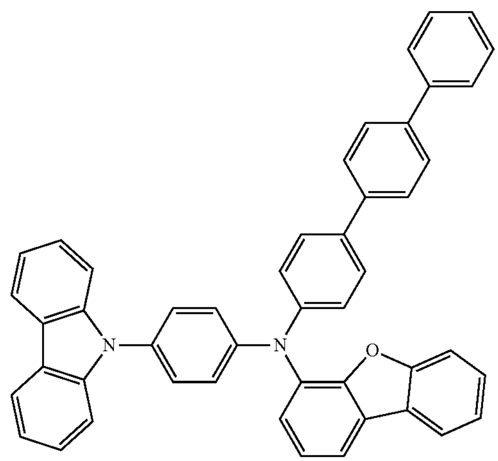
E21
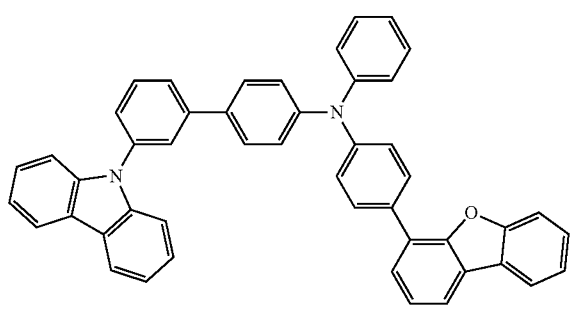

-continued

E22

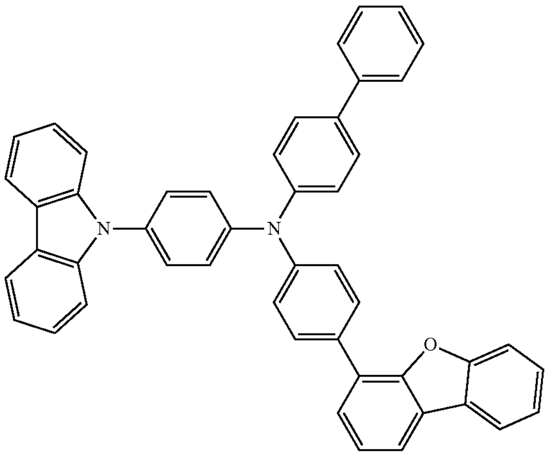

E23

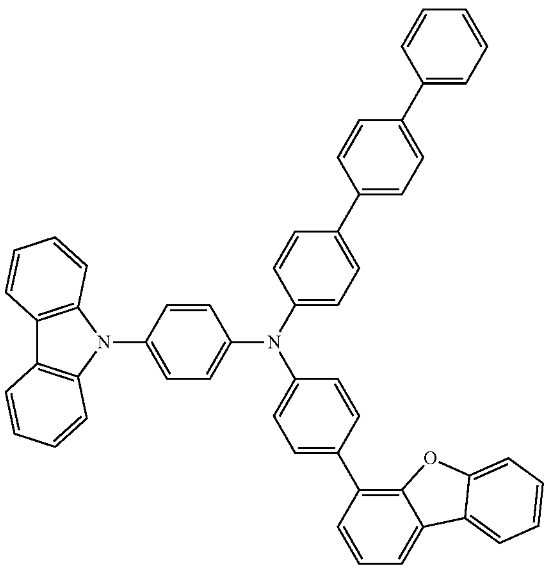

The HBL 250 is formed to prevent the hole toward the second electrode 164. The HBL 250 includes the hole blocking material of the azine derivative. The azine derivative as the hole blocking material is represented by Formula 7:

[Formula 7]

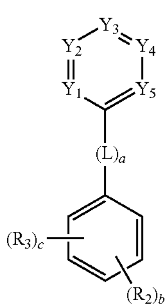

In Formula 7, each of $Y_1$ to $Y_5$ is independently $CR_1$ or N, and one to three of $Y_1$ to $Y_5$ is N. $R_1$ is independently hydrogen or C6~C30 aryl group. L is C6~C30 arylene group, and $R_2$ is C6~C50 aryl group or C5~C50 hetero aryl group. $R_3$ is C1 to C10 alkyl group, or adjacent two of $R_3$ form a fused ring. "a" is 0 or 1, "b" is 1 or 2, and "c" is an integer of 0 to 4.

The hole blocking material of Formula 7 may be one of the followings of Formula 8:

[Formula 8]

H1

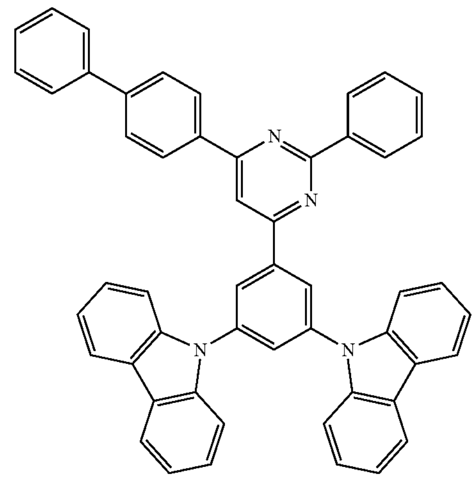

H2

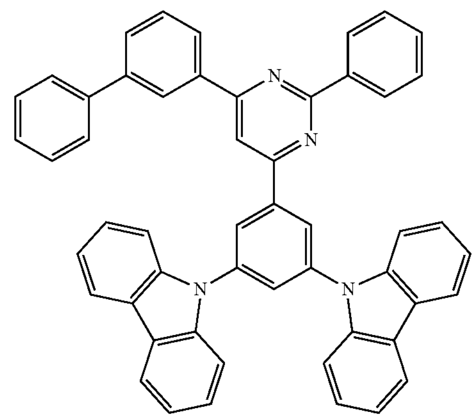

H3

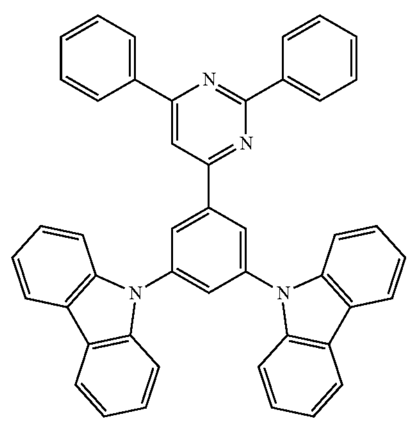

-continued
H4
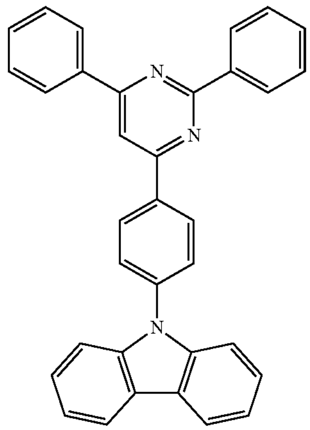
H5
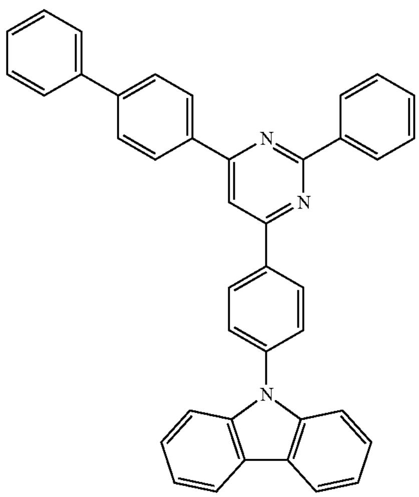
H6
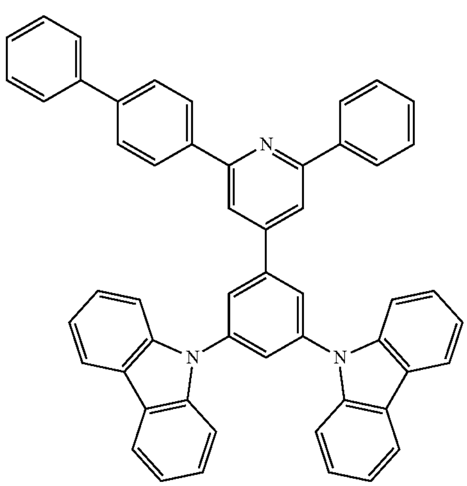
-continued
H7
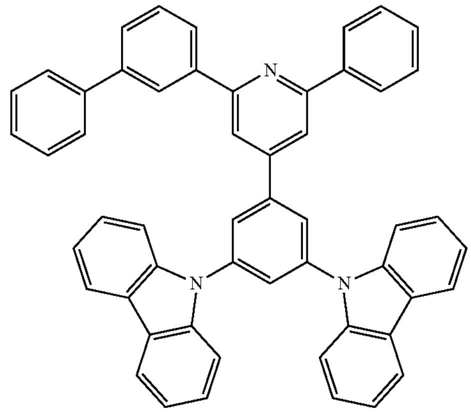
H8
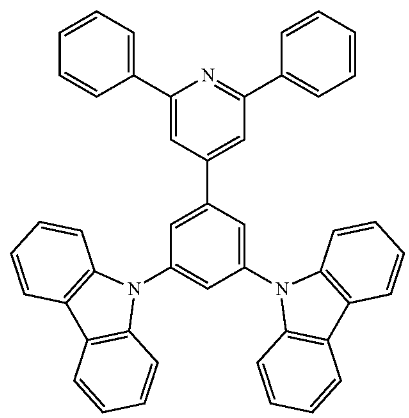
H9
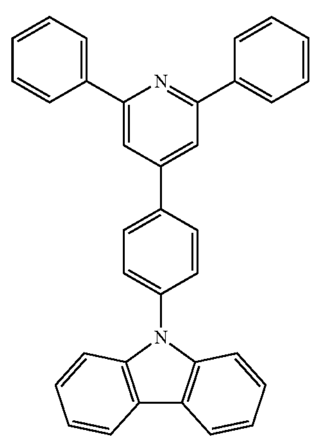

-continued
H10
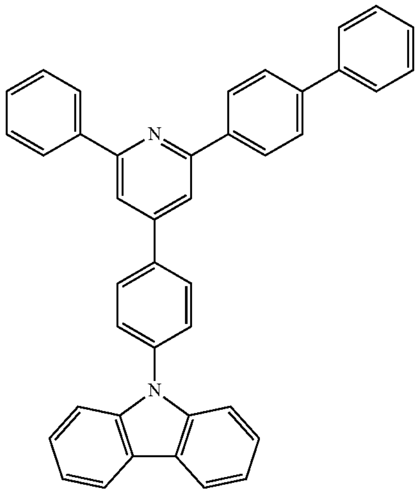
H11
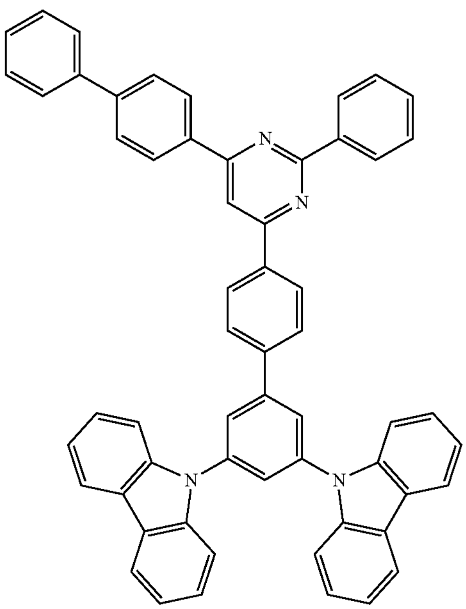
H12
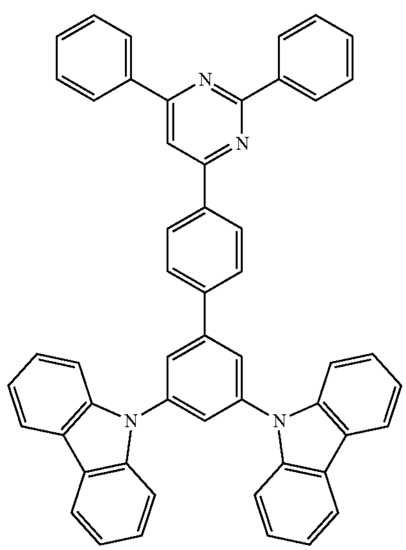
-continued
H13
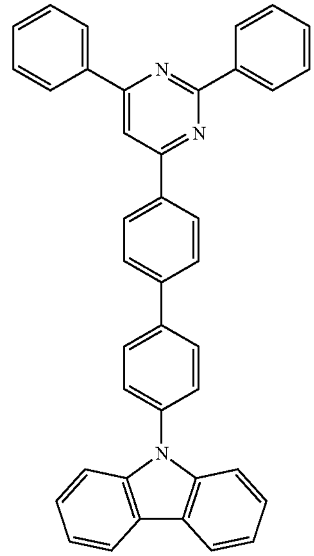
H14
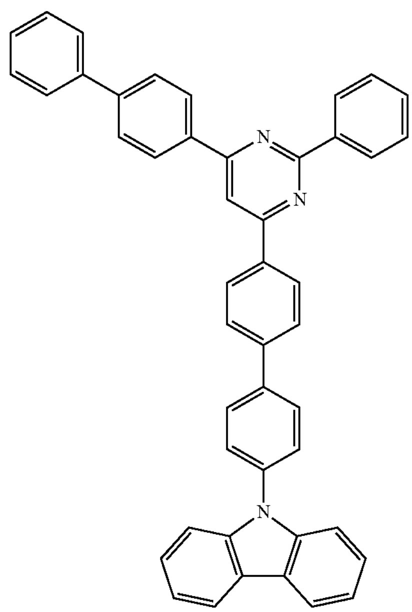
H15
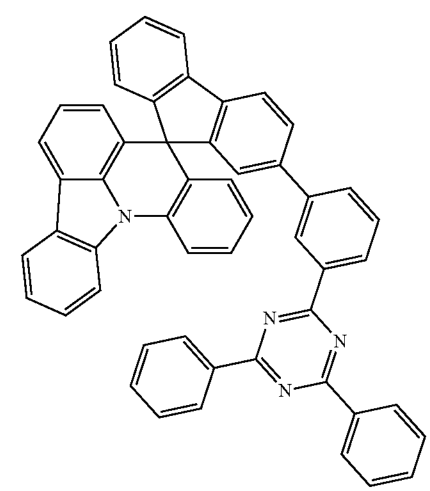

-continued
H16
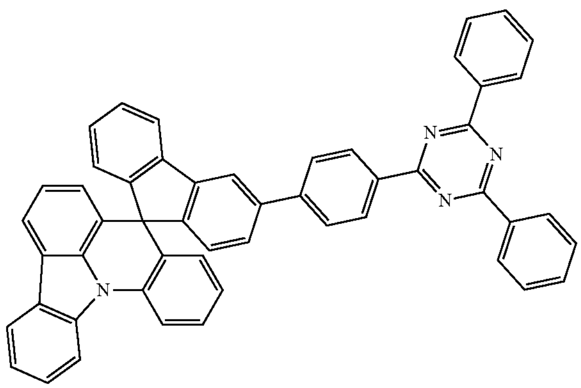
H17
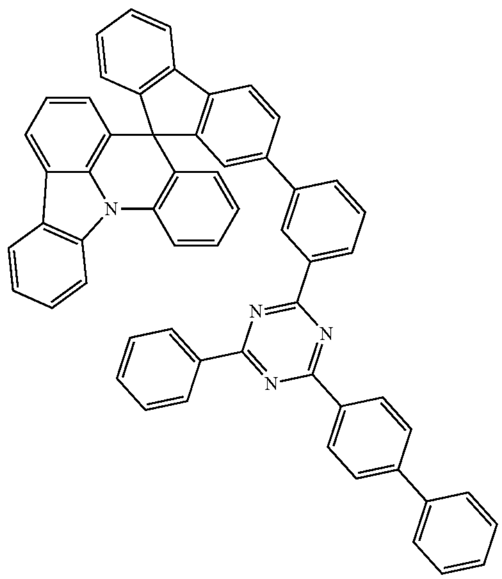
H18
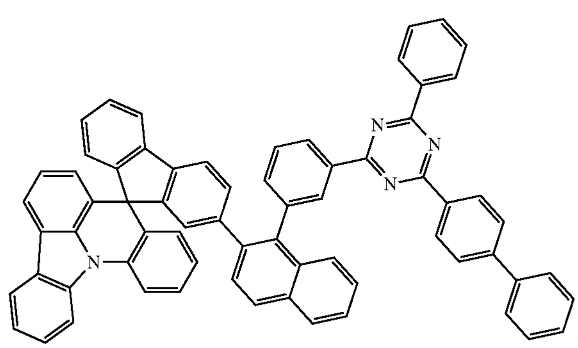
-continued
H19
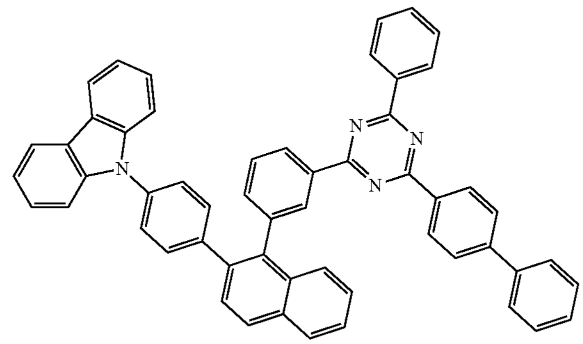
H20
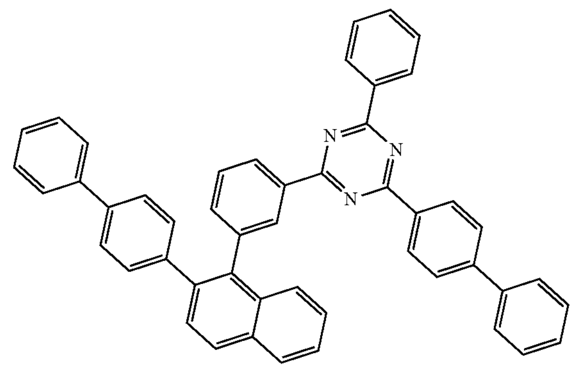
H21
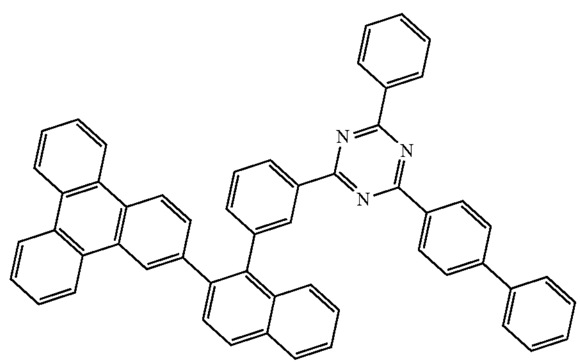
H22
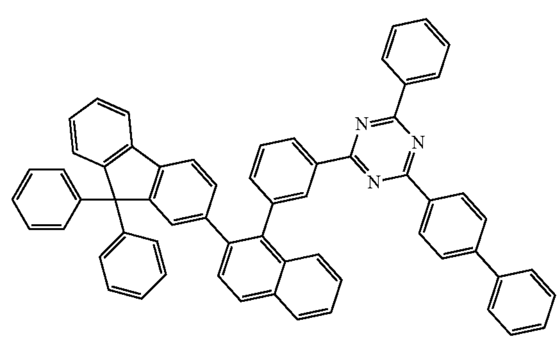

-continued

H23

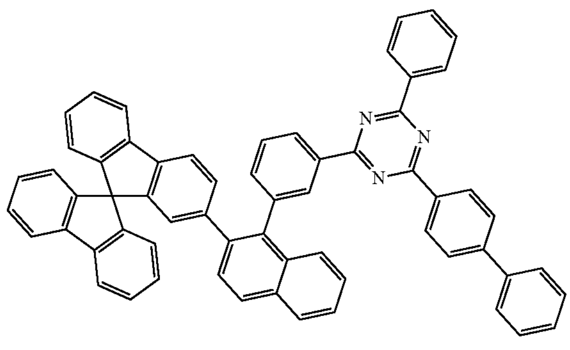

Alternatively, the HBL 250 may include the benzimidazole derivative as the hole blocking material. For example, the benzimidazole derivative as the hole blocking material is represented by Formula 9:

[Formula 9]

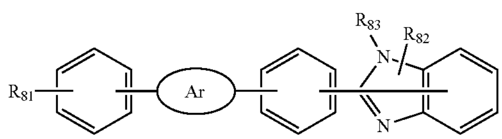

In Formula 9, Ar is $C_{10}$~$C_{30}$ arylene group, $R_{81}$ is C6-C30 aryl group unsubstituted or substituted with C1-C10 alkyl group or C5-C30 heteroaryl group unsubstituted or substituted with C1-C10 alkyl group, and each of $R_{82}$ and $R_{83}$ is independently hydrogen, C1-C10 alkyl group or C6-C30 aryl group.

For example, Ar may be naphthylene or anthracleylne, $R_{81}$ may be benzimidazolyl group or phenyl. $R_{82}$ may be methyl, ethyl or phenyl, and $R_{83}$ may be hydrogen, methyl or phenyl.

The hole blocking material of Formula 9 may be one of the followings of Formula 10:

[Formula 10]

H31

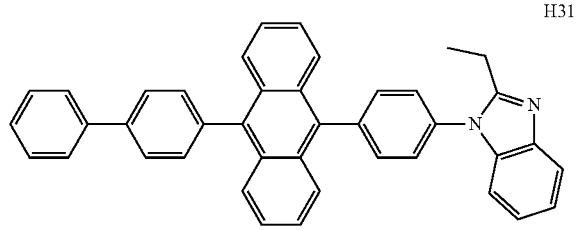

H32

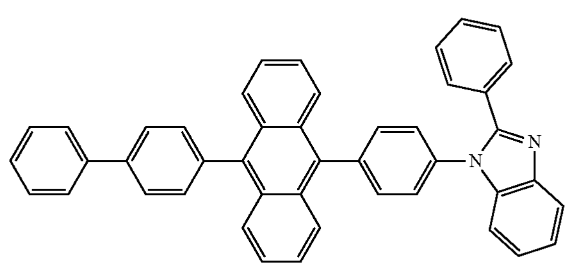

-continued

H33

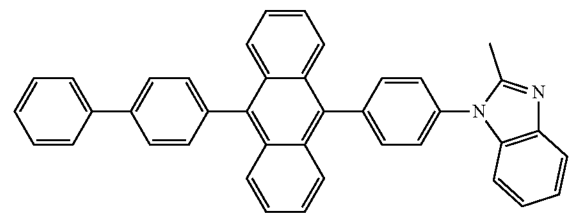

H34

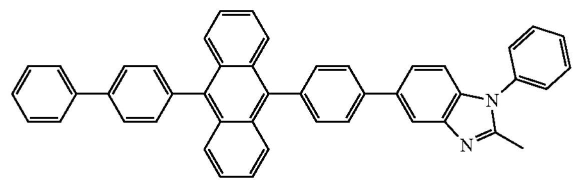

H35

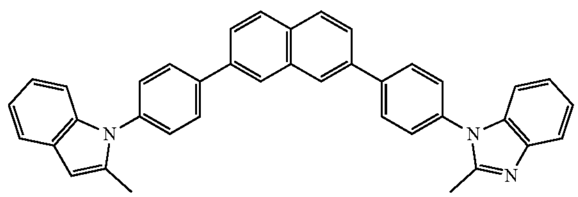

H36

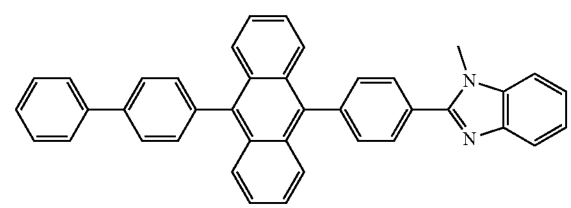

The hole blocking material in Formulas 7 to 10 has excellent hole blocking property and excellent electron transporting property. Accordingly, the HBL 250 may serve as a hole blocking layer as well as an electron transporting layer.

On the other hand, the OLED D may further include an electron transporting layer (not shown) between the HBL 250 and the EIL 260.

The electron transporting layer includes an electron transporting material. For example, the electron transporting material may include at least one of tris-(8-hydroxyquinoline aluminum) (Alq3), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline (TPQ), diphenyl-4-triphenylsilyl-phenylphosphine oxide (TSPO1), 2-[4-(9,10-di-2-naphthalen-2-yl-2-anthracen-2-yl)phenyl]-1-phenyl-1H-benzimidazole (ZADN), 1,3-bis(9-phenyl-1,10- phenathrolin-2-yl)benzene), 1,4-bis(2-phenyl-1,10-phenanthrolin-4-yl)benzene (p-bPPhenB), and 1,3-bis(2-phenyl-1,10-phenanthrolin-4-yl)benzene(m-bPPhenB), but it is not limited thereto.

The EIL 260 is positioned between the HBL 250 and the second electrode 164. The EIL 260 may include alkali metal halides or alkaline earth metal halides such as LiF, CsF, NaF, and BaF2 and/or organometallic materials such as lithium quinolate (Liq), lithium benzoate, and sodium stearate. Alternatively, the EIL 260 may be an organic layer doped with alkali metal, e.g., Li, Na, K and Cs, or alkali earth metal, e.g., Mg, Sr, Ba and Ra.

As mentioned above, in the OLED D of the present disclosure, since the EML 240 includes the host 242 of the anthracene derivative, the core of which is deuterated, and the dopant 244 of the boron derivative, the OLED D and the organic light emitting display device have advantages in the emitting efficiency, the lifespan and the production cost.

In addition, the EBL 230 includes the electron blocking material of Formula 5 such that the lifespan of the OLED D and the organic light emitting display device 100 are significantly improved.

Moreover, the HBL 250 includes at least one of the hole blocking material of Formula 7 and the hole blocking material of Formula 9 such that the lifespan of the OLED D and the organic light emitting display device 100 are further improved.

[Synthesis of the Host]

1. Synthesis of compound Host1

(1) Intermediate H-1

[Reaction Formul a1-1]

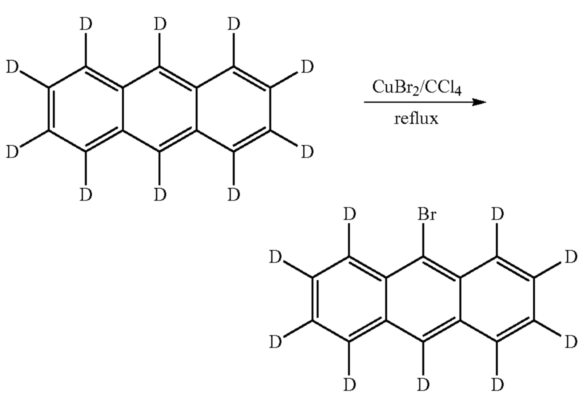

H-1

Anhydrous cupric bromide (45 g, 0.202 mol) was added into anthracene-D10 (18.8 g, 0.10 mol) $CCl_4$ solution. The mixture was heated and stirred under a nitrogen atmosphere for 12 hrs. After completion of reaction, white CuBr(I) compound was filtered off, and the residual liquid was refined by using 35 nm Alumina column. Under vacuum condition, the solvent was removed from the reaction solution, which is refined, by using column to obtain the mixture including the intermediate H-1 (9-bromoanthracene-D9).

The mixture includes the intermediate H-1, the starting material (anthracene-D10) and dibromo-byproduct. The mixture is refined to obtain the intermediate H-1 which was used as the starting material in the reaction Formula 1-2.

(2) Intermediate H-2

[Reaction Formula 1-2]

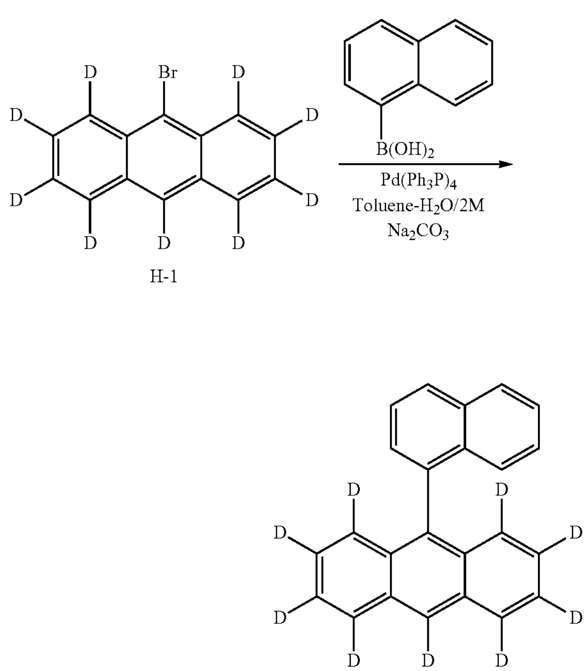

H-2

The intermediate H-1 (2.66 g, 0.01 mol) and naphtalene-1-boronic acid (1.72 g, 0.01 mol) was added into the rounded-bottom flask, and toluene (30 ml) was further added to form a mixture solution. Under a nitrogen atmosphere, the mixture solution was stirred and $Na_2CO_3$ aqueous solution, which is formed by dissolving $Na_2CO_3$ (2.12 g) into distilled water (10 ml), was added. $Pd(PPh_3)_4$ (0.25 g, 0.025 mmol) as catalyst was further added and stirred. After completion of reaction, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was refined to obtain the intermediate H-2 of white powder (2.6 g).

(3) Intermediate H-3

[Reaction Formula 1-3]

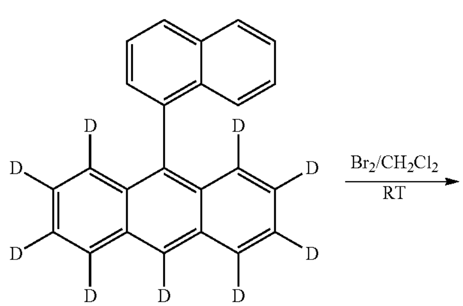

H-2

-continued

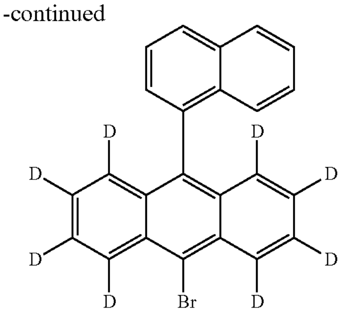

H-3

After dissolving the intermediate H-2 (2.8 g, 8.75 mmol) into dichloromethane (50 mL), $Br_2$ (1.4 g, 8.75 mmol) was added and stirred under the room temperature (RT). After completion of reaction, 2M $Na_2S_2O_3$ aqueous solution (10 mL) was added into the reactant and stirred. The organic layer was separated and washed using $Na_2S_2O_3$ aqueous solution (10% concentration, 10 mL) and distilled water. The organic layer was separated again, and water in the organic layer was removed by using $MgSO_4$. After the organic layer was concentrated, excessive methanol was added to obtain a product. The product was filtered to obtain the intermediate H-3 (3.3 g).

(4) Host1

[Reaction Formula 1-4]

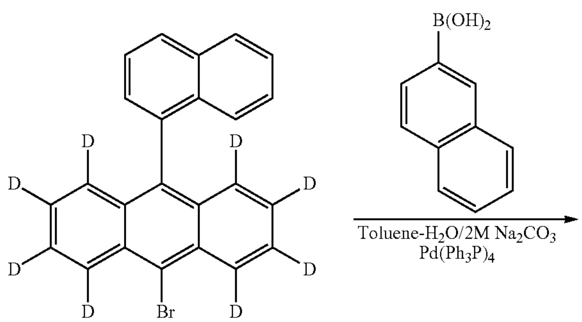

H-3

-continued

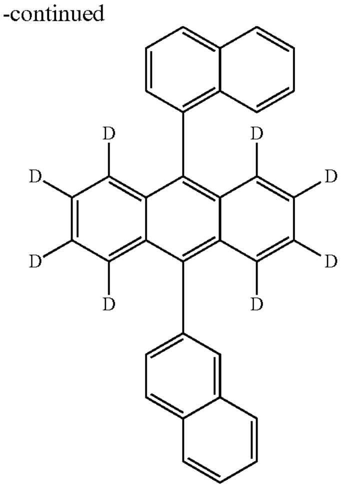

Host1

The intermediate H-3 (1.96 g, 0.05 mol) and naphtalene-2-boronic acid (1.02 g 0.06 mol) were added and dissolved into toluene (30 ml). The mixture solution was stirred under a nitrogen atmosphere. $Na_2CO_3$ aqueous solution (1 ml), which is formed by dissolving $Na_2CO_3$ (1.90 g) into distilled water (8 ml), was added into the mixture solution. $Pd(PPh_3)_4$ (0.125 g, 0.0125 mmol) was further added. The mixture was heated and stirred under a nitrogen atmosphere. After completion of reaction, the organic layer was separated, and methanol was added into the organic layer to precipitate a white solid mixture. The white solid mixture was refined by silica-gel column chromatography using the eluent of chloroform and hexane (volume ratio=1:3) to obtain the compound Host1 (2.30 g).

2. Synthesis of Compound Host2

[Reaction Formula 2]

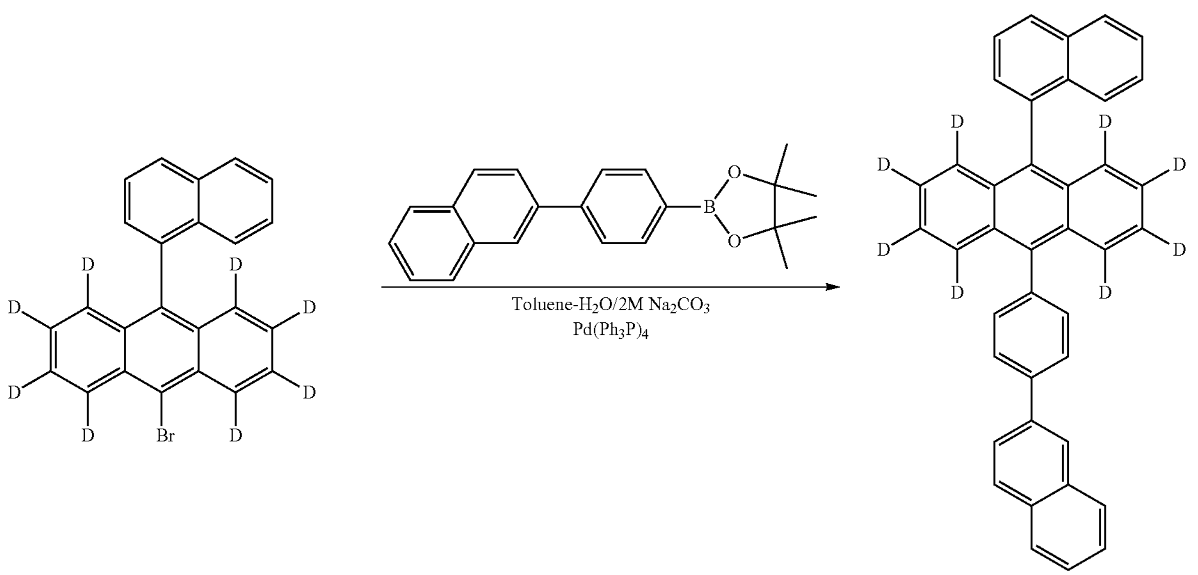

H-3 Host2

The intermediate H-3 (1.96 g, 0.05 mol) and 4-(naphtalene-2-yl)phenylboronic acid (1.49 g, 0.06 mol) were added and dissolved into toluene (30 ml). The mixture solution was stirred under a nitrogen atmosphere. $Na_2CO_3$ aqueous solution (1 ml), which is formed by dissolving $Na_2CO_3$ (1.90 g) into distilled water (8 ml), was added into the mixture solution. $Pd(PPh_3)_4$ (0.125 g, 0.0125 mmol) was further added. The mixture was heated and stirred under a nitrogen atmosphere. After completion of reaction, the organic layer was separated, and methanol was added into the organic layer to precipitate a white solid mixture. The white solid mixture was refined by silica-gel column chromatography using the eluent of chloroform and hexane (volume ratio=1:3) to obtain the compound Host2 (2.30 g).

3. Synthesis of compound Host3

(1) Intermediate H-4

[Reaction Formula 3-1]

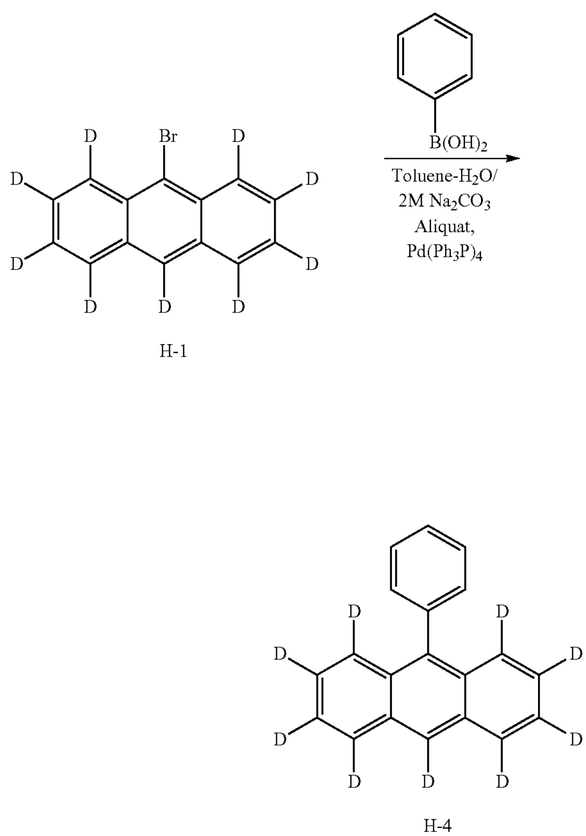

The intermediate H-1 (2.66 g, 0.01 mol) and phenylboronic acid (1.22 g, 0.01 mol) was added into the rounded-bottom flask, and toluene (30 ml) was further added to form a mixture solution. Under a nitrogen atmosphere, the mixture solution was stirred and $Na_2CO_3$ aqueous solution, which is formed by dissolving $Na_2CO_3$ (2.12 g) into distilled water (10 ml), was added. $Pd(PPh_3)_4$ (0.25 g, 0.025 mmol) as catalyst was further added and stirred. After completion of reaction, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was refined to obtain the intermediate H-4 of white powder (2.4 g).

(2) Intermediate H-5

[Reaction Formula 3-2]

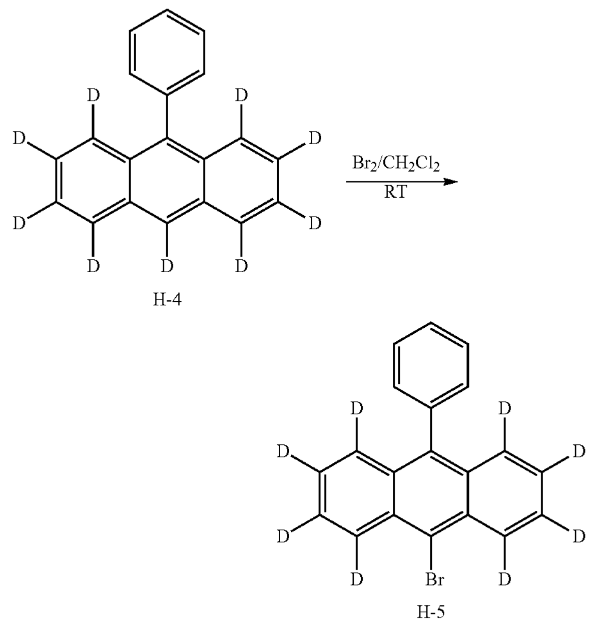

After dissolving the intermediate H-4 (2.3 g, 8.75 mmol) into dichloromethane (50 mL), $Br_2$ (1.4 g, 8.75 mmol) was added and stirred under the room temperature (RT). After completion of reaction, 2M $Na_2S_2O_3$ aqueous solution (10 mL) was added into the reactant and stirred. The organic layer was separated and washed using $Na_2S_2O_3$ aqueous solution (10% concentration, 10 mL) and distilled water. The organic layer was separated again, and water in the organic layer was removed by using $MgSO_4$. After the organic layer was concentrated, excessive methanol was added to obtain a product. The product was filtered to obtain the intermediate H-5 (2.7 g).

(3) Host3

[Reaction Formula 3-3]

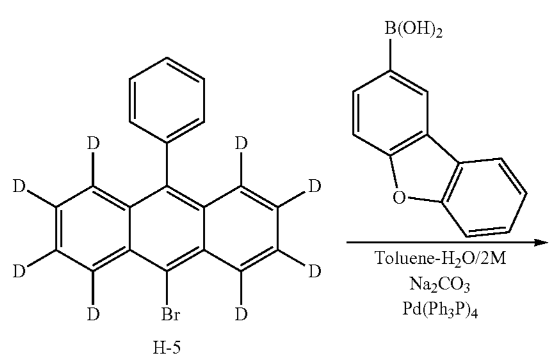

-continued

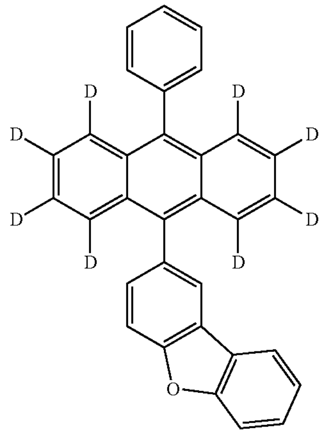

Host3

The intermediate H-5 (1.3 g, 0.05 mol) and dibenzofuran-2-ylboronic acid (1.26 g, 0.06 mol) were added and dissolved into toluene (30 ml). The mixture solution was stirred under a nitrogen atmosphere. $Na_2CO_3$ aqueous solution (1 ml), which is formed by dissolving $Na_2CO_3$ (1.90 g) into distilled water (8 ml), was added into the mixture solution. $Pd(PPh_3)_4$ (0.125 g, 0.0125 mmol) was further added. The mixture was heated and stirred under a nitrogen atmosphere. After completion of reaction, the organic layer was separated, and methanol was added into the organic layer to precipitate a white solid mixture. The white solid mixture was refined by silica-gel column chromatography using the eluent of chloroform and hexane (volume ratio=1:3) to obtain the compound Host3 (2.30 g).

4. Synthesis of Compound Host4

[Reaction Formula 4]

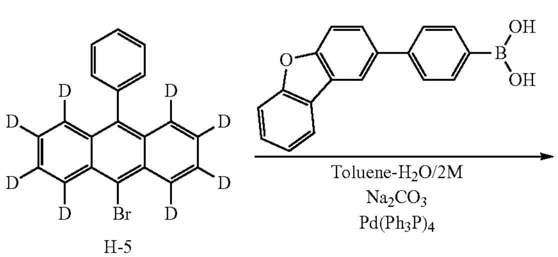

-continued

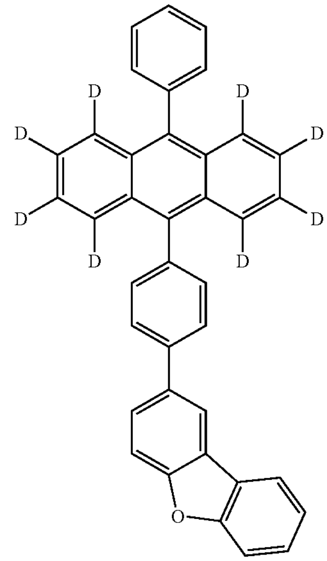

Host4

The intermediate H-5 (1.3 g, 0.05 mol) and 4-(2-dibenzofuranyl)phenylboronic acid (1.74 g, 0.06 mol) were added and dissolved into toluene (30 ml). The mixture solution was stirred under a nitrogen atmosphere. $Na_2CO_3$ aqueous solution (1 ml), which is formed by dissolving $Na_2CO_3$ (1.90 g) into distilled water (8 ml), was added into the mixture solution. $Pd(PPh_3)_4$ (0.125 g, 0.0125 mmol) was further added. The mixture was heated and stirred under a nitrogen atmosphere. After completion of reaction, the organic layer was separated, and methanol was added into the organic layer to precipitate a white solid mixture. The white solid mixture was refined by silica-gel column chromatography using the eluent of chloroform and hexane (volume ratio=1:3) to obtain the compound Host4 (2.30 g).

[Synthesis of the Dopant]

1. Synthesis of Compound Dopant3-1

(1) Intermediate (I-7)

[Reaction Formula 5-1]

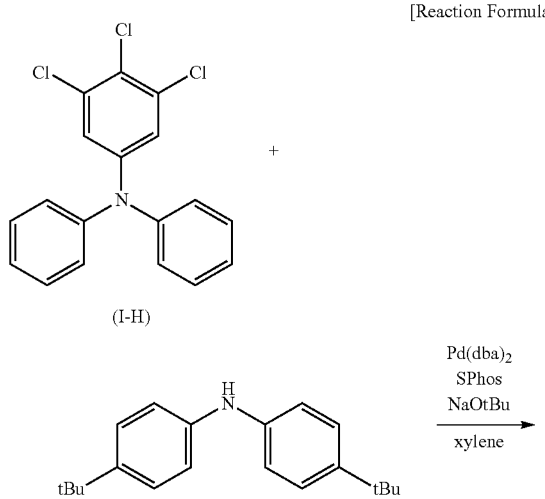

-continued

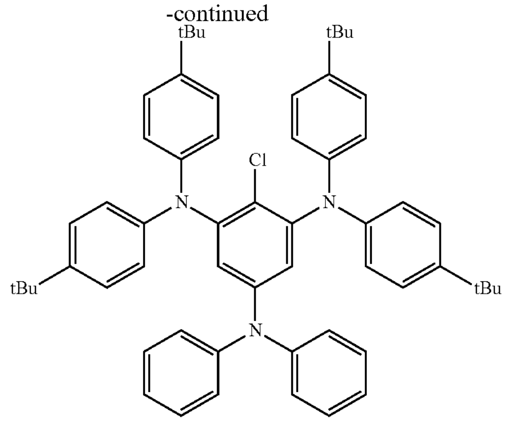

(I-7)

Under an atmosphere of nitrogen, intermediate (I-H) (10.0 g) bis(4-t-butylphenyl) amine (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-7) (16.0 g).

(2) Dopant3-1

[Reaction Formula 5-2]

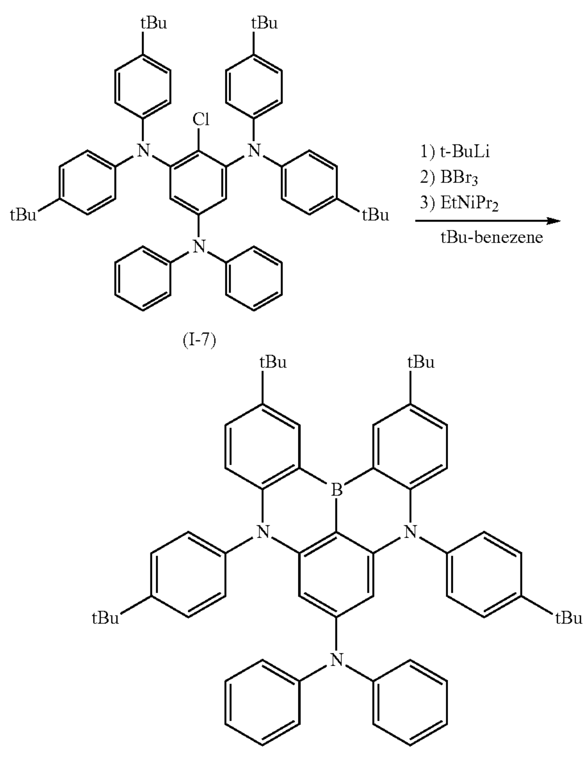

Under an atmosphere of nitrogen, a 1.62 M tert-butyllithium pentane solution (22.1 ml) was dropwisely added in a flask containing intermediate (I-7) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant3-1 was obtained (8.5 g).

2. Synthesis of Compound Dopant3-2

(1) Intermediate (I-U)

[Reaction Formula 6-1]

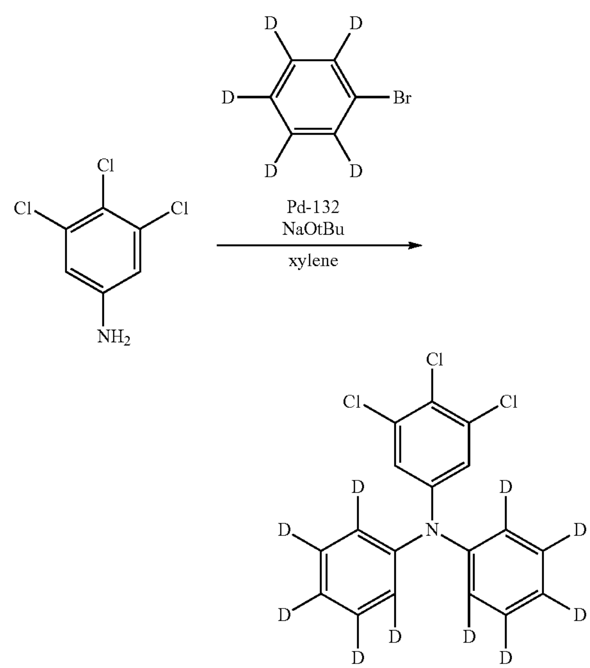

(I-U)

Under an atmosphere of nitrogen, 3,4,5-trichloroaniline (12.0 g), d5-bromobenzene (30.0 g), dichlorobis[(di-t-butyl (4-dimethylaminophenyl) phosphino) palladium (Pd-132, 0.43 g) as a palladium catalyst, sodium-t-butoxide (NaOtBu, 14.7 g), and xylene (200 ml) were put in a flask and heated at 120° C. for three hours. After a reaction, water and ethyl acetate were added to the reaction solution, followed by stirring. Thereafter, the organic layer was separated and washed with water. Thereafter, the organic layer was concentrated to obtain a crude product. The crude product was purified with a silica gel short pass column (eluent: toluene/heptane=1/1 (volume ratio)) to obtain intermediate (I-U) (15.0 g).

(2) Intermediate I-V

[Reaction Formula 6-2]

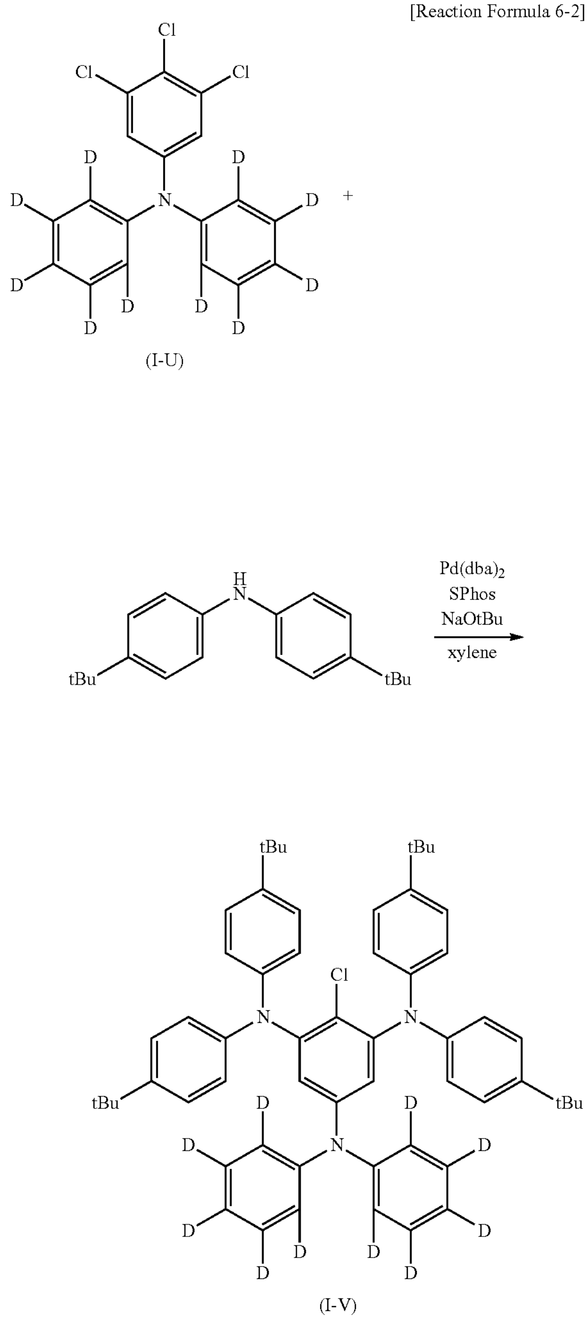

Under an atmosphere of nitrogen, intermediate (I-U) (15.0 g), bis(4-t-butylphenyl) amine (25.9 g), bis(dibenzylideneacetone) palladium (0.48 g), 2-dicyclohexylphosphino-2',6'-dimethoxybiphenyl (SPhos, 0.86 g), sodium-t-butoxide (10.0 g), and xylene (130 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-V) (23.0 g).

(3) Dopant3-2

[Reaction Formula 6-3]

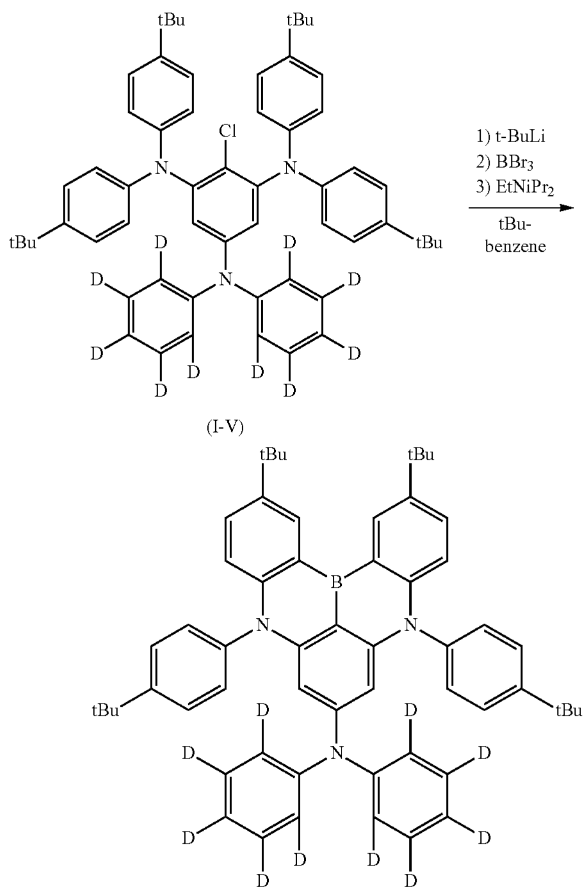

Under an atmosphere of nitrogen, a 1.62 M tert-butyllithium pentane solution (33.5 ml) was dropwisely added in a flask containing intermediate (I-V) (23.0 g) and tert-butylbenzene (250 ml) at 0° C. After completion of dropwise addition of tert-butyllithium pentane solution, the temperature of the mixture was increased to 60° C., the mixture was stirred for one hour, and then components having boiling points lower than that of tert-butylbenzene were distilled off under reduced pressure. The residue was cooled to −50° C., boron tribromide (13.6 g) was added thereto, the temperature of the mixture was raised to room temperature, and the mixture was stirred for 0.5 hours. Thereafter, the mixture was cooled again to 0° C., N,N-diisopropylethylamine (EtNiPr$_2$, 7.0 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, an aqueous solution of sodium acetate that had been cooled in an ice bath and then ethyl acetate were added thereto, and the mixture was partitioned. The organic layer was concentrated, and then purified with a silica gel short pass column (eluent: heated chlorobenzene). The obtained crude product was washed with refluxed heptane and refluxed ethyl acetate, and then was further reprecipitated from chlorobenzene. Thus, the compound Dopant3-2 was obtained (12.9 g).

3. Synthesis of Compound Dopant3-3

(1) Intermediate (I-H)

[Reaction Formula 7-1]

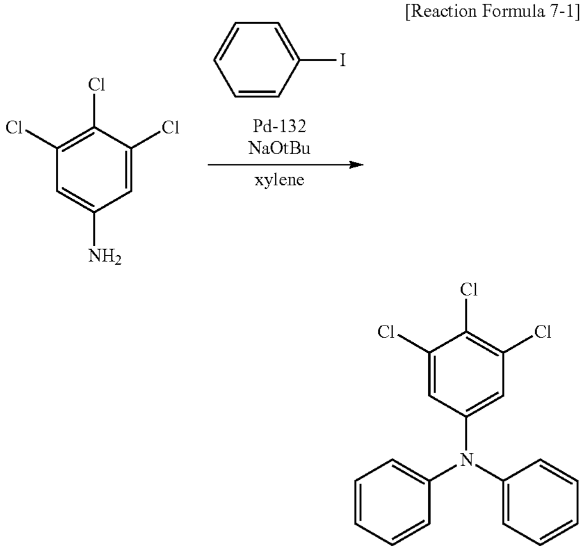

(I-H)

Under an atmosphere of nitrogen, 3,4,5-trichloroaniline (15.0 g), iodobenzene (46.7 g), dichlorobis[(di-t-butyl (4-dimethylaminophenyl) phosphino) palladium (Pd-132, 0.54 g) as a palladium catalyst, sodium-t-butoxide (NaOtBu, 18.3 g), and xylene (150 ml) were put in a flask and heated at 120° C. for 2 hours. After a reaction, water and ethyl acetate were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-H) (49.7 g).

(2) Intermediate (I-I)

[Reaction Formula 7-2]

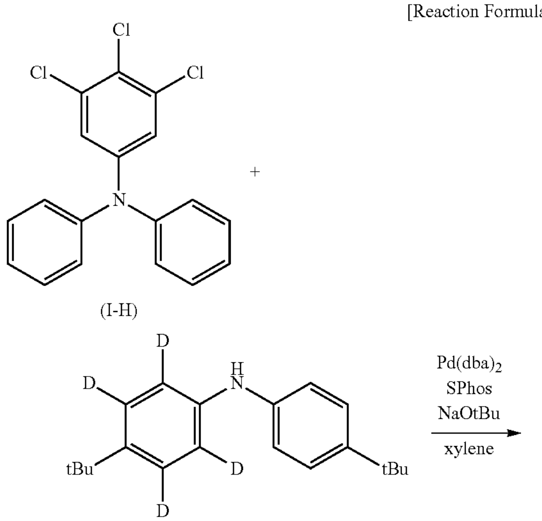

(I-E)

-continued

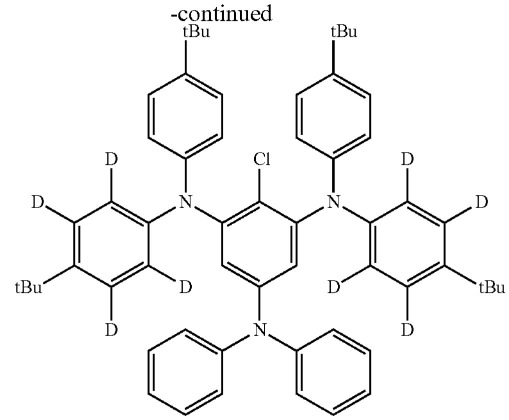

(I-I)

Under an atmosphere of nitrogen, intermediate (I-H) (10.0 g), intermediate (I-E) (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-I) (16.0 g).

(3) Dopant3-3

[Reaction Formula 7-3]

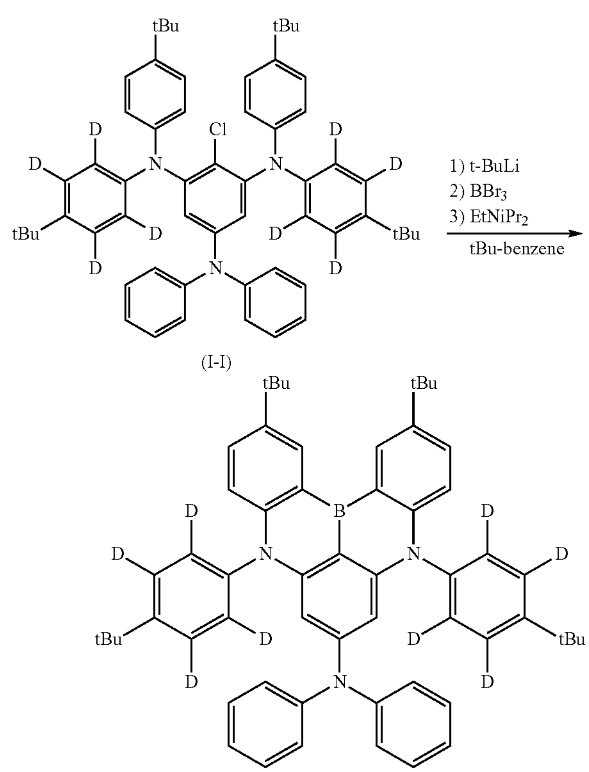

Under an atmosphere of nitrogen, a 1.62 M tert-butyllithium pentane solution (22.1 ml) was dropwisely added in a flask containing intermediate (I-I) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled sodium acetate aqueous solution and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant3-3 was obtained (8.5 g).

4. Synthesis of Compound Dopant3-4

[Reaction Formula 8]

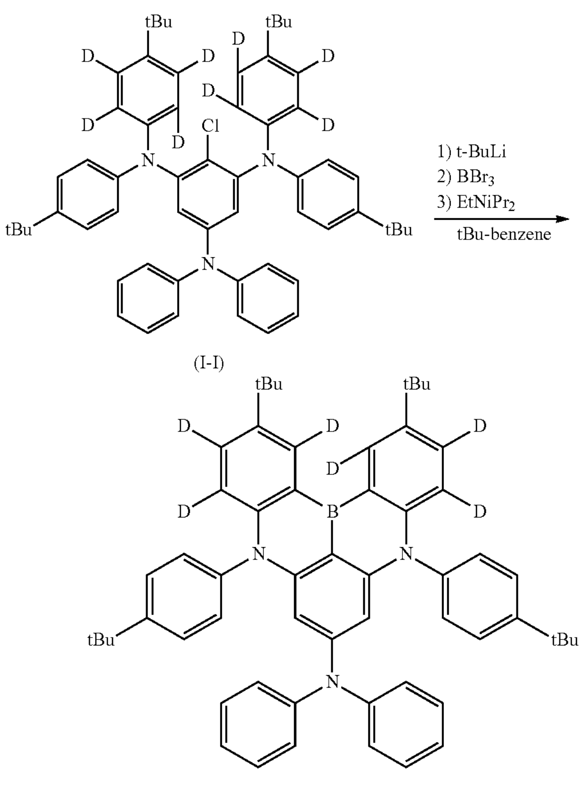

Under an atmosphere of nitrogen, a 1.62 M tert-butyllithium pentane solution (22.1 ml) was dropwisely added in a flask containing intermediate (I-I) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled sodium acetate aqueous solution and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant3-4 was obtained (0.5 g).

5. Synthesis of Compound Dopant3-5

(1) Intermediate (I-W)

[Reaction Formula 9-1]

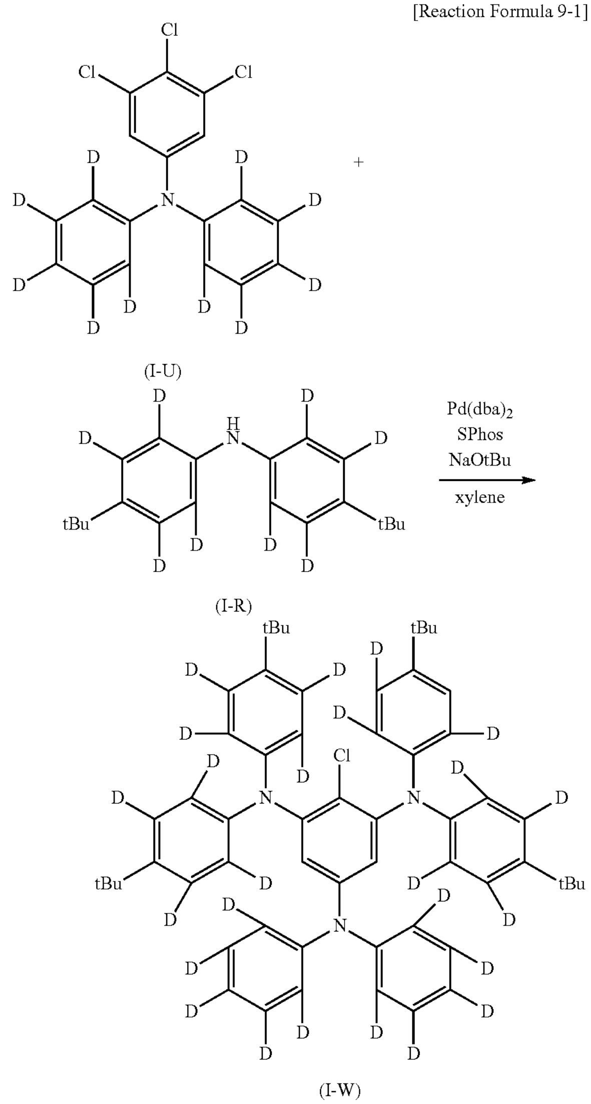

Under an atmosphere of nitrogen, intermediate (I-R) (10.7 g), intermediate (I-U) (6.0 g), bis(dibenzylideneacetone) palladium (0.58 g), 2-dicyclohexylphosphino-2',6'-dimethoxybiphenyl (SPhos, 0.82 g), sodium-t-butoxide (4.0 g), and xylene (60 ml) were put in a flask and heated at 100° C.

for 1.5 hours. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene), and the obtained solid was washed with cooled heptane to obtain intermediate (I-W) (9.4 g).

(2) Dopant3-5

[Reaction Formula 9-2]

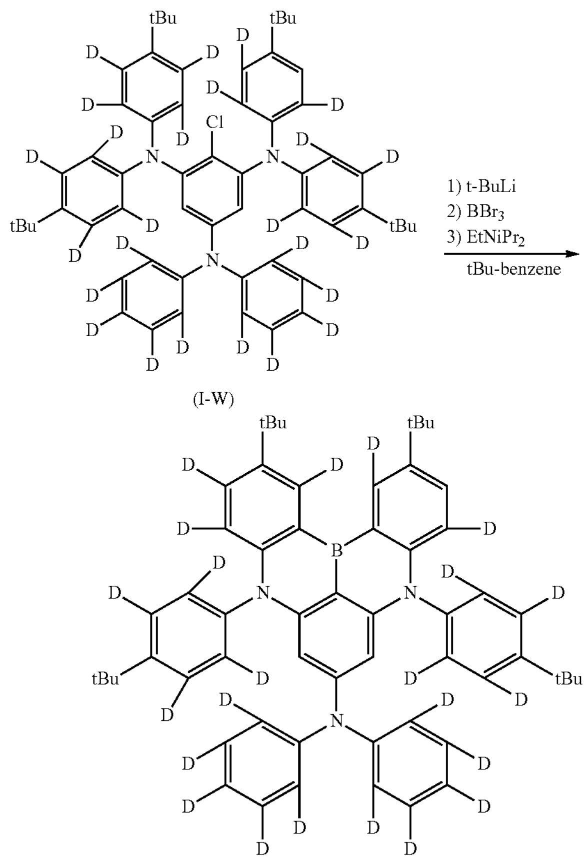

Under an atmosphere of nitrogen, a 1.62 M tert-butyllithium pentane solution (13.8 ml) was dropwisely added in a flask containing intermediate (I-W) (8.6 g) and tert-butylbenzene (100 ml) at 0° C. After completion of dropwise addition of tert-butyllithium pentane solution, the temperature of the mixture was raised to 60° C., and the mixture was stirred for 0.5 hours. Thereafter, a component having a boiling point lower than that of tert-butylbenzene was distilled off under reduced pressure. The residue was cooled to −50° C., boron tribromide (5.4 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 2.8 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, an aqueous solution of sodium acetate that had been cooled in an ice bath and then ethyl acetate were added thereto, and the mixture was stirred for one hour. A yellow suspension was filtered, and the precipitate was washed twice with methanol and pure water, and again washed with methanol. The yellow crystal was heated and dissolved in chlorobenzene, and then purified with a silica gel short pass column (eluent: heated chlorobenzene). The obtained crude product was filtered by adding heptane, and then the crystal was washed with heptane to obtain the compound Dopant3-5 (5.9 g).

6. Synthesis of Compound Dopant6-1

(1) Intermediate (I-8)

[Reaction Formula 10-1]

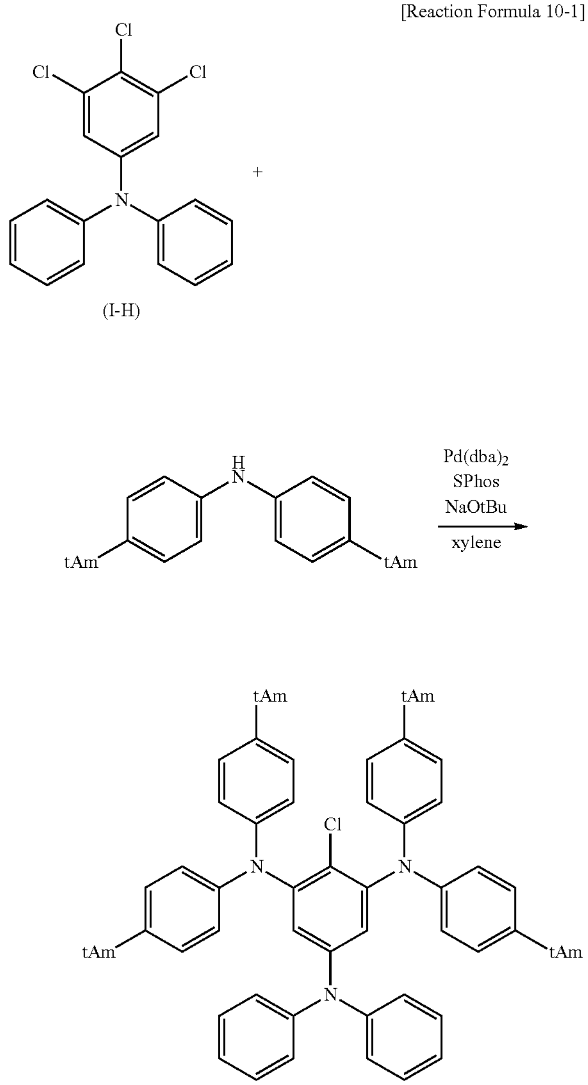

(I-8)

Under an atmosphere of nitrogen, intermediate (I-H) (10.0 g) bis(4-t-Amylphenyl) amine (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-8) (16.0 g).

(2) Dopant6-1

[Reaction Formula 10-2]

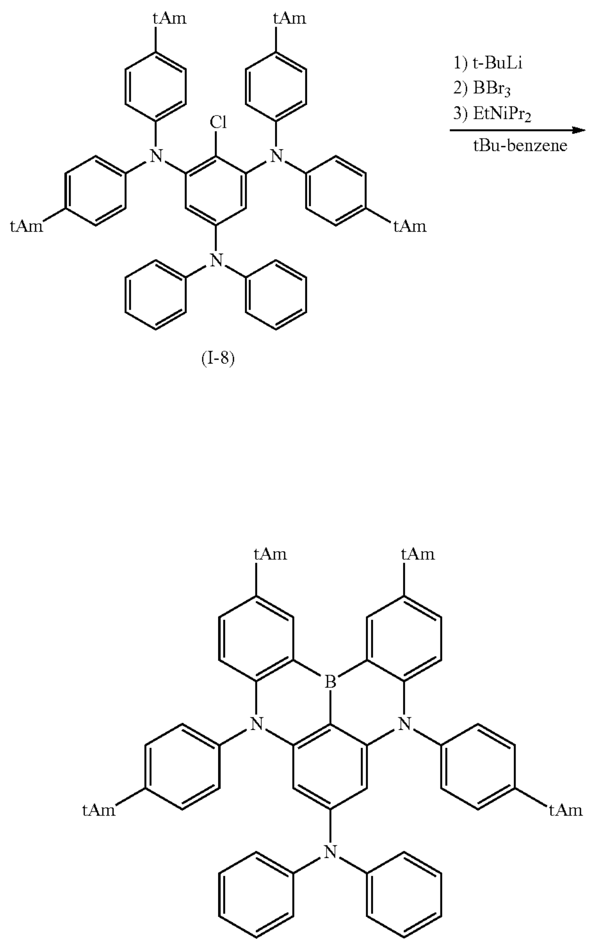

(I-8)

Under an atmosphere of nitrogen, a 1.62 M tert-butyllithium pentane solution (22.1 ml) was dropwisely added in a flask containing intermediate (I-8) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant6-1 was obtained (8.5 g).

7. Synthesis of Compound Dopant6-2

(1) Intermediate (I-X)

[Reaction Formula 11-1]

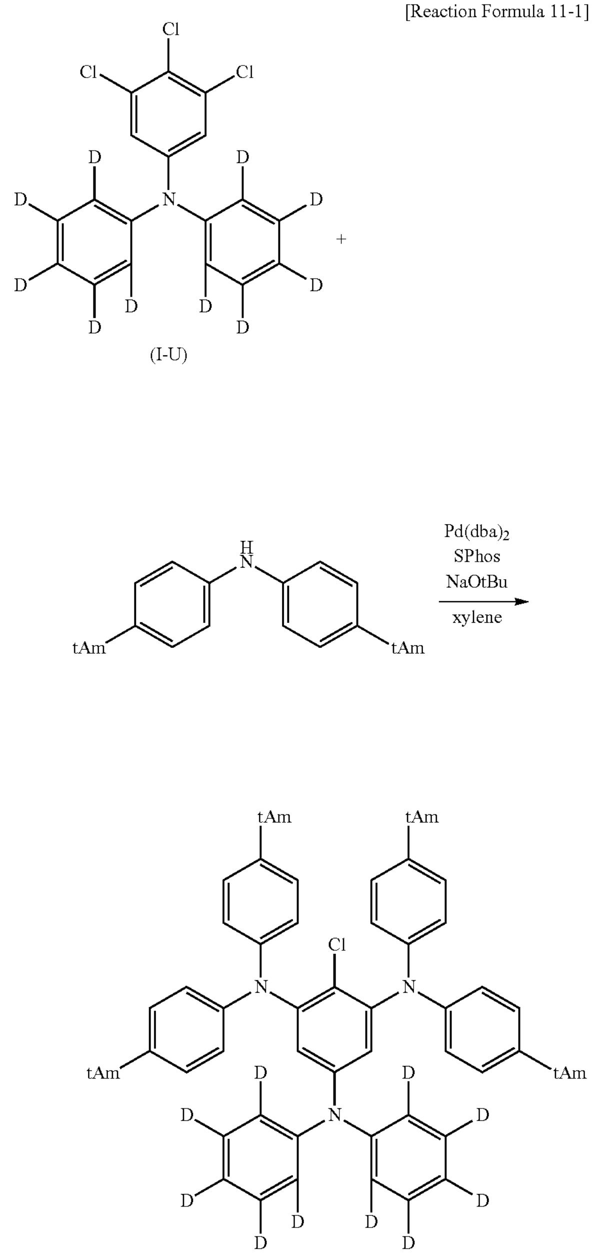

(I-U)

(I-X)

Under an atmosphere of nitrogen, intermediate (I-U) (15.0 g), bis(4-t-amylphenyl) amine (26.0 g), bis(dibenzylideneacetone) palladium (0.48 g), 2-dicyclohexylphosphino-2',6'-dimethoxybiphenyl (SPhos, 0.86 g), sodium-t-butoxide (10.0 g), and xylene (130 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-X) (23.0 g).

(2) Dopant6-2

[Reaction Formula 11-2]

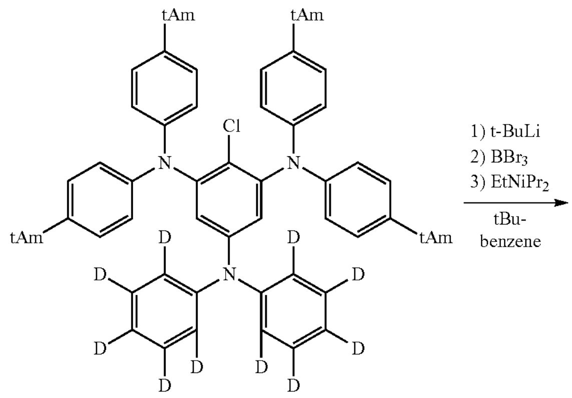

(I-X)

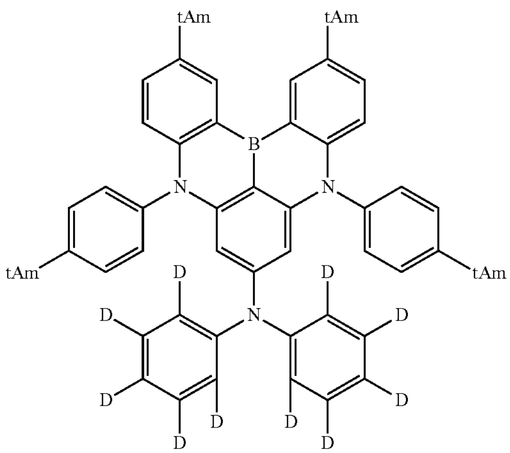

Under an atmosphere of nitrogen, a 1.62 M tert-butyllithium pentane solution (33.5 ml) was dropwisely added in a flask containing intermediate (I-X) (23.0 g) and tert-butylbenzene (250 ml) at 0° C. After completion of dropwise addition of tert-butyllithium pentane solution, the temperature of the mixture was increased to 60° C., the mixture was stirred for one hour, and then components having boiling points lower than that of tert-butylbenzene were distilled off under reduced pressure. The residue was cooled to −50° C., boron tribromide (13.6 g) was added thereto, the temperature of the mixture was raised to room temperature, and the mixture was stirred for 0.5 hours. Thereafter, the mixture was cooled again to 0° C., N,N-diisopropylethylamine (EtNiPr$_2$, 7.0 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, an aqueous solution of sodium acetate that had been cooled in an ice bath and then ethyl acetate were added thereto, and the mixture was partitioned. The organic layer was concentrated, and then purified with a silica gel short pass column (eluent: heated chlorobenzene). The obtained crude product was washed with refluxed heptane and refluxed ethyl acetate, and then was further reprecipitated from chlorobenzene. Thus, the compound Dopant6-2 was obtained (12.9 g).

8. Synthesis of Compound Dopant6-3

(1) Intermediate (I-K)

[Reaction Formula 12-1]

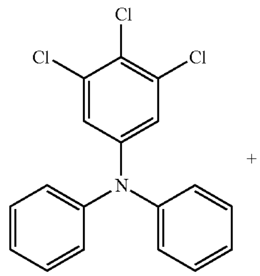

(I-H)

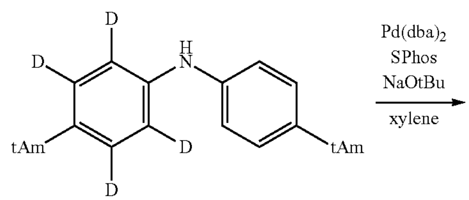

(I-J)

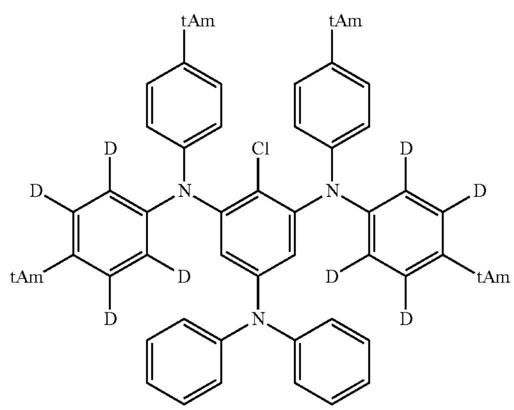

(I-K)

Under an atmosphere of nitrogen, intermediate (I-H) (10.0 g), intermediate (I-J) (19.5 g), bis(dibenzylideneacetone) palladium (0.33 g), SPhos (0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-K) (16.0 g).

(2) Dopant6-3

[Reaction Formula 12-2]

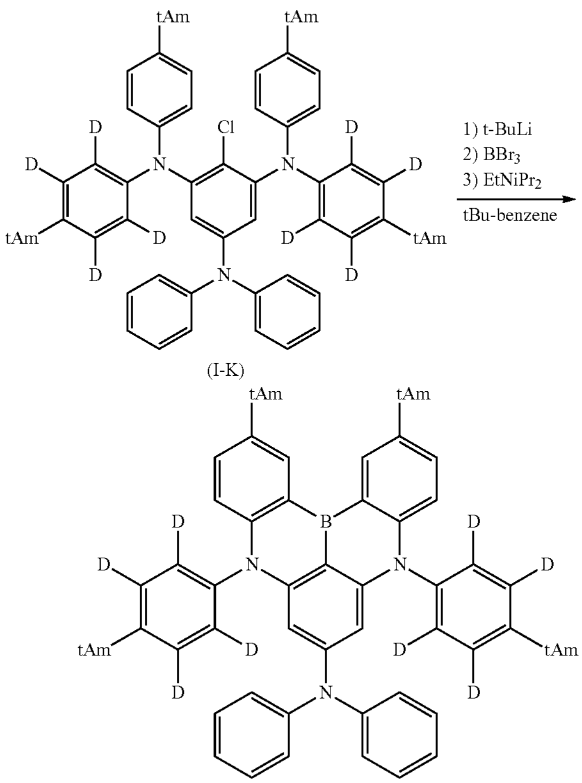

Under an atmosphere of nitrogen, a 1.62 M tert-butyllithium pentane solution (22.1 ml) was dropwisely added in a flask containing intermediate (I-K) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine (Et-$NiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant6-3 was obtained (8.5 g).

9. Synthesis of Compound Dopant6-4

[Reaction Formula 13]

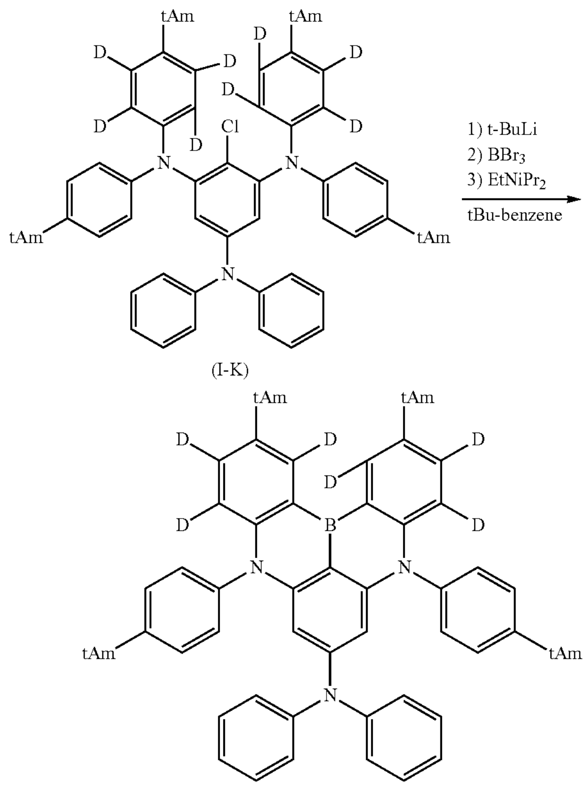

Under an atmosphere of nitrogen, a 1.62 M tert-butyllithium pentane solution (22.1 ml) was dropwisely added in a flask containing intermediate (I-K) (16.0 g) and tert-butylbenzene (100 ml) at 0° C. After completion of dropwise addition of tert-butyllithium pentane solution, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine (Et-$NiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant6-4 was obtained (0.6 g).

10. Synthesis of Compound Dopant6-5

(1) Intermediate (I-Z)

[Reaction Formula 14-1]

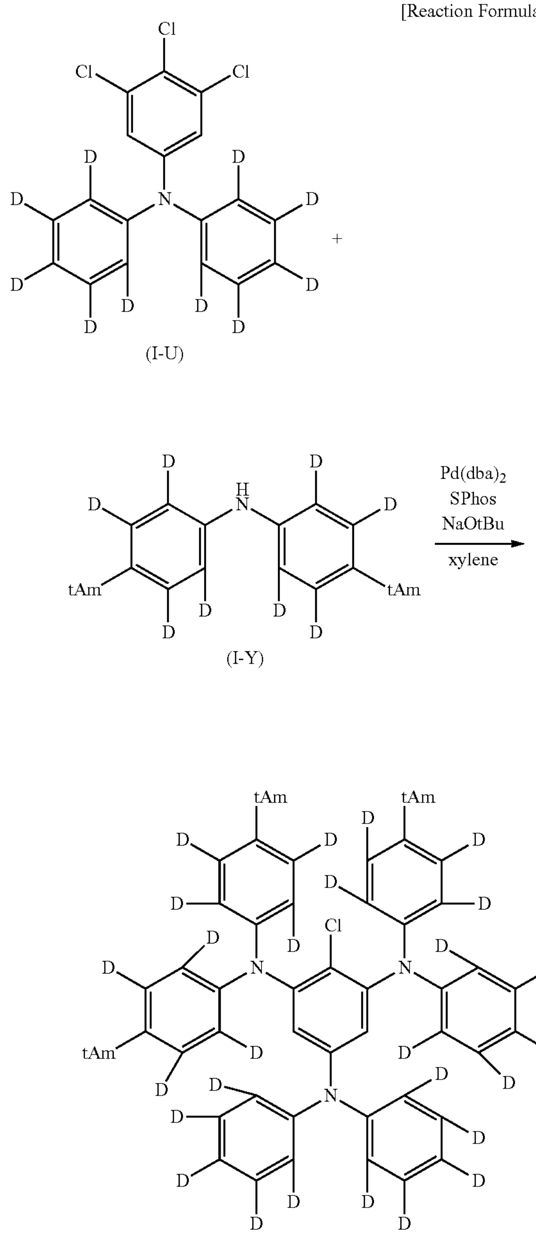

(I-Z)

Under an atmosphere of nitrogen, intermediate (I-U) (10.7 g), intermediate (I-Y) (6.0 g), bis(dibenzylideneacetone) palladium (0.58 g), 2-dicyclohexylphosphino-2',6'-dimethoxybiphenyl (SPhos, 0.82 g), sodium-t-butoxide (4.0 g), and xylene (60 ml) were put in a flask and heated at 100° C. for 1.5 hours. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene), and the obtained solid was washed with cooled heptane to obtain intermediate (I-Z) (9.4 g).

(2) Dopant6-5

[Reaction Formula 14-2]

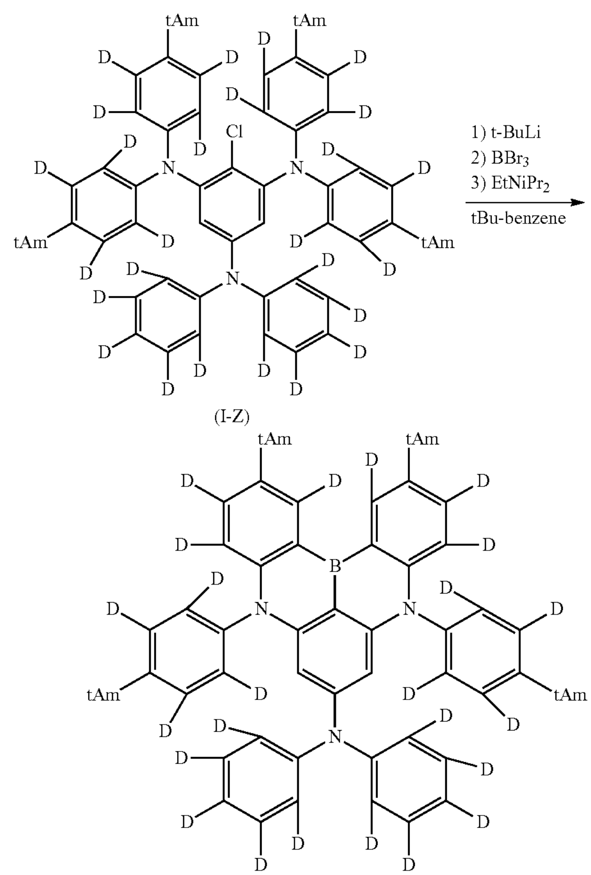

Under an atmosphere of nitrogen, a 1.62 M tert-butyllithium pentane solution (13.8 ml) was dropwisely added in a flask containing intermediate (I-Z) (8.6 g) and tert-butylbenzene (100 ml) at 0° C. After completion of dropwise addition of tert-butyllithium pentane solution, the temperature of the mixture was raised to 60° C., and the mixture was stirred for 0.5 hours. Thereafter, a component having a boiling point lower than that of tert-butylbenzene was distilled off under reduced pressure. The residue was cooled to −50° C., boron tribromide (5.4 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 2.8 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, an aqueous solution of sodium acetate that had been cooled in an ice bath and then ethyl acetate were added thereto, and the mixture was stirred for one hour. A yellow suspension was filtered, and the precipitate was washed twice with methanol and pure water, and again washed with methanol. The yellow crystal was heated and dissolved in chlorobenzene, and then purified with a silica gel short pass column (eluent: heated chlorobenzene). The obtained crude product was filtered by adding heptane, and then the crystal was washed with heptane to obtain the compound Dopant6-5 (6.1 g).

11. Synthesis of Compound Dopant5-1

(1) Intermediate (I-10)

[Reaction Formula 15-1]

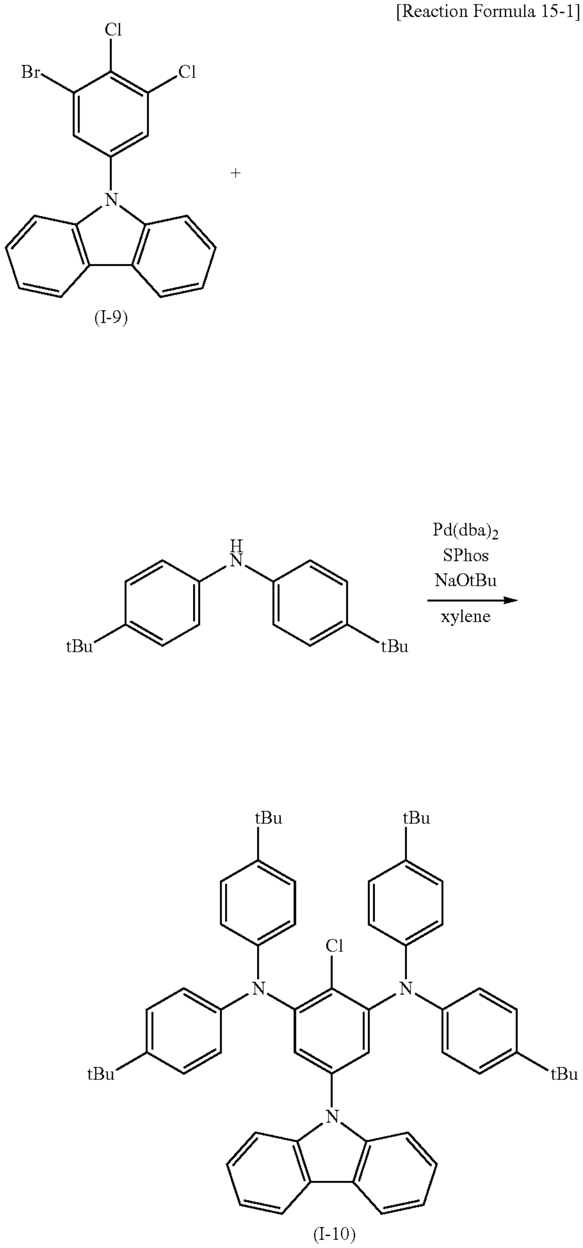

Under an atmosphere of nitrogen, intermediate (I-9) (10.0 g), bis(4-t-Butylphenyl) amine (19.5 g), bis(dibenzylideneacetone) palladium (0.33 g), 2-dicyclohexylphosphino-2', 6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-10) (16.1 g).

(2) Dopant5-1

[Reaction Formula 15-2]

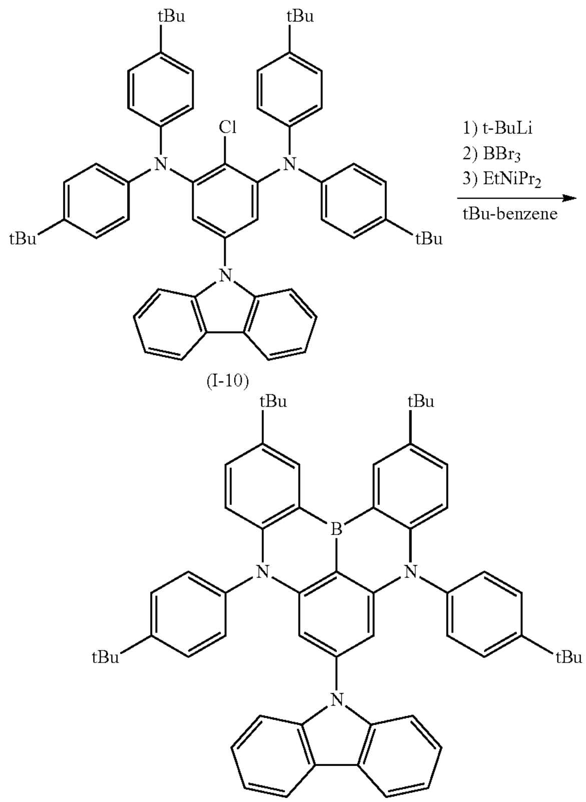

Under an atmosphere of nitrogen, a 1.62 M tert-butyllithium pentane solution (22.1 ml) was put in a flask containing intermediate (I-10) (16.0 g) and tert-butylbenzene (100 ml) at 0° C. After completion of dropwise addition, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine (EtNiPr$_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant5-1 was obtained (8.0 g).

12. Synthesis of Compound Dopant5-2

(1) Intermediate (I-12)

[Reaction Formula 16-1]

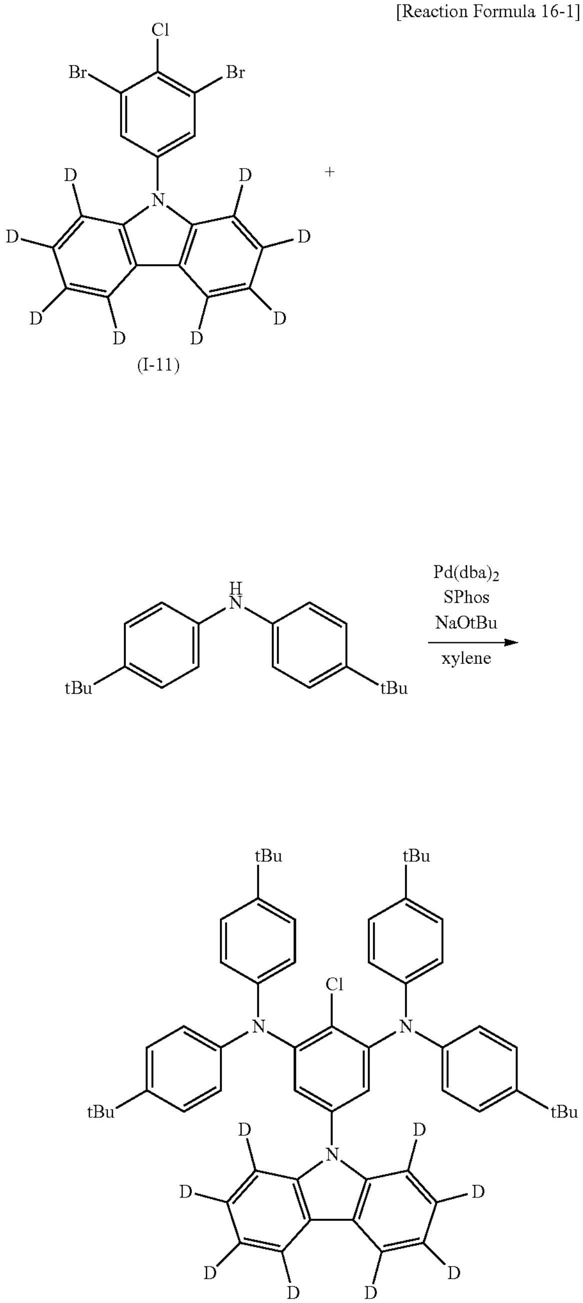

(I-11)

(I-12)

Under an atmosphere of nitrogen, intermediate (I-11) (10.0 g) bis(4-t-Butylphenyl) amine (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-12) (16.0 g).

(2) Dopant5-2

[Reaction Formula 16-2]

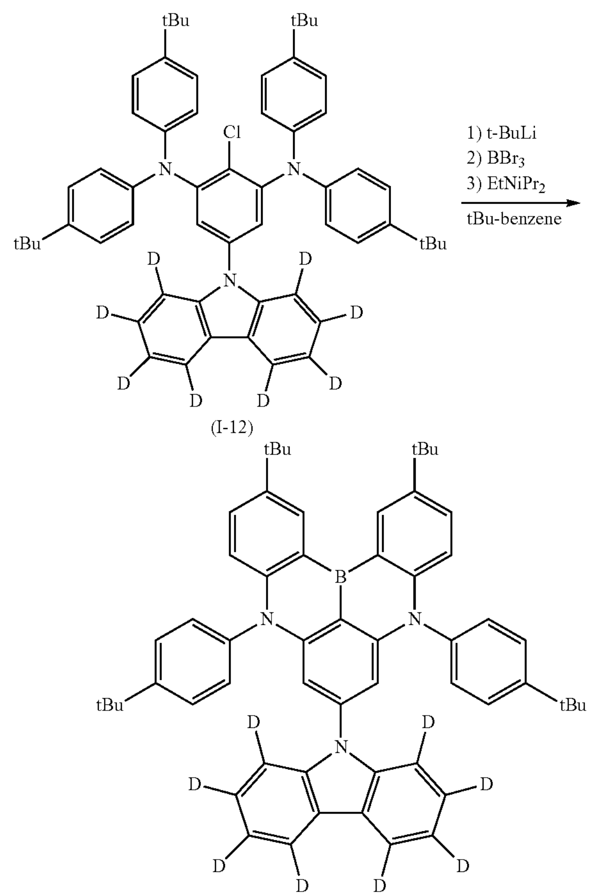

(I-12)

Under an atmosphere of nitrogen, a 1.62 M tert-butyllithium pentane solution (22.1 ml) was put in a flask containing intermediate (I-12) (16.0 g) and tert-butylbenzene (100 ml) at 0° C. After completion of dropwise addition, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine (EtNiPr$_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant5-2 was obtained (8.5 g).

13. Synthesis of Compound Dopant5-3

(1) Intermediate (I-13)

[Reaction Formula 17-1]

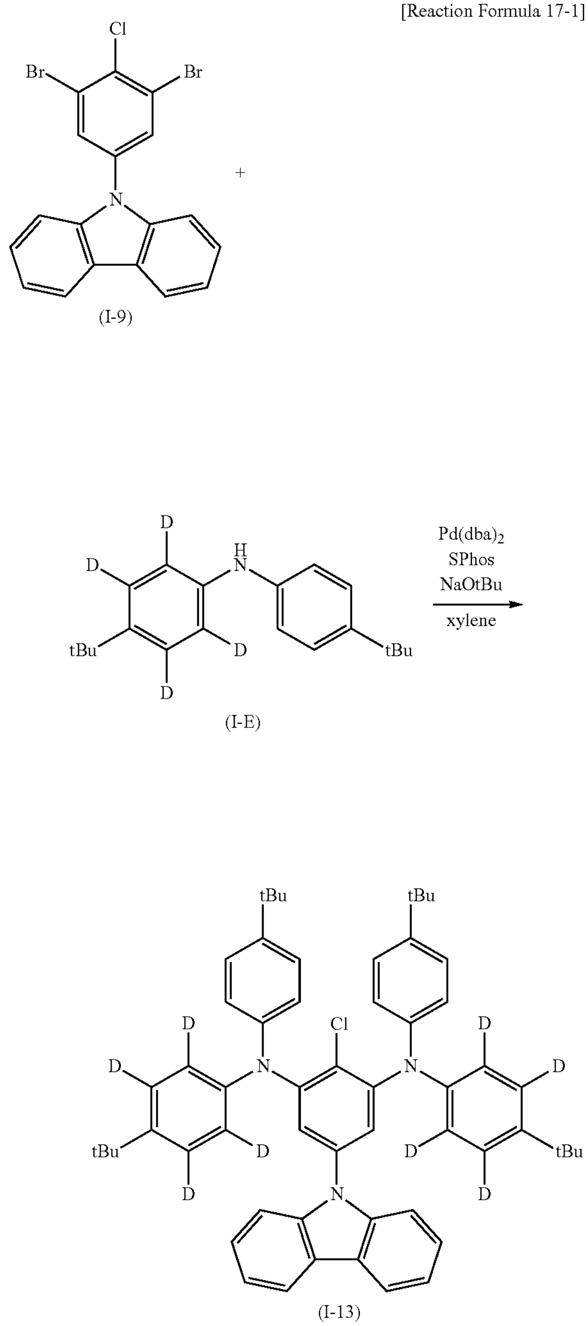

Under an atmosphere of nitrogen, intermediate (I-9) (10.0 g), intermediate (I-E) (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-13) (16.5 g).

(2) Dopant5-3

[Reaction Formula 17-2]

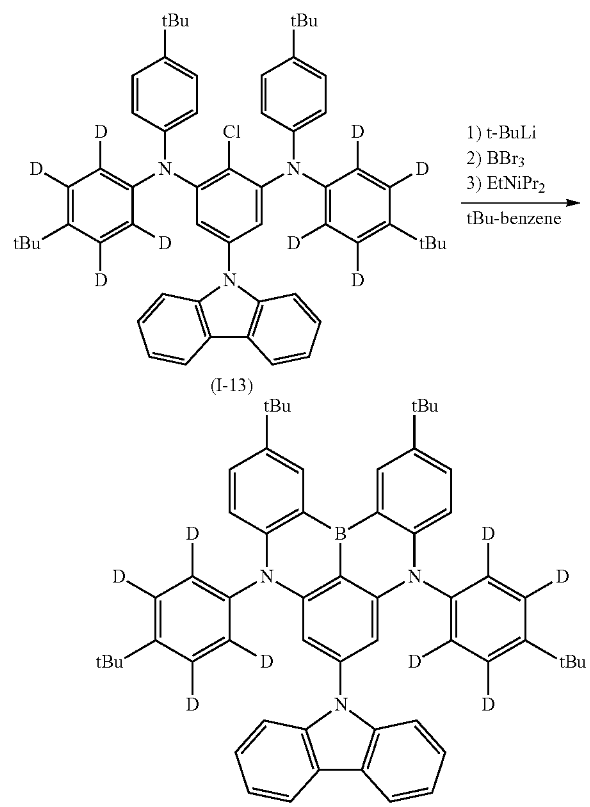

Under an atmosphere of nitrogen, a 1.62 M tert-butyllithium pentane solution (22.1 ml) was put in a flask containing intermediate (I-13) (16.0 g) and tert-butylbenzene (100 ml) at 0° C. After completion of dropwise addition, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine (EtNiPr$_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant5-3 was obtained (8.5 g).

14. Synthesis of Compound Dopant5-4

[Reaction Formula 18]

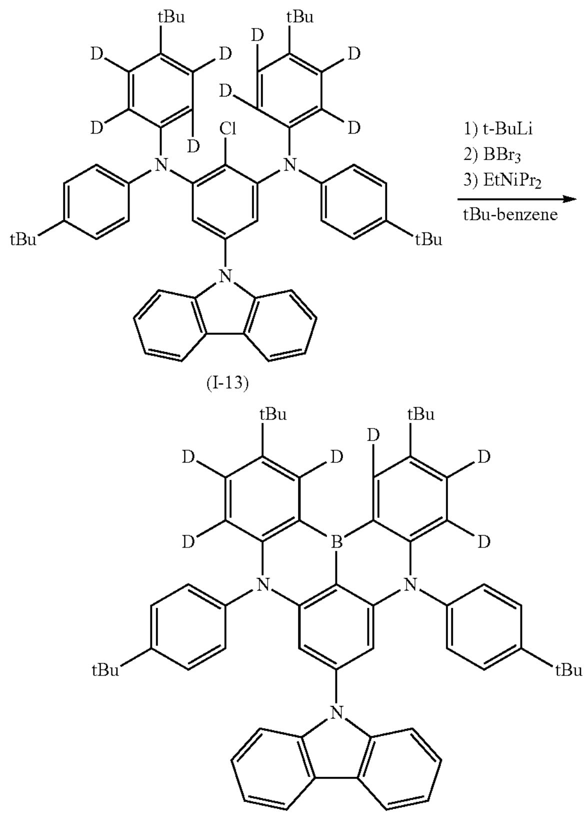

Under an atmosphere of nitrogen, a 1.62 M tert-butyllithium pentane solution (22.1 ml) was put in a flask containing intermediate (I-13) (16.0 g) and tert-butylbenzene (100 ml) at 0° C. After completion of dropwise addition, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant5-4 was obtained (0.5 g).

15. Synthesis of Compound Dopant5-5

(1) Intermediate (I-14)

[Reaction Formula 19-1]

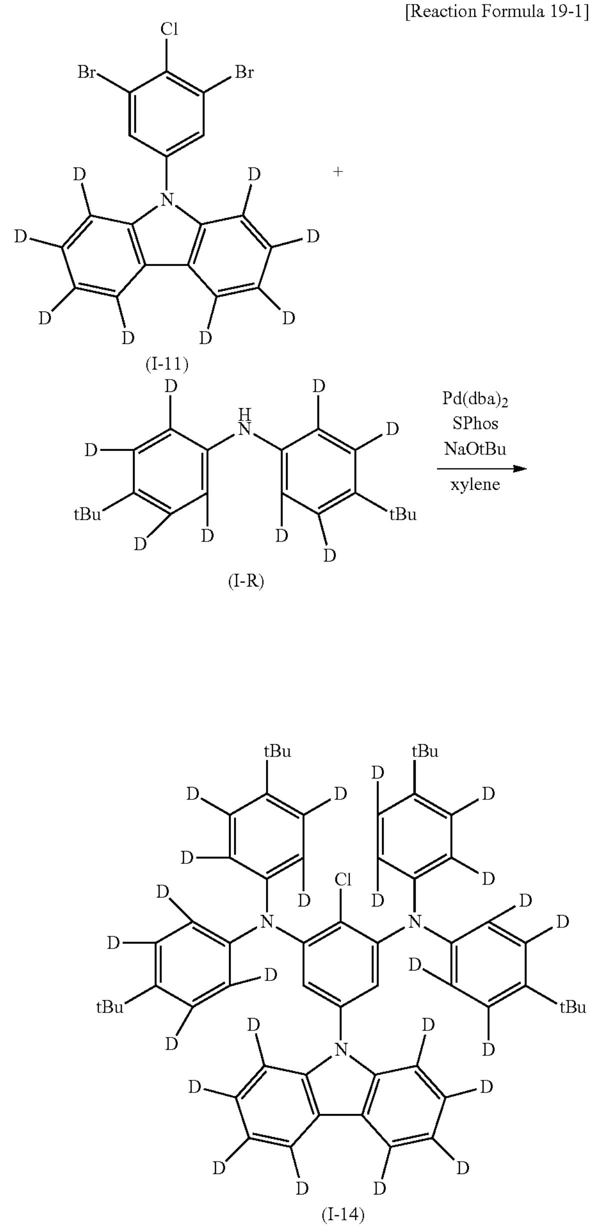

Under an atmosphere of nitrogen, intermediate (I-11) (10.0 g) intermediate (I-R) (19.5 g), bis(dibenzylideneacetone) palladium (0.33 g), 2-dicyclohexylphosphino-2',6'-dimethoxybiphenyl (SPhos, 0.59 g), sodium-t-butoxide (6.9 g), and xylene (80 ml) were put in a flask and heated at 100° C. for one hour. After a reaction, water and toluene were added to the reaction solution, followed by stirring. Thereafter, the organic layer was separated and washed with water. Thereafter, the organic layer was concentrated to obtain a crude product. The crude product was purified with a silica gel short pass column (eluent: toluene) to obtain intermediate (I-14) (17.5 g).

(2) Dopant5-5

[Reaction Formula 19-2]

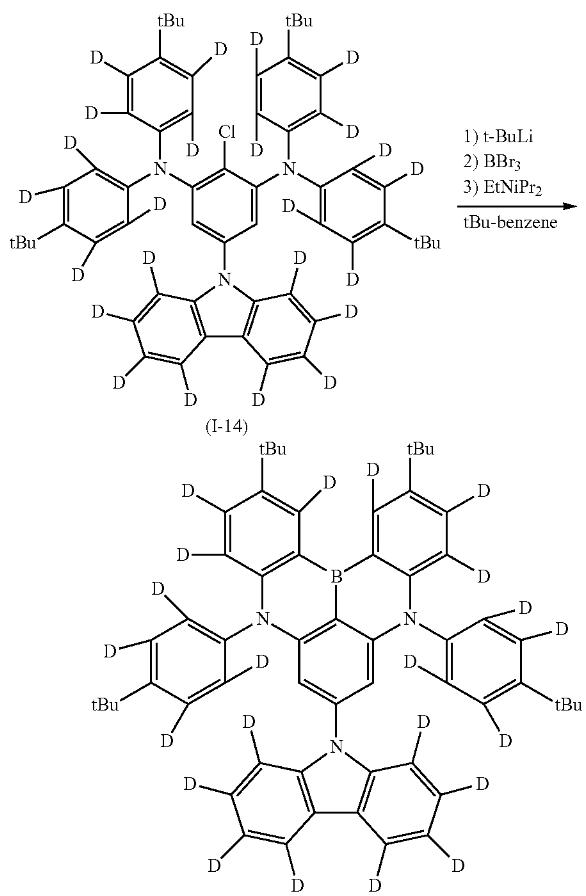

Under an atmosphere of nitrogen, a 1.62 M tert-butyllithium pentane solution (22.1 ml) was put in a flask containing intermediate (I-14) (16.0 g) and tert-butylbenzene (100 ml) at 0° C. After completion of dropwise addition, the temperature of the mixture was increased to 70° C., the mixture was stirred for 0.5 hour, and then components having boiling points lower than that of tert-butylbenzene were distilled off under reduced pressure. The residue was cooled to −50° C., boron tribromide (9.0 g) was added thereto, the temperature of the mixture was raised to room temperature, and the mixture was stirred for 0.5 hours. Thereafter, the mixture was cooled again to 0° C., N,N-diisopropylethylamine ($EtNiPr_2$, 4.6 g) was added thereto, and the mixture was stirred at room temperature until heat generation was settled. Subsequently, the temperature of the mixture was raised to 100° C., and the mixture was heated and stirred for one hour. The reaction liquid was cooled to room temperature, cooled aqueous solution of sodium acetate and then ethyl acetate were added thereto, and the mixture was partitioned. The organic layer was concentrated, and then purified with a silica gel short pass column (eluent: toluene). The obtained crude product was further reprecipitated from heptane. Thus, the compound Dopant5-5 was obtained (10.0 g).

[Organic Light Emitting Diode]

The anode (ITO, 0.5 mm), the HIL (Formula 11 (97 wt %) and Formula 12 (3 wt %), 100 Å), the HTL (Formula 11, 1000 Å), the EBL (100 Å), the EML (host (98 wt %) and dopant (2 wt %), 200 Å), the HBL (100 Å), the EIL (Formula 13 (98 wt %) and $L_1$ (2 wt %), 200 Å) and the cathode (Al, 500 Å) was sequentially deposited. An encapsulation film is formed by using an UV curable epoxy and a moisture getter to form the OLED.

[Formula 11]

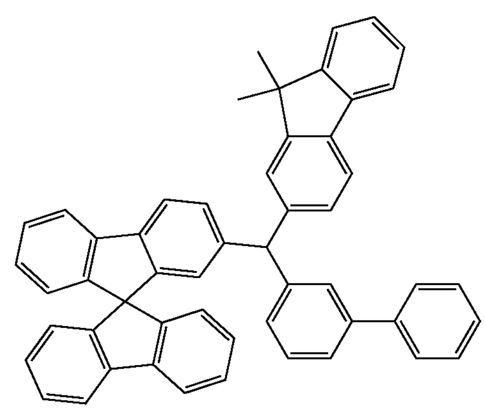

[Formula 12]

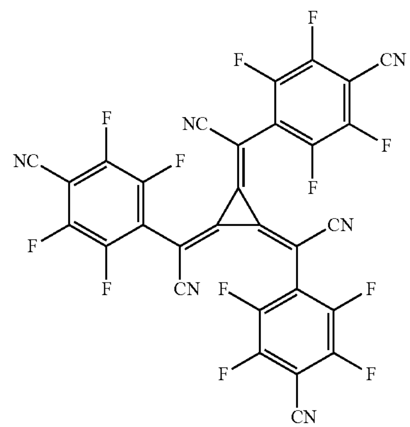

[Formula 13]

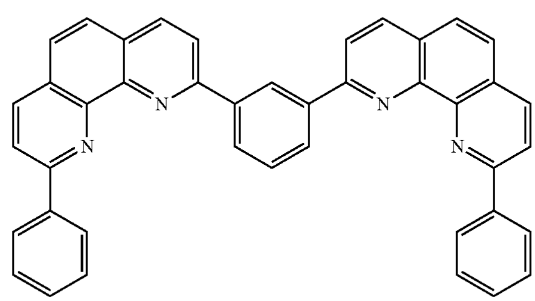

1. COMPARATIVE EXAMPLES

(1) Comparative Examples 1 to 3 (Ref1 to Ref3)

The compound "E2" in Formula 6 is used for the EBL. The compound "Dopant3-1" in Formula 4 is used as the dopant, and the compound "Host1-1" in Formula 14 is used to the host to form the EML. 2-phenyl-9,10-bis(2,2'-bipyridin-5-yl)anthracene, the compound "H1" in formula 8, the compound "H31" in Formula 10 are respectively used for the HBL.

(2) Comparative Examples 4 to 6 (Ref4 to Ref6)

The compound "E2" in Formula 6 is used for the EBL. The compound "Dopant3-1" in Formula 4 is used as the dopant, and the compound "Host1-2" in Formula 14 is used to the host to form the EML. 2-phenyl-9,10-bis(2,2'-bipyridin-5-yl)anthracene, the compound "H1" in formula 8, the compound "H31" in Formula 10 are respectively used for the HBL.

(3) Comparative Examples 7 to 9 (Re7 to Ref9)

NPB (N,N'-di(1-naphthyl)-N,N'-diphenyl-(1,1'-biphenyl)-4,4'-diamine) is used for the EBL. The compound "Dopant3-1" in Formula 4 is used as the dopant, and the compound "Host1" in Formula 2 is used to the host to form the EML. 2-phenyl-9,10-bis(2,2'-bipyridin-5-yl)anthracene, the compound "H1" in formula 8, the compound "H31" in Formula 10 are respectively used for the HBL.

(4) Comparative Examples 10 to 12 (Ref10 to Ref12)

The compound "E2" in Formula 6 is used for the EBL. The compound "Dopant3-1" in Formula 4 is used as the dopant, and the compound "Host1-3" in Formula 14 is used to the host to form the EML. 2-phenyl-9,10-bis(2,2'-bipyridin-5-yl)anthracene, the compound "H1" in formula 8, the compound "H31" in Formula 10 are respectively used for the HBL.

(5) Comparative Examples 13 to 15 (Ref13 to Ref15)

The compound "E2" in Formula 6 is used for the EBL. The compound "Dopant3-1" in Formula 4 is used as the dopant, and the compound "Host1-4" in Formula 14 is used to the host to form the EML. 2-phenyl-9,10-bis(2,2'-bipyridin-5-yl)anthracene, the compound "H1" in formula 8, the compound "H31" in Formula 10 are respectively used for the HBL.

2. EXAMPLES (1) Examples 1 to 3 (Ex1 to Ex3)

The compound "E2" in Formula 6 is used for the EBL. The compound "Dopant3-1" in Formula 4 is used as the dopant, and the compound "Host1" in Formula 2 is used to the host to form the EML. 2-phenyl-9,10-bis(2,2'-bipyridin-5-yl)anthracene, the compound "H1" in formula 8, the compound "H31" in Formula 10 are respectively used for the HBL.

[Formula 14]

Host 1-1

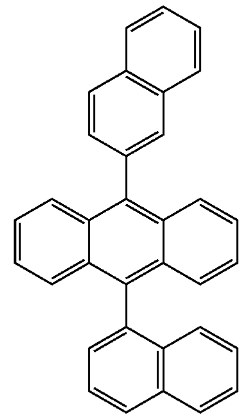

Host 1-2

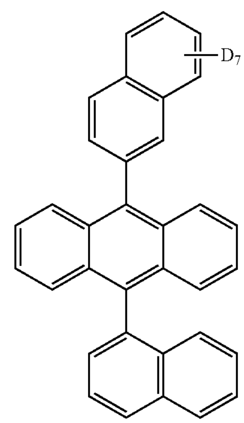

Host 1-3

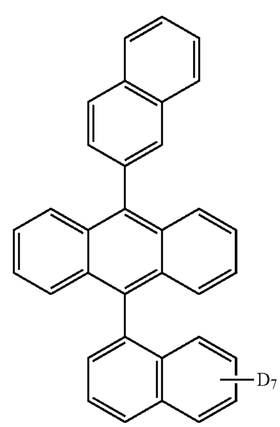

-continued

Host 1-4

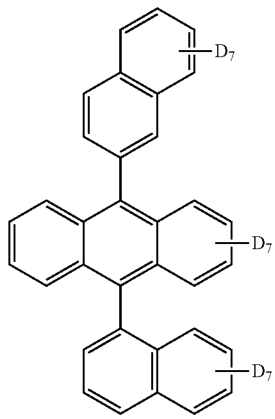

The properties, i.e., voltage (V), efficiency (Cd/A), color coordinate (CIE) and lifespan (T95), of the OLEDs manufactured in Comparative Examples 1 to 15 and Examples 1 to 3 are measured and listed in Table 1.

TABLE 1

| | V | cd/A | CIE (x, y) | | T95 [hr] |
|---|---|---|---|---|---|
| Ref 1 | 3.80 | 4.20 | 0.141 | 0.061 | 81 |
| Ref 2 | 3.75 | 4.50 | 0.141 | 0.063 | 110 |
| Ref 3 | 3.80 | 4.40 | 0.141 | 0.062 | 133 |
| Ref 4 | 3.81 | 3.99 | 0.141 | 0.062 | 82 |
| Ref 5 | 3.78 | 4.20 | 0.140 | 0.059 | 102 |
| Ref 6 | 3.81 | 4.01 | 0.140 | 0.061 | 136 |
| Ref 7 | 3.82 | 2.20 | 0.141 | 0.064 | 53 |
| Ref 8 | 3.78 | 2.43 | 0.140 | 0.062 | 58 |
| Ref 9 | 3.80 | 2.15 | 0.141 | 0.063 | 60 |
| Ex 1 | 3.82 | 4.00 | 0.140 | 0.064 | 111 |
| Ex 2 | 3.77 | 4.15 | 0.141 | 0.058 | 146 |
| Ex 3 | 3.80 | 3.99 | 0.141 | 0.06 | 178 |
| Ref 10 | 3.81 | 4.00 | 0.140 | 0.061 | 78 |
| Ref 11 | 3.76 | 4.15 | 0.141 | 0.058 | 118 |
| Ref 12 | 3.81 | 3.99 | 0.140 | 0.059 | 137 |
| Ref 13 | 3.81 | 4.01 | 0.141 | 0.059 | 105 |
| Ref 14 | 3.79 | 4.18 | 0.140 | 0.06 | 179 |
| Ref 15 | 3.81 | 4.02 | 0.141 | 0.06 | 201 |

As shown in Table 1, the lifespan of the OLED in Comparative Examples 13 to 15 and Examples 1 to 3 using the host, the anthracene core of which is substituted with deuterium, is significantly increased.

On the other hand, in comparison to the OLED in Comparative Examples 13 to 15 using the host, the core and the substituent of which are substituted with deuterium, the lifespan of the OLED in Examples 1 to 3 using the host, only the core of which is substituted with deuterium, is little short. However, the OLED in Examples 1 to 3 provides sufficient lifespan with less deuterium atoms which is very expensive. Namely, with minimizing the increase of the production cost by the deuterium atom, the OLED provides sufficient lifespan.

In addition, in comparison to the OLED in Comparative Examples 7 to 9, the lifespan of the OLED in Examples 1 to 3 using the electron blocking material of the heteroaryl-substituted amine derivative, i.e., the compound in Formula 5, is significantly increased.

Moreover, in comparison to the OLED in Example 1, the lifespan of the OLED in Examples 2 and 3 using the hole blocking material of the azine compound, i.e., the compound in Formula 7, or the benzimidazole derivative, i.e., the compound in Formula 9, is further increased.

3. COMPARATIVE EXAMPLES 16 TO 30 (REF16 TO REF30)

The compound "Dopant3-2" in Formula 4 is used instead of the compound "Dopant3-1" of Comparative Examples 1 to 15.

4. EXAMPLES 4 TO 6 (EX4 TO EX6)

The compound "Dopant3-2" in Formula 4 is used instead of the compound "Dopant3-1" of Examples 1 to 3.

The properties, i.e., voltage (V), efficiency (Cd/A), color coordinate (CIE) and lifespan (T95), of the OLEDs manufactured in Comparative Examples 16 to 30 and Examples 4 to 6 are measured and listed in Table 2.

TABLE 2

| | V | cd/A | CIE (x, y) | | T95 [hr] |
|---|---|---|---|---|---|
| Ref 16 | 3.80 | 4.01 | 0.140 | 0.059 | 80 |
| Ref 17 | 3.76 | 4.12 | 0.141 | 0.06 | 110 |
| Ref 18 | 3.80 | 4.00 | 0.140 | 0.06 | 133 |
| Ref 19 | 3.81 | 3.99 | 0.141 | 0.059 | 80 |
| Ref 20 | 3.78 | 4.05 | 0.141 | 0.059 | 111 |
| Ref 21 | 3.81 | 4.01 | 0.141 | 0.059 | 131 |
| Ref 22 | 3.80 | 1.84 | 0.141 | 0.06 | 43 |
| Ref 23 | 3.78 | 1.98 | 0.140 | 0.06 | 46 |
| Ref 24 | 3.80 | 1.86 | 0.141 | 0.059 | 50 |
| Ex 4 | 3.80 | 3.99 | 0.140 | 0.06 | 110 |
| Ex 5 | 3.77 | 4.08 | 0.141 | 0.059 | 153 |
| Ex 6 | 3.80 | 4.00 | 0.141 | 0.06 | 180 |
| Ref 25 | 3.81 | 3.98 | 0.141 | 0.06 | 83 |
| Ref 26 | 3.79 | 4.08 | 0.140 | 0.059 | 115 |
| Ref 27 | 3.81 | 3.99 | 0.141 | 0.059 | 137 |
| Ref 28 | 3.80 | 4.01 | 0.140 | 0.06 | 124 |
| Ref 29 | 3.76 | 4.08 | 0.140 | 0.06 | 177 |
| Ref 30 | 3.80 | 4.00 | 0.141 | 0.059 | 204 |

As shown in Table 2, the lifespan of the OLED in Comparative Examples 28 to 30 and Examples 4 to 6 using the host, the anthracene core of which is substituted with deuterium, is significantly increased.

On the other hand, in comparison to the OLED in Comparative Examples 28 to 30 using the host, the anthracene core and the substituent of which are substituted with deuterium, the lifespan of the OLED in Examples 4 to 6 using the host, only the anthracene core of which is substituted with deuterium, is little short. However, the OLED in Examples 4 to 6 provides sufficient lifespan with less deuterium atoms which is very expensive.

In addition, in comparison to the OLED in Comparative Examples 22 to 24, the lifespan of the OLED in Examples 4 to 6 using the electron blocking material of the heteroaryl-substituted amine derivative, i.e., the compound in Formula 5, is significantly increased.

Moreover, in comparison to the OLED in Example 4, the lifespan of the OLED in Examples 5 and 6 using the hole blocking material of the azine compound, i.e., the compound in Formula 7, or the benzimidazole derivative, i.e., the compound in Formula 9, is further increased.

5. COMPARATIVE EXAMPLES 31 TO 45 (REF31 TO REF45)

The compound "Dopant3-3" in Formula 4 is used instead of the compound "Dopant3-1" of Comparative Examples 1 to 15.

6. EXAMPLES 7 TO 9 (EX7 TO EX9)

The compound "Dopant3-3" in Formula 4 is used instead of the compound "Dopant3-1" of Examples 1 to 3.

The properties, i.e., voltage (V), efficiency (Cd/A), color coordinate (CIE) and lifespan (T95), of the OLEDs manufactured in Comparative Examples 31 to 45 and Examples 7 to 9 are measured and listed in Table 3.

TABLE 3

| | V | cd/A | CIE (x, y) | | T95 [hr] |
|---|---|---|---|---|---|
| Ref 31 | 3.80 | 4.02 | 0.141 | 0.059 | 75 |
| Ref 32 | 3.76 | 4.12 | 0.141 | 0.059 | 119 |
| Ref 33 | 3.80 | 4.03 | 0.140 | 0.061 | 133 |
| Ref 34 | 3.81 | 3.98 | 0.141 | 0.059 | 79 |
| Ref 35 | 3.77 | 4.06 | 0.142 | 0.06 | 120 |
| Ref 36 | 3.81 | 3.99 | 0.141 | 0.059 | 138 |
| Ref 37 | 3.80 | 1.89 | 0.141 | 0.06 | 40 |
| Ref 38 | 3.76 | 2.08 | 0.140 | 0.06 | 44 |
| Ref 39 | 3.80 | 1.91 | 0.141 | 0.059 | 52 |
| Ex 7 | 3.80 | 4.00 | 0.140 | 0.061 | 94 |
| Ex 8 | 3.77 | 4.08 | 0.140 | 0.059 | 146 |
| Ex 9 | 3.80 | 4.01 | 0.141 | 0.06 | 180 |
| Ref 40 | 3.81 | 4.01 | 0.140 | 0.06 | 81 |
| Ref 41 | 3.78 | 4.12 | 0.140 | 0.06 | 117 |
| Ref 42 | 3.81 | 3.99 | 0.141 | 0.059 | 137 |
| Ref 43 | 3.81 | 3.99 | 0.140 | 0.059 | 129 |
| Ref 44 | 3.77 | 4.18 | 0.140 | 0.06 | 177 |
| Ref 45 | 3.81 | 4.00 | 0.141 | 0.059 | 203 |

As shown in Table 3, the lifespan of the OLED in Comparative Examples 43 to 45 and Examples 7 to 9 using the host, the anthracene core of which is substituted with deuterium, is significantly increased.

On the other hand, in comparison to the OLED in Comparative Examples 43 to 45 using the host, the anthracene core and the substituent of which are substituted with deuterium, the lifespan of the OLED in Examples 7 to 9 using the host, only the anthracene core of which is substituted with deuterium, is little short. However, the OLED in Examples 7 to 9 provides sufficient lifespan with less deuterium atoms which is very expensive.

In addition, in comparison to the OLED in Comparative Examples 37 to 39, the lifespan of the OLED in Examples 7 to 9 using the electron blocking material of the heteroaryl-substituted amine derivative, i.e., the compound in Formula 5, is significantly increased.

Moreover, in comparison to the OLED in Example 7, the lifespan of the OLED in Examples 8 and 9 using the hole blocking material of the azine compound, i.e., the compound in Formula 7, or the benzimidazole derivative, i.e., the compound in Formula 9, is further increased.

7. COMPARATIVE EXAMPLES 46 TO 60 (REF46 TO REF60)

The compound "Dopant3-4" in Formula 4 is used instead of the compound "Dopant3-1" of Comparative Examples 1 to 15.

8. EXAMPLES 10 TO 12 (EX10 TO EX12)

The compound "Dopant3-4" in Formula 4 is used instead of the compound "Dopant3-1" of Examples 1 to 3.

The properties, i.e., voltage (V), efficiency (Cd/A), color coordinate (CIE) and lifespan (T95), of the OLEDs manufactured in Comparative Examples 46 to 60 and Examples 10 to 12 are measured and listed in Table 4.

TABLE 4

| | V | cd/A | CIE (x, y) | | T95 [hr] |
|---|---|---|---|---|---|
| Ref 46 | 3.80 | 4.00 | 0.141 | 0.06 | 78 |
| Ref 47 | 3.76 | 4.12 | 0.140 | 0.059 | 117 |
| Ref 48 | 3.80 | 4.01 | 0.141 | 0.06 | 136 |
| Ref 49 | 3.81 | 3.98 | 0.140 | 0.059 | 77 |
| Ref 50 | 3.76 | 4.08 | 0.141 | 0.06 | 122 |
| Ref 51 | 3.81 | 3.99 | 0.141 | 0.059 | 137 |
| Ref 52 | 3.81 | 1.96 | 0.141 | 0.059 | 41 |
| Ref 53 | 3.77 | 2.11 | 0.140 | 0.06 | 46 |
| Ref 54 | 3.81 | 2.01 | 0.141 | 0.06 | 52 |
| Ex 10 | 3.82 | 4.01 | 0.140 | 0.059 | 91 |
| Ex 11 | 3.78 | 4.10 | 0.140 | 0.059 | 148 |
| Ex 12 | 3.81 | 3.99 | 0.141 | 0.06 | 183 |
| Ref 55 | 3.79 | 4.01 | 0.141 | 0.059 | 79 |
| Ref 56 | 3.76 | 4.08 | 0.140 | 0.059 | 123 |
| Ref 57 | 3.80 | 4.00 | 0.141 | 0.06 | 138 |
| Ref 58 | 3.82 | 4.03 | 0.141 | 0.06 | 124 |
| Ref 59 | 3.75 | 4.08 | 0.140 | 0.061 | 169 |
| Ref 60 | 3.79 | 4.03 | 0.141 | 0.06 | 203 |

As shown in Table 4, the lifespan of the OLED in Comparative Examples 58 to 60 and Examples 10 to 12 using the host, the anthracene core of which is substituted with deuterium, is significantly increased.

On the other hand, in comparison to the OLED in Comparative Examples 58 to 60 using the host, the anthracene core and the substituent of which are substituted with deuterium, the lifespan of the OLED in Examples 10 to 12 using the host, only the anthracene core of which is substituted with deuterium, is little short. However, the OLED in Examples 10 to 12 provides sufficient lifespan with less deuterium atoms which is very expensive.

In addition, in comparison to the OLED in Comparative Examples 52 to 54, the lifespan of the OLED in Examples 10 to 12 using the electron blocking material of the heteroaryl-substituted amine derivative, i.e., the compound in Formula 5, is significantly increased.

Moreover, in comparison to the OLED in Example 10, the lifespan of the OLED in Examples 11 and 12 using the hole blocking material of the azine compound, i.e., the compound in Formula 7, or the benzimidazole derivative, i.e., the compound in Formula 9, is further increased.

9. COMPARATIVE EXAMPLES 61 TO 75 (REF61 TO REF75)

The compound "Dopant3-5" in Formula 4 is used instead of the compound "Dopant3-1" of Comparative Examples 1 to 15.

10. EXAMPLES 13 TO 15 (EX13 TO EX15)

The compound "Dopant3-5" in Formula 4 is used instead of the compound "Dopant3-1" of Examples 1 to 3.

The properties, i.e., voltage (V), efficiency (Cd/A), color coordinate (CIE) and lifespan (T95), of the OLEDs manufactured in Comparative Examples 61 to 75 and Examples 13 to 15 are measured and listed in Table 5.

TABLE 5

| | V | cd/A | CIE (x, y) | | T95 [hr] |
|---|---|---|---|---|---|
| Ref 61 | 3.82 | 4.02 | 0.141 | 0.061 | 135 |
| Ref 62 | 3.78 | 4.09 | 0.141 | 0.06 | 179 |
| Ref 63 | 3.81 | 4.01 | 0.141 | 0.061 | 205 |

TABLE 5-continued

| | V | cd/A | CIE (x, y) | | T95 [hr] |
|---|---|---|---|---|---|
| Ref 64 | 3.83 | 4.03 | 0.140 | 0.062 | 130 |
| Ref 65 | 3.77 | 4.11 | 0.140 | 0.059 | 173 |
| Ref 66 | 3.80 | 4.00 | 0.141 | 0.06 | 205 |
| Ref 67 | 3.82 | 1.95 | 0.141 | 0.059 | 67 |
| Ref 68 | 3.77 | 2.10 | 0.140 | 0.061 | 69 |
| Ref 69 | 3.82 | 1.98 | 0.141 | 0.061 | 85 |
| Ex 13 | 3.81 | 4.05 | 0.142 | 0.059 | 145 |
| Ex 14 | 3.78 | 4.15 | 0.140 | 0.062 | 244 |
| Ex 15 | 3.80 | 4.03 | 0.141 | 0.061 | 278 |
| Ref 70 | 3.81 | 3.98 | 0.141 | 0.06 | 134 |
| Ref 71 | 3.75 | 4.05 | 0.141 | 0.06 | 174 |
| Ref 72 | 3.78 | 3.98 | 0.141 | 0.06 | 203 |
| Ref 73 | 3.82 | 4.01 | 0.140 | 0.061 | 161 |
| Ref 74 | 3.76 | 4.15 | 0.141 | 0.06 | 278 |
| Ref 75 | 3.81 | 4.03 | 0.140 | 0.059 | 311 |

As shown in Table 5, the lifespan of the OLED in Comparative Examples 73 to 75 and Examples 13 to 15 using the host, the anthracene core of which is substituted with deuterium, is significantly increased.

On the other hand, in comparison to the OLED in Comparative Examples 73 to 75 using the host, the anthracene core and the substituent of which are substituted with deuterium, the lifespan of the OLED in Examples 13 to 15 using the host, only the anthracene core of which is substituted with deuterium, is little short. However, the OLED in Examples 13 to 15 provides sufficient lifespan with less deuterium atoms which is very expensive.

In addition, in comparison to the OLED in Comparative Examples 67 to 69, the lifespan of the OLED in Examples 13 to 15 using the electron blocking material of the heteroaryl-substituted amine derivative, i.e., the compound in Formula 5, is significantly increased.

Moreover, in comparison to the OLED in Example 13, the lifespan of the OLED in Examples 14 and 15 using the hole blocking material of the azine compound, i.e., the compound in Formula 7, or the benzimidazole derivative, i.e., the compound in Formula 9, is further increased.

Further, when the EML includes the fully-deuterated dopant, i.e., the compound "Dopant3-5", the lifespan of the OLED is significantly increased.

11. COMPARATIVE EXAMPLES 76 TO 90 (REF76 TO REF90)

The compounds "Host2-1" in Formula 15, "Host2-2" in Formula 15, "Host2" in Formula 2, "Host2-3" in Formula 15 and "Host2-4" in Formula 15 are used instead of the compounds "Host1-1", "Host1-2", "Host1", "Host1-3" and "Host1-4" of Comparative Examples 1 to 15.

12. EXAMPLES 16 TO 18 (EX16 TO EX18)

The compound "Host2" in Formula 2 is used instead of the compound "Host1" of Examples 1 to 3.

[Formula 15]

Host 2-1

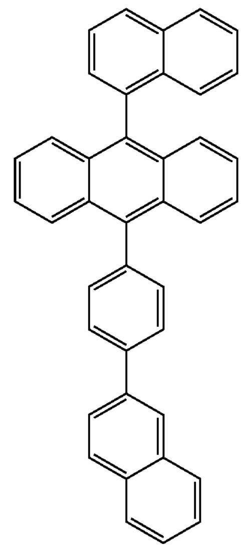

Host 2-2

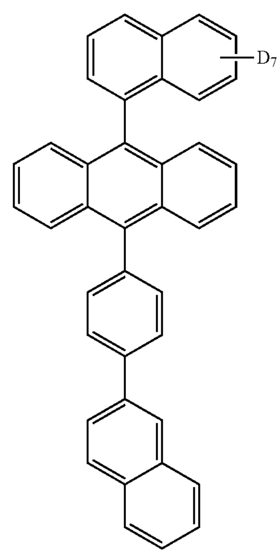

Host 2-3

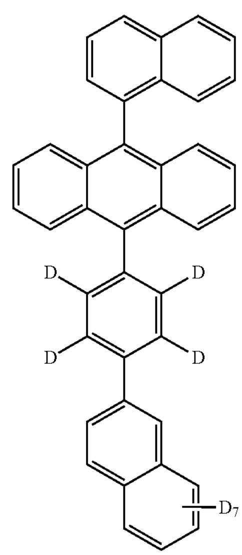

-continued

Host 2-4

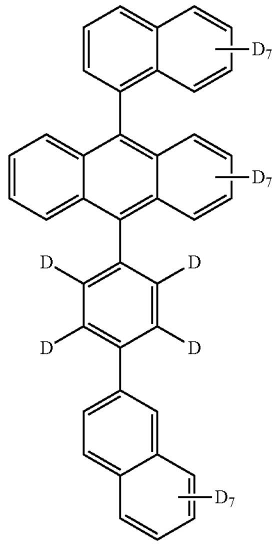

The properties, i.e., voltage (V), efficiency (Cd/A), color coordinate (CIE) and lifespan (T95), of the OLEDs manufactured in Comparative Examples 76 to 90 and Examples 16 to 18 are measured and listed in Table 6.

TABLE 6

| | V | cd/A | CIE (x, y) | | T95 [hr] |
|---|---|---|---|---|---|
| Ref 76 | 3.82 | 4.02 | 0.141 | 0.061 | 135 |
| Ref 77 | 3.78 | 4.09 | 0.141 | 0.06 | 179 |
| Ref 78 | 3.81 | 4.01 | 0.141 | 0.061 | 205 |
| Ref 79 | 3.83 | 4.03 | 0.140 | 0.062 | 130 |
| Ref 80 | 3.77 | 4.11 | 0.140 | 0.059 | 173 |
| Ref 81 | 3.80 | 4.00 | 0.141 | 0.06 | 205 |
| Ref 82 | 3.82 | 1.95 | 0.141 | 0.059 | 67 |
| Ref 83 | 3.77 | 2.10 | 0.140 | 0.061 | 69 |
| Ref 84 | 3.82 | 1.98 | 0.141 | 0.061 | 85 |
| Ex 16 | 3.81 | 4.05 | 0.142 | 0.059 | 145 |
| Ex 17 | 3.78 | 4.15 | 0.140 | 0.062 | 244 |
| Ex 18 | 3.80 | 4.03 | 0.141 | 0.061 | 278 |
| Ref 85 | 3.81 | 3.98 | 0.141 | 0.06 | 134 |
| Ref 86 | 3.75 | 4.05 | 0.141 | 0.06 | 174 |
| Ref 87 | 3.78 | 3.98 | 0.141 | 0.06 | 203 |
| Ref 88 | 3.82 | 4.01 | 0.140 | 0.061 | 161 |
| Ref 89 | 3.76 | 4.15 | 0.141 | 0.06 | 278 |
| Ref 90 | 3.81 | 4.03 | 0.140 | 0.059 | 311 |

As shown in Table 6, the lifespan of the OLED in Comparative Examples 88 to 90 and Examples 16 to 18 using the host, the anthracene core of which is substituted with deuterium, is significantly increased.

On the other hand, in comparison to the OLED in Comparative Examples 88 to 90 using the host, the anthracene core and the substituent of which are substituted with deuterium, the lifespan of the OLED in Examples 16 to 18 using the host, only the anthracene core of which is substituted with deuterium, is little short. However, the OLED in Examples 16 to 18 provides sufficient lifespan with less deuterium atoms which is very expensive.

In addition, in comparison to the OLED in Comparative Examples 82 to 84, the lifespan of the OLED in Examples 16 to 18 using the electron blocking material of the heteroaryl-substituted amine derivative, i.e., the compound in Formula 5, is significantly increased.

Moreover, in comparison to the OLED in Example 16, the lifespan of the OLED in Examples 17 and 18 using the hole blocking material of the azine compound, i.e., the compound in Formula 7, or the benzimidazole derivative, i.e., the compound in Formula 9, is further increased.

13. COMPARATIVE EXAMPLES 91 TO 105 (REF91 TO REF105)

The compounds "Host2-1" in Formula 15, "Host2-2" in Formula 15, "Host2" in Formula 2, "Host2-3" in Formula 15 and "Host2-4" in Formula 15 are used instead of the compounds "Host1-1", "Host1-2", "Host1", "Host1-3" and "Host1-4" of Comparative Examples 16 to 30.

14. EXAMPLES 19 TO 21 (EX19 TO EX21)

The compound "Host2" in Formula 2 is used instead of the compound "Host1" of Examples 4 to 6.

The properties, i.e., voltage (V), efficiency (Cd/A), color coordinate (CIE) and lifespan (T95), of the OLEDs manufactured in Comparative Examples 91 to 105 and Examples 19 to 21 are measured and listed in Table 7.

TABLE 7

| | V | cd/A | CIE (x, y) | | T95 [hr] |
|---|---|---|---|---|---|
| Ref 91 | 3.81 | 4.02 | 0.141 | 0.062 | 70 |
| Ref 92 | 3.79 | 4.08 | 0.140 | 0.059 | 114 |
| Ref 93 | 3.81 | 4.01 | 0.140 | 0.061 | 134 |
| Ref 94 | 3.83 | 4.02 | 0.140 | 0.060 | 79 |
| Ref 95 | 3.77 | 4.12 | 0.141 | 0.061 | 112 |
| Ref 96 | 3.80 | 4.00 | 0.141 | 0.060 | 132 |
| Ref 97 | 3.83 | 1.97 | 0.142 | 0.062 | 44 |
| Ref 98 | 3.77 | 2.06 | 0.140 | 0.061 | 45 |
| Ref 99 | 3.83 | 1.98 | 0.140 | 0.059 | 52 |
| Ex 19 | 3.82 | 4.01 | 0.141 | 0.060 | 109 |
| Ex 20 | 3.76 | 4.09 | 0.140 | 0.059 | 150 |
| Ex 21 | 3.81 | 4.01 | 0.140 | 0.061 | 183 |
| Ref 100 | 3.81 | 4.04 | 0.141 | 0.059 | 81 |
| Ref 101 | 3.78 | 4.16 | 0.142 | 0.060 | 116 |
| Ref 102 | 3.81 | 4.02 | 0.141 | 0.060 | 134 |
| Ref 103 | 3.81 | 4.04 | 0.140 | 0.060 | 126 |
| Ref 104 | 3.77 | 4.11 | 0.140 | 0.059 | 180 |
| Ref 105 | 3.80 | 4.02 | 0.141 | 0.060 | 205 |

As shown in Table 7, the lifespan of the OLED in Comparative Examples 103 to 105 and Examples 19 to 21 using the host, the anthracene core of which is substituted with deuterium, is significantly increased.

On the other hand, in comparison to the OLED in Comparative Examples 103 to 105 using the host, the anthracene core and the substituent of which are substituted with deuterium, the lifespan of the OLED in Examples 19 to 21 using the host, only the anthracene core of which is substituted with deuterium, is little short. However, the OLED in Examples 19 to 21 provides sufficient lifespan with less deuterium atoms which is very expensive.

In addition, in comparison to the OLED in Comparative Examples 97 to 99, the lifespan of the OLED in Examples 19 to 21 using the electron blocking material of the heteroaryl-substituted amine derivative, i.e., the compound in Formula 5, is significantly increased.

Moreover, in comparison to the OLED in Example 19, the lifespan of the OLED in Examples 20 and 21 using the hole blocking material of the azine compound, i.e., the compound in Formula 7, or the benzimidazole derivative, i.e., the compound in Formula 9, is further increased.

15. COMPARATIVE EXAMPLES 106 TO 120 (REF106 TO REF120)

The compounds "Host2-1" in Formula 15, "Host2-2" in Formula 15, "Host2" in Formula 2, "Host2-3" in Formula 15 and "Host2-4" in Formula 15 are used instead of the compounds "Host1-1", "Host1-2", "Host1", "Host1-3" and "Host1-4" of Comparative Examples 31 to 45.

16. EXAMPLES 22 TO 24 (EX22 TO EX24)

The compound "Host2" in Formula 2 is used instead of the compound "Host1" of Examples 7 to 9.

The properties, i.e., voltage (V), efficiency (Cd/A), color coordinate (CIE) and lifespan (T95), of the OLEDs manufactured in Comparative Examples 106 to 120 and Examples 22 to 24 are measured and listed in Table 8.

TABLE 8

| | V | cd/A | CIE (x, y) | | T95 [hr] |
|---|---|---|---|---|---|
| Ref 106 | 3.80 | 3.98 | 0.141 | 0.060 | 76 |
| Ref 107 | 3.74 | 4.13 | 0.140 | 0.059 | 116 |
| Ref 108 | 3.78 | 3.99 | 0.141 | 0.060 | 137 |
| Ref 109 | 3.00 | 4.02 | 0.140 | 0.059 | 73 |
| Ref 110 | 3.79 | 4.10 | 0.141 | 0.060 | 118 |
| Ref 111 | 3.81 | 4.04 | 0.140 | 0.060 | 138 |
| Ref 112 | 3.83 | 1.92 | 0.140 | 0.062 | 41 |
| Ref 113 | 3.78 | 2.09 | 0.141 | 0.061 | 43 |
| Ref 114 | 3.81 | 1.95 | 0.140 | 0.059 | 55 |
| Ex 22 | 3.82 | 4.01 | 0.141 | 0.059 | 99 |
| Ex 23 | 3.76 | 4.12 | 0.141 | 0.059 | 162 |
| Ex 24 | 3.81 | 4.01 | 0.140 | 0.061 | 182 |
| Ref 115 | 3.81 | 3.99 | 0.141 | 0.059 | 78 |
| Ref 116 | 3.75 | 4.13 | 0.140 | 0.060 | 118 |
| Ref 117 | 3.80 | 4.02 | 0.141 | 0.060 | 139 |
| Ref 118 | 3.81 | 4.00 | 0.140 | 0.061 | 127 |
| Ref 119 | 3.76 | 4.12 | 0.141 | 0.060 | 179 |
| Ref 120 | 3.80 | 4.01 | 0.141 | 0.060 | 201 |

As shown in Table 8, the lifespan of the OLED in Comparative Examples 118 to 120 and Examples 22 to 24 using the host, the anthracene core of which is substituted with deuterium, is significantly increased.

On the other hand, in comparison to the OLED in Comparative Examples 118 to 120 using the host, the anthracene core and the substituent of which are substituted with deuterium, the lifespan of the OLED in Examples 22 to 24 using the host, only the anthracene core of which is substituted with deuterium, is little short. However, the OLED in Examples 22 to 24 provides sufficient lifespan with less deuterium atoms which is very expensive.

In addition, in comparison to the OLED in Comparative Examples 112 to 114, the lifespan of the OLED in Examples 22 to 24 using the electron blocking material of the heteroaryl-substituted amine derivative, i.e., the compound in Formula 5, is significantly increased.

Moreover, in comparison to the OLED in Example 22, the lifespan of the OLED in Examples 23 and 24 using the hole blocking material of the azine compound, i.e., the compound in Formula 7, or the benzimidazole derivative, i.e., the compound in Formula 9, is further increased.

17. COMPARATIVE EXAMPLES 121 TO 135 (REFL21 TO REF135)

The compounds "Host2-1" in Formula 15, "Host2-2" in Formula 15, "Host2" in Formula 2, "Host2-3" in Formula 15 and "Host2-4" in Formula 15 are used instead of the compounds "Host1-1", "Host1-2", "Host1", "Host1-3" and "Host1-4" of Comparative Examples 46 to 60.

18. EXAMPLES 25 TO 27 (EX25 TO EX27)

The compound "Host2" in Formula 2 is used instead of the compound "Host1" of Examples 10 to 12.

The properties, i.e., voltage (V), efficiency (Cd/A), color coordinate (CIE) and lifespan (T95), of the OLEDs manufactured in Comparative Examples 121 to 135 and Examples 25 to 27 are measured and listed in Table 9.

TABLE 9

| | V | cd/A | CIE (x, y) | | T95 [hr] |
|---|---|---|---|---|---|
| Ref 121 | 3.81 | 4.00 | 0.141 | 0.062 | 75 |
| Ref 122 | 3.76 | 4.00 | 0.140 | 0.060 | 114 |
| Ref 123 | 3.80 | 4.08 | 0.141 | 0.059 | 133 |
| Ref 124 | 3.81 | 4.02 | 0.141 | 0.059 | 81 |
| Ref 125 | 3.76 | 4.13 | 0.140 | 0.061 | 119 |
| Ref 126 | 3.80 | 4.05 | 0.141 | 0.060 | 135 |
| Ref 127 | 3.82 | 1.93 | 0.141 | 0.060 | 44 |
| Ref 128 | 3.74 | 2.07 | 0.141 | 0.059 | 46 |
| Ref 129 | 3.80 | 1.94 | 0.140 | 0.060 | 56 |
| Ex 25 | 3.79 | 3.98 | 0.141 | 0.059 | 95 |
| Ex 26 | 3.73 | 4.08 | 0.140 | 0.060 | 150 |
| Ex 27 | 3.78 | 4.00 | 0.141 | 0.060 | 184 |
| Ref 130 | 3.81 | 4.01 | 0.140 | 0.060 | 83 |
| Ref 131 | 3.75 | 4.12 | 0.141 | 0.059 | 121 |
| Ref 132 | 3.81 | 4.02 | 0.140 | 0.060 | 137 |
| Ref 133 | 3.81 | 4.01 | 0.142 | 0.061 | 126 |
| Ref 134 | 3.76 | 4.09 | 0.140 | 0.060 | 168 |
| Ref 135 | 3.81 | 4.02 | 0.140 | 0.061 | 204 |

As shown in Table 9, the lifespan of the OLED in Comparative Examples 133 to 135 and Examples 25 to 27 using the host, the anthracene core of which is substituted with deuterium, is significantly increased.

On the other hand, in comparison to the OLED in Comparative Examples 133 to 135 using the host, the anthracene core and the substituent of which are substituted with deuterium, the lifespan of the OLED in Examples 25 to 27 using the host, only the anthracene core of which is substituted with deuterium, is little short. However, the OLED in Examples 25 to 27 provides sufficient lifespan with less deuterium atoms which is very expensive.

In addition, in comparison to the OLED in Comparative Examples 127 to 129, the lifespan of the OLED in Examples 25 to 27 using the electron blocking material of the heteroaryl-substituted amine derivative, i.e., the compound in Formula 5, is significantly increased.

Moreover, in comparison to the OLED in Example 25, the lifespan of the OLED in Examples 26 and 27 using the hole blocking material of the azine compound, i.e., the compound in Formula 7, or the benzimidazole derivative, i.e., the compound in Formula 9, is further increased.

19. COMPARATIVE EXAMPLES 136 TO 150 (REF136 TO REF150)

The compounds "Host2-1" in Formula 15, "Host2-2" in Formula 15, "Host2" in Formula 2, "Host2-3" in Formula 15 and "Host2-4" in Formula 15 are used instead of the compounds "Host1-1", "Host1-2", "Host1", "Host1-3" and "Host1-4" of Comparative Examples 61 to 75.

20. EXAMPLES 28 TO 30 (EX28 TO EX30)

The compound "Host2" in Formula 2 is used instead of the compound "Host1" of Examples 13 to 15.

The properties, i.e., voltage (V), efficiency (Cd/A), color coordinate (CIE) and lifespan (T95), of the OLEDs manufactured in Comparative Examples 136 to 150 and Examples 28 to 30 are measured and listed in Table 10.

TABLE 10

| | V | cd/A | CIE (x, y) | | T95 [hr] |
|---|---|---|---|---|---|
| Ref 136 | 3.81 | 4.00 | 0.141 | 0.059 | 135 |
| Ref 137 | 3.77 | 4.09 | 0.140 | 0.060 | 181 |
| Ref 138 | 3.80 | 4.02 | 0.141 | 0.060 | 203 |
| Ref 139 | 3.81 | 4.01 | 0.140 | 0.061 | 127 |
| Ref 140 | 3.77 | 4.12 | 0.141 | 0.059 | 174 |
| Ref 141 | 3.81 | 4.02 | 0.140 | 0.061 | 204 |
| Ref 142 | 3.83 | 1.96 | 0.142 | 0.060 | 68 |
| Ref 143 | 3.78 | 2.10 | 0.141 | 0.061 | 71 |
| Ref 144 | 3.82 | 1.98 | 0.140 | 0.059 | 87 |
| Ex 28 | 3.81 | 4.00 | 0.140 | 0.059 | 163 |
| Ex 29 | 3.76 | 4.12 | 0.141 | 0.061 | 249 |
| Ex 30 | 3.80 | 4.01 | 0.141 | 0.060 | 279 |
| Ref 145 | 3.82 | 4.02 | 0.142 | 0.061 | 132 |
| Ref 146 | 3.75 | 4.11 | 0.141 | 0.059 | 178 |
| Ref 147 | 3.80 | 4.03 | 0.141 | 0.060 | 206 |
| Ref 148 | 3.80 | 4.01 | 0.141 | 0.060 | 168 |
| Ref 149 | 3.74 | 4.12 | 0.141 | 0.060 | 283 |
| Ref 150 | 3.79 | 4.03 | 0.141 | 0.060 | 305 |

As shown in Table 10, the lifespan of the OLED in Comparative Examples 148 to 150 and Examples 28 to 30 using the host, the anthracene core of which is substituted with deuterium, is significantly increased.

On the other hand, in comparison to the OLED in Comparative Examples 148 to 150 using the host, the anthracene core and the substituent of which are substituted with deuterium, the lifespan of the OLED in Examples 28 to 30 using the host, only the anthracene core of which is substituted with deuterium, is little short. However, the OLED in Examples 28 to 30 provides sufficient lifespan with less deuterium atoms which is very expensive.

In addition, in comparison to the OLED in Comparative Examples 142 to 144, the lifespan of the OLED in Examples 28 to 30 using the electron blocking material of the heteroaryl-substituted amine derivative, i.e., the compound in Formula 5, is significantly increased.

Moreover, in comparison to the OLED in Example 28, the lifespan of the OLED in Examples 29 and 30 using the hole blocking material of the azine compound, i.e., the compound in Formula 7, or the benzimidazole derivative, i.e., the compound in Formula 9, is further increased.

Further, when the EML includes the fully-deuterated dopant, i.e., the compound "Dopant3-5", the lifespan of the OLED is significantly increased.

21. COMPARATIVE EXAMPLES 151 TO 153 (REF151 TO REF153)

NPB is used for the EBL. The compound "Dopant6-1" in Formula 4 is used as the dopant, and the compound "Host2" in Formula 2 is used to the host to form the EML. 2-phenyl-9,10-bis(2,2'-bipyridin-5-yl)anthracene, the compound "H1" in formula 8, the compound "H31" in Formula 10 are respectively used for the HBL.

22. EXAMPLES 31 TO 33 (EX31 TO EX33)

The compound "E2" in Formula 6 is used for the EBL. The compound "Dopant6-1" in Formula 4 is used as the dopant, and the compound "Host2" in Formula 2 is used to the host to form the EML. 2-phenyl-9,10-bis(2,2'-bipyridin-5-yl)anthracene, the compound "H1" in formula 8, the compound "H31" in Formula 10 are respectively used for the HBL.

The properties, i.e., voltage (V), efficiency (Cd/A), color coordinate (CIE) and lifespan (T95), of the OLEDs manufactured in Comparative Examples 151 to 153 and Examples 31 to 33 are measured and listed in Table 11.

TABLE 11

| | V | cd/A | CIE (x, y) | | T95 [hr] |
|---|---|---|---|---|---|
| Ref 151 | 3.85 | 1.97 | 0.140 | 0.062 | 47 |
| Ref 152 | 3.79 | 2.16 | 0.141 | 0.061 | 49 |
| Ref 153 | 3.82 | 1.98 | 0.140 | 0.059 | 57 |
| Ex 31 | 3.85 | 4.17 | 0.141 | 0.059 | 108 |
| Ex 32 | 3.80 | 4.20 | 0.141 | 0.059 | 139 |
| Ex 33 | 3.82 | 4.07 | 0.140 | 0.061 | 174 |

As shown in Table 11, in comparison to the OLED in Comparative Examples 151 to 153, the lifespan of the OLED in Examples 31 to 33 using the electron blocking material of the heteroaryl-substituted amine derivative, i.e., the compound in Formula 5, is significantly increased.

Moreover, in comparison to the OLED in Example 31, the lifespan of the OLED in Examples 32 and 33 using the hole blocking material of the azine compound, i.e., the compound in Formula 7, or the benzimidazole derivative, i.e., the compound in Formula 9, is further increased.

23. COMPARATIVE EXAMPLES 154 TO 156 (REF154 TO REF156)

The compound "Dopant6-2" in Formula 4 is used instead of the compound "Dopant6-1" in Formula 4 of Comparative Examples 151 to 153.

24. EXAMPLES 34 TO 36 (EX34 TO EX36)

The compound "Dopant6-2" in Formula 4 is used instead of the compound "Dopant6-1" in Formula 4 of Examples 31 to 33.

The properties, i.e., voltage (V), efficiency (Cd/A), color coordinate (CIE) and lifespan (T95), of the OLEDs manufactured in Comparative Examples 154 to 156 and Examples 34 to 36 are measured and listed in Table 12.

TABLE 12

| | V | cd/A | CIE (x, y) | | T95 [hr] |
|---|---|---|---|---|---|
| Ref 154 | 3.84 | 2.01 | 0.142 | 0.062 | 41 |
| Ref 155 | 3.80 | 2.08 | 0.140 | 0.061 | 42 |
| Ref 156 | 3.85 | 2.04 | 0.140 | 0.059 | 49 |
| Ex 34 | 3.84 | 4.09 | 0.141 | 0.060 | 103 |
| Ex 35 | 3.77 | 4.13 | 0.140 | 0.059 | 140 |
| Ex 36 | 3.84 | 4.09 | 0.140 | 0.061 | 173 |

As shown in Table 12, in comparison to the OLED in Comparative Examples 154 to 156, the lifespan of the OLED in Examples 34 to 36 using the electron blocking material of the heteroaryl-substituted amine derivative, i.e., the compound in Formula 5, is significantly increased.

Moreover, in comparison to the OLED in Example 34, the lifespan of the OLED in Examples 35 and 36 using the hole blocking material of the azine compound, i.e., the compound in Formula 7, or the benzimidazole derivative, i.e., the compound in Formula 9, is further increased.

25. COMPARATIVE EXAMPLES 157 TO 159 (REF157 TO REF159)

The compound "Dopant6-3" in Formula 4 is used instead of the compound "Dopant6-1" in Formula 4 of Comparative Examples 151 to 153.

26. EXAMPLES 37 TO 39 (EX37 TO EX39)

The compound "Dopant6-3" in Formula 4 is used instead of the compound "Dopant6-1" in Formula 4 of Examples 31 to 33.

The properties, i.e., voltage (V), efficiency (Cd/A), color coordinate (CIE) and lifespan (T95), of the OLEDs manufactured in Comparative Examples 157 to 159 and Examples 37 to 39 are measured and listed in Table 13.

TABLE 13

| | V | cd/A | CIE (x, y) | | T95 [hr] |
|---|---|---|---|---|---|
| Ref 157 | 3.85 | 1.98 | 0.141 | 0.059 | 39 |
| Ref 158 | 3.80 | 2.13 | 0.140 | 0.061 | 41 |
| Ref 159 | 3.82 | 1.97 | 0.141 | 0.062 | 52 |
| Ex 37 | 3.85 | 4.09 | 0.142 | 0.059 | 92 |
| Ex 38 | 3.78 | 4.16 | 0.140 | 0.062 | 153 |
| Ex 39 | 3.82 | 4.09 | 0.141 | 0.060 | 173 |

As shown in Table 13, in comparison to the OLED in Comparative Examples 157 to 159, the lifespan of the OLED in Examples 37 to 39 using the electron blocking material of the heteroaryl-substituted amine derivative, i.e., the compound in Formula 5, is significantly increased.

Moreover, in comparison to the OLED in Example 37, the lifespan of the OLED in Examples 38 and 39 using the hole blocking material of the azine compound, i.e., the compound in Formula 7, or the benzimidazole derivative, i.e., the compound in Formula 9, is further increased.

27. COMPARATIVE EXAMPLES 160 TO 162 (REF160 TO REF162)

The compound "Dopant6-4" in Formula 4 is used instead of the compound "Dopant6-1" in Formula 4 of Comparative Examples 151 to 153.

28. EXAMPLES 40 TO 42 (EX40 TO EX42)

The compound "Dopant6-4" in Formula 4 is used instead of the compound "Dopant6-1" in Formula 4 of Examples 31 to 33.

The properties, i.e., voltage (V), efficiency (Cd/A), color coordinate (CIE) and lifespan (T95), of the OLEDs manufactured in Comparative Examples 160 to 162 and Examples 40 to 42 are measured and listed in Table 14.

TABLE 14

| | V | cd/A | CIE (x, y) | | T95 [hr] |
|---|---|---|---|---|---|
| Ref 160 | 3.83 | 1.97 | 0.142 | 0.060 | 41 |
| Ref 161 | 3.77 | 2.09 | 0.141 | 0.061 | 43 |
| Ref 162 | 3.82 | 1.98 | 0.140 | 0.059 | 52 |
| Ex 40 | 3.81 | 4.02 | 0.140 | 0.059 | 89 |
| Ex 41 | 3.74 | 4.16 | 0.141 | 0.061 | 140 |
| Ex 42 | 3.81 | 4.12 | 0.141 | 0.060 | 174 |

As shown in Table 14, in comparison to the OLED in Comparative Examples 160 to 162, the lifespan of the OLED in Examples 40 to 42 using the electron blocking material of the heteroaryl-substituted amine derivative, i.e., the compound in Formula 5, is significantly increased.

Moreover, in comparison to the OLED in Example 40, the lifespan of the OLED in Examples 41 and 42 using the hole blocking material of the azine compound, i.e., the compound in Formula 7, or the benzimidazole derivative, i.e., the compound in Formula 9, is further increased.

29. COMPARATIVE EXAMPLES 163 TO 165 (REF163 TO REF165)

The compound "Dopant6-5" in Formula 4 is used instead of the compound "Dopant6-1" in Formula 4 of Comparative Examples 151 to 153.

30. EXAMPLES 43 TO 45 (EX43 TO EX45)

The compound "Dopant6-5" in Formula 4 is used instead of the compound "Dopant6-1" in Formula 4 of Examples 31 to 33.

The properties, i.e., voltage (V), efficiency (Cd/A), color coordinate (CIE) and lifespan (T95), of the OLEDs manufactured in Comparative Examples 163 to 165 and Examples 43 to 45 are measured and listed in Table 15.

TABLE 15

| | V | cd/A | CIE (x, y) | | T95 [hr] |
|---|---|---|---|---|---|
| Ref 163 | 3.85 | 1.98 | 0.141 | 0.060 | 64 |
| Ref 164 | 3.81 | 2.14 | 0.141 | 0.059 | 67 |
| Ref 165 | 3.83 | 2.00 | 0.140 | 0.060 | 83 |
| Ex 43 | 3.82 | 4.08 | 0.141 | 0.059 | 151 |
| Ex 44 | 3.78 | 4.24 | 0.140 | 0.060 | 231 |
| Ex 45 | 3.81 | 4.05 | 0.141 | 0.060 | 265 |

As shown in Table 15, in comparison to the OLED in Comparative Examples 163 to 165, the lifespan of the OLED in Examples 43 to 45 using the electron blocking material of the heteroaryl-substituted amine derivative, i.e., the compound in Formula 5, is significantly increased.

Moreover, in comparison to the OLED in Example 43, the lifespan of the OLED in Examples 44 and 45 using the hole blocking material of the azine compound, i.e., the compound in Formula 7, or the benzimidazole derivative, i.e., the compound in Formula 9, is further increased.

Further, when the EML includes the fully-deuterated dopant, i.e., the compound "Dopant6-5", the lifespan of the OLED is significantly increased.

31. EXAMPLES (1) Examples 46 to 48 (Ex46 to Ex48)

The compound "E3" in Formula 6 is used for the EBL. The compound "Dopant3-1" in Formula 4 is used as the dopant, and the compound "Host2" in Formula 2 is used to the host to form the EML. 2-phenyl-9,10-bis(2,2'-bipyridin-5-yl)anthracene, the compound "H1" in formula 8, the compound "H31" in Formula 10 are respectively used for the HBL.

(2) Examples 49 to 51 (Ex49 to Ex51)

The compound "Dopant3-2" in Formula 4 is used instead of the compound "Dopant3-1" in Formula 4 of Examples 46 to 48.

(3) Examples 52 to 54 (Ex52 to Ex54)

The compound "Dopant3-3" in Formula 4 is used instead of the compound "Dopant3-1" in Formula 4 of Examples 46 to 48.

(4) Examples 55 to 57 (Ex55 to Ex57)

The compound "Dopant3-4" in Formula 4 is used instead of the compound "Dopant3-1" in Formula 4 of Examples 46 to 48.

(5) Examples 58 to 60 (Ex58 to Ex60)

The compound "Dopant3-5" in Formula 4 is used instead of the compound "Dopant3-1" in Formula 4 of Examples 46 to 48.

The properties, i.e., voltage (V), efficiency (Cd/A), color coordinate (CIE) and lifespan (T95), of the OLEDs manufactured in Examples 46 to 60 are measured and listed in Table 16.

TABLE 16

| | V | cd/A | CIE (x, y) | | T95 [hr] |
|---|---|---|---|---|---|
| Ex 46 | 3.84 | 4.25 | 0.141 | 0.059 | 110 |
| Ex 47 | 3.79 | 4.53 | 0.141 | 0.059 | 147 |
| Ex 48 | 3.83 | 4.35 | 0.140 | 0.061 | 179 |
| Ex 49 | 3.84 | 4.26 | 0.142 | 0.059 | 76 |
| Ex 50 | 3.78 | 4.45 | 0.140 | 0.062 | 110 |
| Ex 51 | 3.82 | 4.28 | 0.141 | 0.060 | 131 |
| Ex 52 | 3.84 | 4.21 | 0.140 | 0.060 | 97 |
| Ex 53 | 3.77 | 4.49 | 0.141 | 0.061 | 158 |
| Ex 54 | 3.84 | 4.37 | 0.141 | 0.060 | 178 |
| Ex 55 | 3.80 | 4.18 | 0.141 | 0.059 | 92 |
| Ex 56 | 3.74 | 4.53 | 0.140 | 0.060 | 144 |
| Ex 57 | 3.81 | 4.32 | 0.141 | 0.060 | 180 |
| Ex 58 | 3.83 | 4.24 | 0.141 | 0.059 | 161 |
| Ex 59 | 3.78 | 4.53 | 0.141 | 0.059 | 244 |
| Ex 60 | 3.82 | 4.37 | 0.140 | 0.061 | 270 |

As shown in Table 16, the lifespan of the OLED in Examples 46 to 60 using the host, the anthracene core of which is substituted with deuterium, is significantly increased.

In addition, in comparison to the OLED in Examples 46, 49, 52, 55 and 58, the lifespan of the OLED in Examples 47, 48, 50, 51, 53, 54, 56, 57, 59 and 60 using the hole blocking material of the azine compound, i.e., the compound in Formula 7, or the benzimidazole derivative, i.e., the compound in Formula 9, is further increased.

Figure 4:
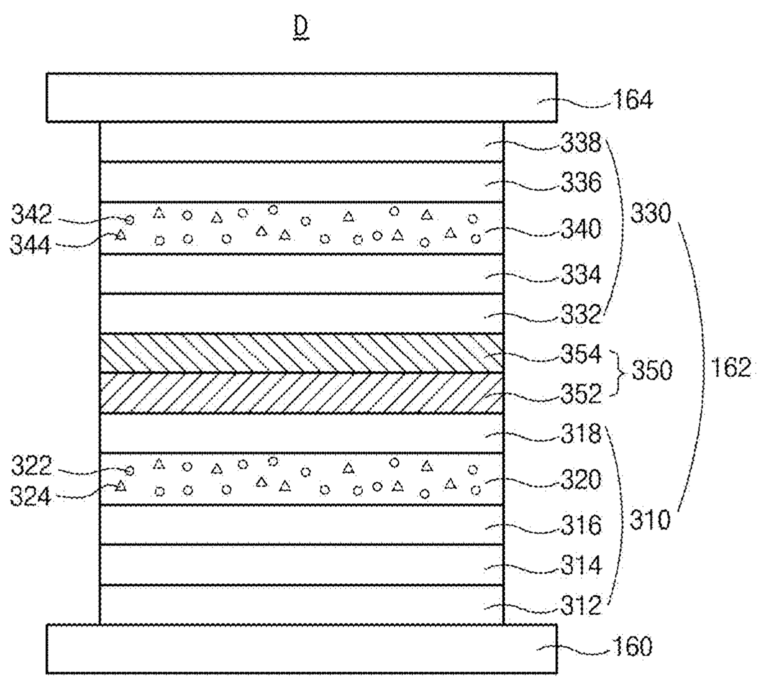
FIG. 4 is a schematic cross-sectional view illustrating an OLED having a tandem structure of two emitting parts according to the first embodiment of the present disclosure.

FIG. 4 is a schematic cross-sectional view illustrating an OLED having a tandem structure of two emitting parts according to the first embodiment of the present disclosure.

As shown in FIG. 4, the OLED D includes the first and second electrodes 160 and 164 facing each other and the organic emitting layer 162 between the first and second electrodes 160 and 164. The organic emitting layer 162 includes a first emitting part 310 including a first EML 320, a second emitting part 330 including a second EML 340 and a charge generation layer (CGL) 350 between the first and second emitting parts 310 and 330.

The first electrode 160 may be formed of a conductive material having a relatively high work function to serve as an anode for injecting a hole into the organic emitting layer 162. The second electrode 164 may be formed of a conductive material having a relatively low work function to serve as a cathode for injecting an electron into the organic emitting layer 162.

The CGL 350 is positioned between the first and second emitting parts 310 and 330, and the first emitting part 310, the CGL 350 and the second emitting part 330 are sequentially stacked on the first electrode 160. Namely, the first emitting part 310 is positioned between the first electrode 160 and the CGL 350, and the second emitting part 320 is positioned between the second electrode 164 and the CGL 350.

The first emitting part 310 includes a first EML 320. In addition, the first emitting part 310 may further include a first EBL 316 between the first electrode 160 and the first EML 320 and a first HBL 318 between the first EML 320 and the CGL 350.

In addition, the first emitting part 310 may further include a first HTL 314 between the first electrode 160 and the first EBL 316 and an HIL 312 between the first electrode 160 and the first HTL 314.

The first EML 320 includes a host 322 of the anthracene derivative and the dopant 324 of the boron derivative, and the anthracene core of the anthracene derivative is deuterated. The first EML 320 emits blue light.

For example, in the first EML 320, the anthracene core of the host 322 is deuterated, and the dopant 324 may not be deuterated or may be partially or entirely deuterated.

In the first EML 320, the host 322 may have a weight % of about 70 to 99.9, and the dopant 324 may have a weight % of about 0.1 to 30. To provide sufficient emitting efficiency, the dopant 324 may have a weight % of about 0.1 to 10, preferably about 1 to 5.

The second emitting part 330 includes the second EML 340. In addition, the second emitting part 330 may further include a second EBL 334 between the CGL 350 and the second EML 340 and a second HBL 336 between the second EML 340 and the second electrode 164.

In addition, the second emitting part 330 may further include a second HTL 332 between the CGL 350 and the second EBL 334 and an EIL 338 between the second HBL 336 and the second electrode 164.

The second EML 340 includes a host 342 of the anthracene derivative and a dopant 344 of the boron derivative, and the anthracene core of the anthracene derivative is deuterated. The second EML 340 emits blue light.

For example, in the second EML 340, the anthracene core of the host 342 is deuterated, and the dopant 344 may not be deuterated or may be partially or entirely deuterated.

In the second EML 340, the host 342 may have a weight % of about 70 to 99.9, and the dopant 344 may have a weight % of about 0.1 to 30. To provide sufficient emitting efficiency, the dopant 344 may have a weight % of about 0.1 to 10, preferably about 1 to 5.

The host 342 of the second EML 340 may be same as or different from the host 322 of the first EML 320, and the dopant 344 of the second EML 340 may be same as or different from the dopant 324 of the first EML 320.

The HIL 312 includes a hole injection material. For example, the hole injection material may include at least one of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino) triphenylamine (1T-NATA), 4,4',4"-tris(N-(naphthalene-2- yl)-N-phenyl-amino)triphenylamine (2T-NATA), copper phthalocyanine (CuPc), tris(4-carbazoyl-9-yl-phenyl)amine (TCTA), N,N'-Diphenyl-N,N'-bis(1-naphthyl)-1,1'-biphenyl-4,4''-diamine (NPB or NPD), 1,4,5,8,9,11-hexaazatriphenylenehexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, and the compound of Formula 12.

Each of the first and second HTLs 314 and 332 includes a hole transporting material. For example, the hole transporting material may include at least one of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine](Poly-TPD), poly[(9,9-dioctylfluorenyl-2,7-diyl)-co-(4,4'-(N-(4-sec-butylphenyl)diphenylamine))](TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-biphenyl]-4-yl)-9,9-dimethyl-N-(4-(9-phenyl-9H-carbazol-3-yl)phenyl)-9H-fluoren-2-amine, N4,N4,N4',N4'-tetra([1,1'-biphenyl]-4-yl)-[1,1'-biphenyl]-4,4'-diamine, and the compound of Formula 11.

Each of the first and second EBLs 316 and 334 includes an electron blocking material in Formula 5. For example, each of the first and second EBLs 316 and 334 may include one of the electron blocking materials in Formula 6.

Each of the first and second HBLs 318 and 336 includes at least one of a hole blocking material in Formula 7 and a hole blocking material in Formula 9. For example, each of the first and second HBLs 318 and 336 may include at least one of one of the hole blocking materials in Formula 8 and one of the hole blocking materials in Formula 10.

The EIL 338 may include alkali metal halides or alkaline earth metal halides such as LiF, CsF, NaF, and BaF2 and/or organometallic materials such as lithium quinolate (Liq), lithium benzoate, and sodium stearate.

The CGL 350 is positioned between the first and second emitting parts 310 and 330. Namely, the first and second emitting parts 310 and 330 are connected through the CGL 350. The CGL 350 may be a P-N junction CGL of an N-type CGL 352 and a P-type CGL 354.

The N-type CGL 352 is positioned between the first HBL 318 and the second HTL 332, and the P-type CGL 354 is positioned between the N-type CGL 352 and the second HTL 332.

The N-type CGL 352 may be an organic layer doped with alkali metal, e.g., Li, Na, K and Cs, or alkali earth metal, e.g., Mg, Sr, Ba and Ra. For example, a host organic material for the N-type CGL 352 may be one of 4,7-diphenyl-1,10-phenanthroline (Bphen) and MTDATA, and the alkali metal or the alkali earth metal as the dopant may be doped by about 0.01 to 30 wt %.

The P-type CGL 354 may include an inorganic material selected from the group consisting of tungsten oxide (WOx), molybdenum oxide (MoOx), beryllium oxide (Be2O3) and vanadium oxide (V2O5), an organic material selected from the group consisting of NPD, HAT-CN, F4TCNQ, TPD, N,N,N',N'-tetra-naphtalenyl-benzidine (TNB), TCTA, and N,N'-dioctyl-3,4,9,10-perylenedicarboximide (PTCDI-C8), or their combination.

In the OLED D, each of the first and second EMLs 320 and 340 includes the host 322 and 342, each of which is the anthracene derivative, and the dopant 324 and 344, each of which is the boron derivative, and the anthracene core of the anthracene derivative is deuterated. As a result, the OLED D and the organic light emitting display device 100 have advantages in the emitting efficiency, the lifespan and the production cost.

In addition, since the first and second emitting parts 310 and 330 for emitting blue light are stacked, the organic light emitting display device 100 provides an image having high color temperature.

Figure 5:
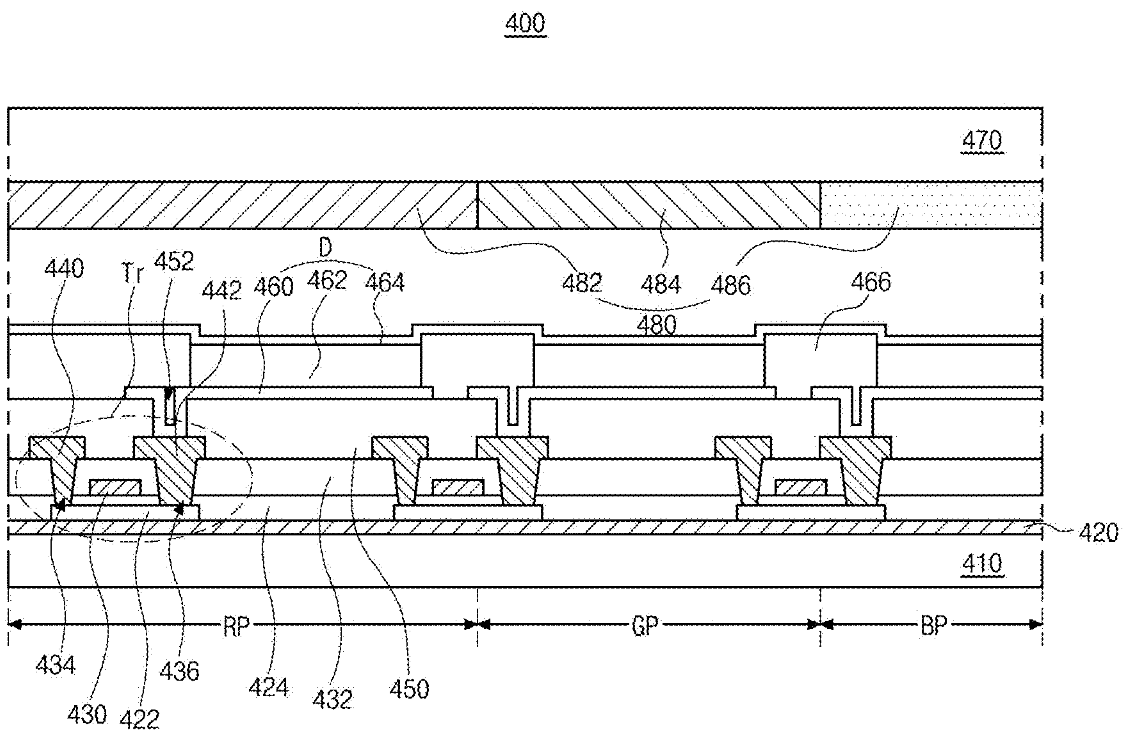
FIG. 5 is a schematic cross-sectional view illustrating an organic light emitting display device according to a second embodiment of the present disclosure.
Figure 6:
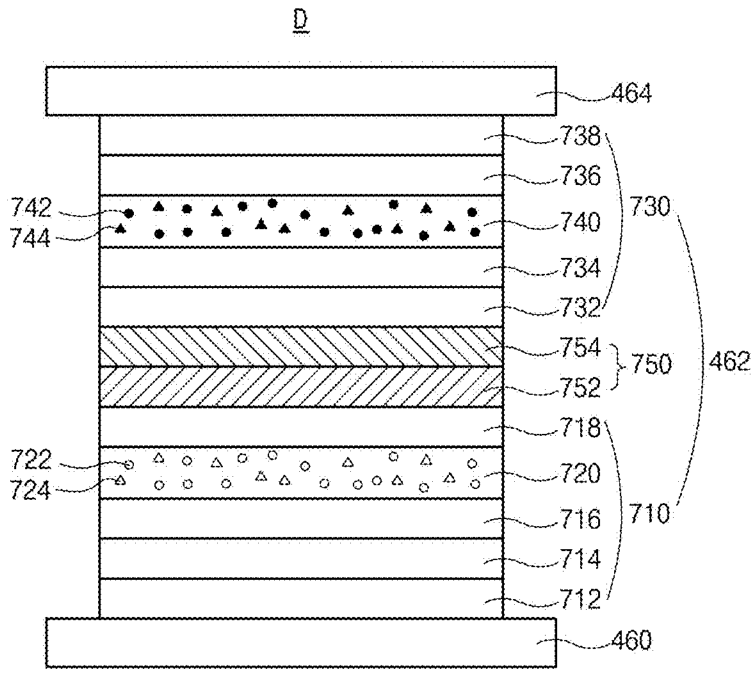
FIG. 6 is a schematic cross-sectional view illustrating an OLED having a tandem structure of two emitting parts according to the second embodiment of the present disclosure.
Figure 7:
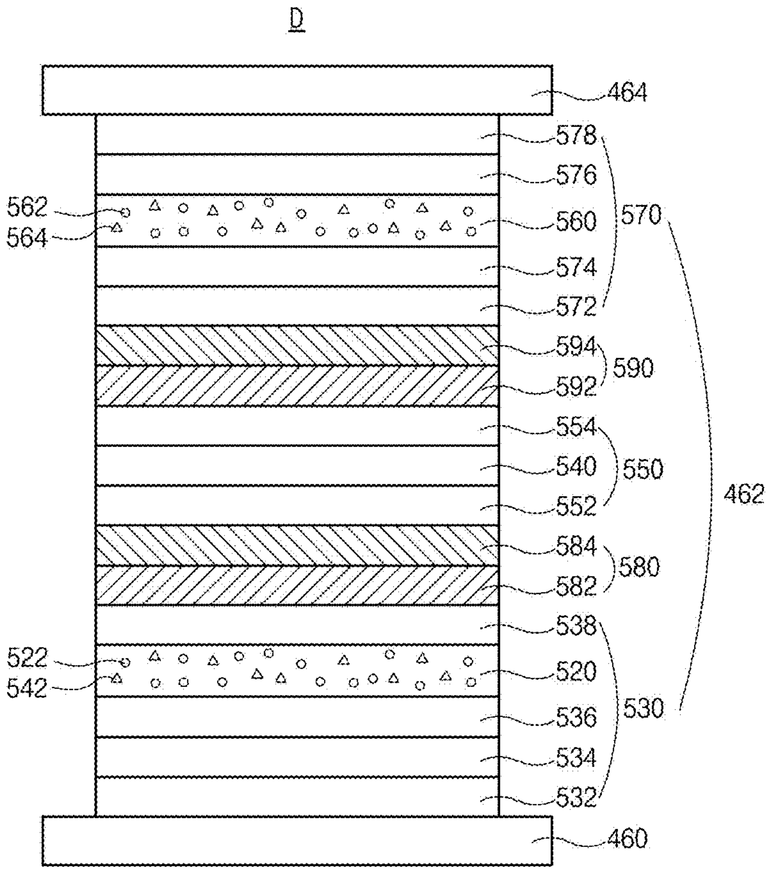
FIG. 7 is a schematic cross-sectional view illustrating an OLED having a tandem structure of three emitting parts according to the second embodiment of the present disclosure.

FIG. 5 is a schematic cross-sectional view illustrating an organic light emitting display device according to a second embodiment of the present disclosure, and FIG. 6 is a schematic cross-sectional view illustrating an OLED having a tandem structure of two emitting parts according to the second embodiment of the present disclosure. FIG. 7 is a schematic cross-sectional view illustrating an OLED having a tandem structure of three emitting parts according to the second embodiment of the present disclosure.

As shown in FIG. 5, the organic light emitting display device 400 includes a first substrate 410, where a red pixel RP, a green pixel GP and a blue pixel BP are defined, a second substrate 470 facing the first substrate 410, an OLED D, which is positioned between the first and second substrates 410 and 470 and providing white emission, and a color filter layer 480 between the OLED D and the second substrate 470.

Each of the first and second substrates 410 and 470 may be a glass substrate or a plastic substrate. For example, each of the first and second substrates 410 and 470 may be a polyimide substrate.

A buffer layer 420 is formed on the first substrate, and the TFT Tr corresponding to each of the red, green and blue pixels RP, GP and BP is formed on the buffer layer 420. The buffer layer 420 may be omitted.

A semiconductor layer 422 is formed on the buffer layer 420. The semiconductor layer 422 may include an oxide semiconductor material or polycrystalline silicon.

A gate insulating layer 424 is formed on the semiconductor layer 422. The gate insulating layer 424 may be formed of an inorganic insulating material such as silicon oxide or silicon nitride.

A gate electrode 430, which is formed of a conductive material, e.g., metal, is formed on the gate insulating layer 424 to correspond to a center of the semiconductor layer 422.

An interlayer insulating layer 432, which is formed of an insulating material, is formed on the gate electrode 430. The interlayer insulating layer 432 may be formed of an inorganic insulating material, e.g., silicon oxide or silicon nitride, or an organic insulating material, e.g., benzocyclobutene or photo-acryl.

The interlayer insulating layer 432 includes first and second contact holes 434 and 436 exposing both sides of the semiconductor layer 422. The first and second contact holes 434 and 436 are positioned at both sides of the gate electrode 430 to be spaced apart from the gate electrode 430.

A source electrode 440 and a drain electrode 442, which are formed of a conductive material, e.g., metal, are formed on the interlayer insulating layer 432.

The source electrode 440 and the drain electrode 442 are spaced apart from each other with respect to the gate electrode 430 and respectively contact both sides of the semiconductor layer 422 through the first and second contact holes 434 and 436.

The semiconductor layer 422, the gate electrode 430, the source electrode 440 and the drain electrode 442 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 450, which includes a drain contact hole 452 exposing the drain electrode 442 of the TFT Tr, is formed to cover the TFT Tr.

A first electrode 460, which is connected to the drain electrode 442 of the TFT Tr through the drain contact hole 452, is separately formed in each pixel. The first electrode 160 may be an anode and may be formed of a conductive material having a relatively high work function. For example, the first electrode 460 may be formed of a transparent conductive material such as indium-tin-oxide (ITO) or indium-zinc-oxide (IZO).

A reflection electrode or a reflection layer may be formed under the first electrode 460. For example, the reflection electrode or the reflection layer may be formed of aluminum-palladium-copper (APC) alloy.

A bank layer 466 is formed on the passivation layer 450 to cover an edge of the first electrode 460. Namely, the bank layer 466 is positioned at a boundary of the pixel and exposes a center of the first electrode 460 in the red, green and blue pixels RP, GP and BP. The bank layer 466 may be omitted.

An organic emitting layer 462 is formed on the first electrode 460.

Referring to FIG. 6, the OLED D includes the first and second electrodes 460 and 464 facing each other and the organic emitting layer 462 between the first and second electrodes 460 and 464. The organic emitting layer 462 includes a first emitting part 710 including a first EML 720, a second emitting part 730 including a second EML 740 and a charge generation layer (CGL) 750 between the first and second emitting parts 710 and 730.

The first electrode 460 may be formed of a conductive material having a relatively high work function to serve as an anode for injecting a hole into the organic emitting layer 462. The second electrode 464 may be formed of a conductive material having a relatively low work function to serve as a cathode for injecting an electron into the organic emitting layer 462.

The CGL 750 is positioned between the first and second emitting parts 710 and 730, and the first emitting part 710, the CGL 750 and the second emitting part 730 are sequentially stacked on the first electrode 460. Namely, the first emitting part 710 is positioned between the first electrode 460 and the CGL 750, and the second emitting part 730 is positioned between the second electrode 464 and the CGL 750.

The first emitting part 710 includes a first EML 720. In addition, the first emitting part 710 may further include a first EBL 716 between the first electrode 460 and the first EML 720 and a first HBL 718 between the first EML 720 and the CGL 750.

In addition, the first emitting part 710 may further include a first HTL 714 between the first electrode 460 and the first EBL 716 and an HIL 712 between the first electrode 460 and the first HTL 714.

The first EML 720 includes a host 722 of the anthracene derivative and the dopant 724 of the boron derivative, and the anthracene core of the anthracene derivative is deuterated. The first EML 720 emits blue light.

For example, in the first EML 720, the anthracene core of the host 722 is deuterated, and the dopant 724 may not be deuterated or may be partially or entirely deuterated.

In the first EML 720, the host 722 may have a weight % of about 70 to 99.9, and the dopant 724 may have a weight % of about 0.1 to 30. To provide sufficient emitting efficiency, the dopant 724 may have a weight % of about 0.1 to 10, preferably about 1 to 5.

The second emitting part 730 includes the second EML 740. In addition, the second emitting part 730 may further include a second EBL 734 between the CGL 750 and the second EML 740 and a second HBL 736 between the second EML 740 and the second electrode 464.

In addition, the second emitting part 730 may further include a second HTL 732 between the CGL 750 and the second EBL 734 and an EIL 738 between the second HBL 736 and the second electrode 464.

The second EML 740 may be a yellow-green EML. For example, the second EML 740 may include a host 742 and a yellow-green dopant 744. The yellow-green dopant 744 may be one of a fluorescent compound, a phosphorescent compound and a delayed fluorescent compound.

In the second EML 740, the host 742 may have a weight % of about 70 to 99.9, and the yellow-green dopant 744 may have a weight % of about 0.1 to 30. To provide sufficient emitting efficiency, the yellow-green dopant 744 may have a weight % of about 0.1 to 10, preferably about 1 to 5.

The HIL 712 includes a hole injection material. For example, the hole injection material may include at least one of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino) triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-Diphenyl-N,N'-bis(1-naphthyl)-1,1'-biphenyl-4,4"-diamine (NPB orNPD), 1,4,5,8,9,11-hexaazatriphenylenehexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, and the compound of Formula 12.

Each of the first and second HTLs 714 and 732 includes a hole transporting material. For example, the hole transporting material may include at least one of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine](Poly-TPD), poly[(9,9-dioctylfluorenyl-2,7-diyl)-co-(4,4'-(N-(4-sec-butylphenyl)diphenylamine))](TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-biphenyl]-4-yl)-9,9-dimethyl-N-(4-(9-phenyl-9H-carbazol-3-yl)phenyl)-9H-fluoren-2-amine, N4,N4,N4',N4'- tetra([1,1'-biphenyl]-4-yl)-[1,1'-biphenyl]-4,4'-diamine, and the compound of Formula 11.

Each of the first and second EBLs 716 and 734 includes an electron blocking material in Formula 5. For example, each of the first and second EBLs 716 and 734 may include one of the electron blocking materials in Formula 6.

Each of the first and second HBLs 718 and 736 includes at least one of a hole blocking material in Formula 7 and a hole blocking material in Formula 9. For example, each of the first and second HBLs 718 and 736 may include at least one of one of the hole blocking materials in Formula 8 and one of the hole blocking materials in Formula 10.

The EIL 738 may include alkali metal halides or alkaline earth metal halides such as LiF, CsF, NaF, and BaF2 and/or organometallic materials such as lithium quinolate (Liq), lithium benzoate, and sodium stearate.

The CGL 750 is positioned between the first and second emitting parts 710 and 730. Namely, the first and second emitting parts 710 and 730 are connected through the CGL 750. The CGL 750 may be a P-N junction CGL of an N-type CGL 752 and a P-type CGL 754.

The N-type CGL 752 is positioned between the first HBL 718 and the second HTL 732, and the P-type CGL 754 is positioned between the N-type CGL 752 and the second HTL 732.

The N-type CGL 752 may be an organic layer doped with alkali metal, e.g., Li, Na, K and Cs, or alkali earth metal, e.g., Mg, Sr, Ba and Ra. For example, a host organic material for the N-type CGL 752 may be one of 4,7-dipheny-1,10-phenanthroline (Bphen) and MTDATA, and the alkali metal or the alkali earth metal as the dopant may be doped by about 0.01 to 30 wt %.

The P-type CGL 754 may include an inorganic material selected from the group consisting of tungsten oxide (WOx), molybdenum oxide (MoOx), beryllium oxide (Be2O3) and vanadium oxide (V2O5), an organic material selected from the group consisting of NPD, HAT-CN, F4TCNQ, TPD, N,N,N',N'-tetra-naphtalenyl-benzidine (TNB), TCTA, and N,N'-dioctyl-3,4,9,10-perylenedicarboximide (PTCDI-C8), or their combination.

In FIG. 6, the first EML 720, which is positioned between the first electrode 460 and the CGL 750, includes the host 722 of the anthracene derivative and the dopant 724 of the boron derivative, and the second EML 740, which is positioned between the second electrode 464 and the CGL 750, is the yellow-green EML. Alternatively, the first EML 720, which is positioned between the first electrode 460 and the CGL 750, may be the yellow-green EML, and the second EML 740, which is positioned between the second electrode 464 and the CGL 750, may include the host of the anthracene derivative and the dopant of the boron derivative to be a blue EML.

In the OLED D, the first EML 720 includes the host 722, which is the anthracene derivative, and the dopant 724, which is the boron derivative, and the anthracene core of the anthracene derivative is deuterated. As a result, the OLED D and the organic light emitting display device 400 have advantages in the emitting efficiency, the lifespan and the production cost.

The OLED D including the first emitting part 710 and the second emitting part 730, which provides a yellow-green emission, emits a white light.

Referring to FIG. 7, the organic emitting layer 462 includes a first emitting part 530 including a first EML 520, a second emitting part 550 including a second EML 540, a third emitting part 570 including a third EML 560, a first CGL 580 between the first and second emitting parts 530 and 550 and a second CGL 590 between the second and third emitting parts 550 and 570.

The first electrode 460 may be formed of a conductive material having a relatively high work function to serve as an anode for injecting a hole into the organic emitting layer 462. The second electrode 464 may be formed of a conductive material having a relatively low work function to serve as a cathode for injecting an electron into the organic emitting layer 462.

The first CGL 580 is positioned between the first and second emitting parts 530 and 550, and the second CGL 590 is positioned between the second and third emitting parts 550 and 570. Namely, the first emitting part 530, the first CGL 580, the second emitting part 550, the second CGL 590 and the third emitting part 570 are sequentially stacked on the first electrode 460. In other words, the first emitting part 530 is positioned between the first electrode 460 and the first CGL 580, the second emitting part 550 is positioned between the first and second CGLs 580 and 590, and the third emitting part 570 is positioned between the second electrode 464 and the second CGL 590.

The first emitting part 530 may include an HIL 532, a first HTL 534, a first EBL 536, the first EML 520 and a first HBL 538 sequentially stacked on the first electrode 460. Namely, the HIL 532, the first HTL 534 and the first EBL 536 are positioned between the first electrode 460 and the first EML 520, and the first HBL 538 is positioned between the first EML 520 and the first CGL 580.

The first EML 520 includes a host 522 of the anthracene derivative and the dopant 524 of the boron derivative, and the anthracene core of the anthracene derivative is deuterated. The first EML 520 emits blue light.

For example, in the first EML 520, the anthracene core of the host 522 is deuterated, and the dopant 524 may not be deuterated or may be partially or entirely deuterated.

In the first EML 520, the host 522 may have a weight % of about 70 to 99.9, and the dopant 524 may have a weight % of about 0.1 to 30. To provide sufficient emitting efficiency, the dopant 524 may have a weight % of about 0.1 to 10, preferably about 1 to 5.

The second emitting part 550 may include a second HTL 552, the second EML 540 and an electron transporting layer (ETL) 554. The second HTL 552 is positioned between the first CGL 580 and the second EML 540, and the ETL 554 is positioned between the second EML 540 and the second CGL 590.

The second EML 540 may be a yellow-green EML. For example, the second EML 540 may include a host and a yellow-green dopant. Alternatively, the second EML 540 may include a host, a red dopant and a green dopant. In this instance, the second EML 540 may include a lower layer including the host and the red dopant (or the green dopant) and an upper layer including the host and the green dopant (or the red dopant).

The second EML 540 may have a double-layered structure of a first layer, which includes a host and a red dopant, and a second layer, which includes a host and a yellow-green dopant, or a triple-layered structure of a first layer, which includes a host and a red dopant, a second layer, which includes a host and a yellow-green dopant, and a third layer, which includes a host and a green dopant.

The third emitting part 570 may include a third HTL 572, a second EBL 574, the third EML 560, a second HBL 576 and an EIL 578.

The third EML 560 includes a host 562 of the anthracene derivative and the dopant 564 of the boron derivative, and the anthracene core of the anthracene derivative is deuterated. The third EML 560 emits blue light.

For example, in the third EML 560, the anthracene core of the host 562 is deuterated, and the dopant 564 may not be deuterated or may be partially or entirely deuterated.

In the third EML 560, the host 562 may have a weight % of about 70 to 99.9, and the dopant 564 may have a weight % of about 0.1 to 30. To provide sufficient emitting efficiency, the dopant 564 may have a weight % of about 0.1 to 10, preferably about 1 to 5.

The host 562 of the third EML 560 may be same as or different from the host 522 of the first EML 520, and the dopant 564 of the third EML 560 may be same as or different from the dopant 524 of the first EML 520.

The HIL 532 includes a hole injection material. For example, the hole injection material may include at least one of 4,4',4"-tris(3-methylphenylamino)triphenylamine (MT-DATA), 4,4',4"-tris(N,N-diphenyl-amino)triphenylamine (NATA), 4,4',4"-tris(N-(naphthalene-1-yl)-N-phenyl-amino) triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-Diphenyl-N,N'-bis(1-naphthyl)-1,1'-biphenyl-4,4"-diamine (NPB or NPD), 1,4,5,8,9,11-hexaazatriphenylenehexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, and the compound of Formula 12.

Each of the first to third HTLs 534, 552 and 572 includes a hole transporting material. For example, the hole transporting material may include at least one of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine](Poly-TPD), poly[(9,9-dioctylfluorenyl-2,7-diyl)-co-(4,4'-(N-(4-sec-butylphenyl)diphenylamine))](TFB), di-[4-(N,N-di-p-tolyl-amino)-phenyl]cyclohexane (TAPC), 3,5-di (9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-biphenyl]-4-yl)-9,9-dimethyl-N-(4-(9-phenyl-9H-carbazol-3-yl)phenyl)-9H-fluoren-2-amine, N4,N4,N4',N4'-tetra([1,1'-biphenyl]-4-yl)-[1,1'-biphenyl]-4,4'-diamine, and the compound of Formula 11.

Each of the first and second EBLs 536 and 574 includes an electron blocking material in Formula 5. For example, each of the first and second EBLs 536 and 574 may include one of the electron blocking materials in Formula 6.

Each of the first and second HBLs 538 and 576 includes at least one of a hole blocking material in Formula 7 and a hole blocking material in Formula 9. For example, each of the first and second HBLs 538 and 576 may include at least one of one of the hole blocking materials in Formula 8 and one of the hole blocking materials in Formula 10.

The EIL 578 may include alkali metal halides or alkaline earth metal halides such as LiF, CsF, NaF, and BaF2 and/or organometallic materials such as lithium quinolate (Liq), lithium benzoate, and sodium stearate.

The first CGL 580 is positioned between the first emitting part 530 and the second emitting part 550, and the second CGL 590 is positioned between the second emitting part 550 and the third emitting part 570. Namely, the first and second emitting parts 530 and 550 are connected through the first CGL 580, and the second and third emitting parts 550 and 570 are connected through the second CGL 590. The first CGL 580 may be a P-N junction CGL of a first N-type CGL 582 and a first P-type CGL 584, and the second CGL 590 may be a P-N junction CGL of a second N-type CGL 592 and a second P-type CGL 594.

In the first CGL 580, the first N-type CGL 582 is positioned between the first HBL 538 and the second HTL 552, and the first P-type CGL 584 is positioned between the first N-type CGL 582 and the second HTL 552.

In the second CGL 590, the second N-type CGL 592 is positioned between the ETL 554 and the third HTL 572, and the second P-type CGL 594 is positioned between the second N-type CGL 592 and the third HTL 572.

Each of the first and second N-type CGLs 582 and 592 may be an organic layer doped with alkali metal, e.g., Li, Na, K and Cs, or alkali earth metal, e.g., Mg, Sr, Ba and Ra. For example, a host organic material for the each of the first and second N-type CGLs 582 and 592 may be one of 4,7-dipheny-1,10-phenanthroline (Bphen) and MTDATA, and the alkali metal or the alkali earth metal as the dopant may be doped by about 0.01 to 30 wt %.

Each of the first and second P-type CGLs 584 and 594 may include an inorganic material selected from the group consisting of tungsten oxide (WOx), molybdenum oxide (MoOx), beryllium oxide (Be2O3) and vanadium oxide (V2O5), an organic material selected from the group consisting of NPD, HAT-CN, F4TCNQ, TPD, N,N,N',N'-tetranaphtalenyl-benzidine (TNB), TCTA, and N,N'-dioctyl-3,4,9,10-perylenedicarboximide (PTCDI-C8), or their combination.

In the OLED D, each of the first and third EMLs 520 and 560 includes the host 522 and 562, each of which is the anthracene derivative, and the dopant 524 and 564, each of which is the boron derivative, and the anthracene core of the anthracene derivative is deuterated.

Accordingly, the OLED D including the first and third emitting parts 530 and 570 with the second emitting part 550, which emits yellow-green light or red/green light, can emit white light.

In FIG. 7, the OLED D has a triple-stack structure of the first, second and third emitting parts 530, 550 and 570. Alternatively, the OLED D may further include additional emitting part and CGL.

Referring to FIG. 5 again, a second electrode 464 is formed over the substrate 410 where the organic emitting layer 462 is formed.

In the organic light emitting display device 400, since the light emitted from the organic emitting layer 462 is incident to the color filter layer 480 through the second electrode 464, the second electrode 464 has a thin profile for transmitting the light.

The first electrode 460, the organic emitting layer 462 and the second electrode 464 constitute the OLED D.

The color filter layer 480 is positioned over the OLED D and includes a red color filter 482, a green color filter 484 and a blue color filter 486 respectively corresponding to the red, green and blue pixels RP, GP and BP.

Although not shown, the color filter layer 480 may be attached to the OLED D by using an adhesive layer. Alternatively, the color filter layer 480 may be formed directly on the OLED D.

An encapsulation film (not shown) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate (not shown) for reducing an ambient light reflection may be disposed over the top-emission type OLED D. For example, the polarization plate may be a circular polarization plate.

In FIG. 5, the light from the OLED D passes through the second electrode 464, and the color filter layer 480 is disposed on or over the OLED D. Alternatively, when the light from the OLED D passes through the first electrode 460, the color filter layer 480 may be disposed between the OLED D and the first substrate 410.

A color conversion layer (not shown) may be formed between the OLED D and the color filter layer 480. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively.

As described above, the white light from the organic light emitting diode D passes through the red color filter 482, the green color filter 484 and the blue color filter 486 in the red pixel RP, the green pixel GP and the blue pixel BP such that the red light, the green light and the blue light are provided from the red pixel RP, the green pixel GP and the blue pixel BP, respectively.

In FIGS. 5 to 7, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

Figure 8:
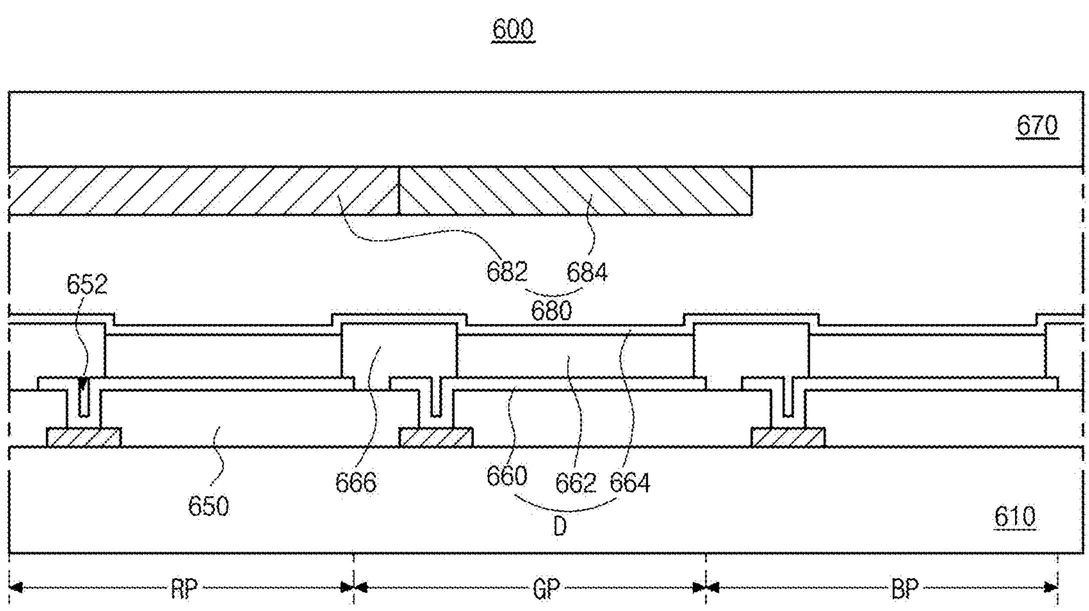
FIG. 8 is a schematic cross-sectional view illustrating an organic light emitting display device according to a third embodiment of the present disclosure.

FIG. 8 is a schematic cross-sectional view illustrating an organic light emitting display device according to a third embodiment of the present disclosure.

As shown in FIG. 7, the organic light emitting display device 600 includes a first substrate 610, where a red pixel RP, a green pixel GP and a blue pixel BP are defined, a second substrate 670 facing the first substrate 610, an OLED D, which is positioned between the first and second substrates 610 and 670 and providing white emission, and a color conversion layer 680 between the OLED D and the second substrate 670.

Although not shown, a color filter may be formed between the second substrate 670 and each color conversion layer 680.

A TFT Tr, which corresponding to each of the red, green and blue pixels RP, GP and BP, is formed on the first substrate 610, and a passivation layer 650, which has a drain contact hole 652 exposing an electrode, e.g., a drain electrode, of the TFT Tr is formed to cover the TFT Tr.

The OLED D including a first electrode 660, an organic emitting layer 662 and a second electrode 664 is formed on the passivation layer 650. In this instance, the first electrode 660 may be connected to the drain electrode of the TFT Tr through the drain contact hole 652.

An bank layer 666 covering an edge of the first electrode 660 is formed at a boundary of the red, green and blue pixel regions RP, GP and BP.

The OLED D emits a blue light and may have a structure shown in FIG. 3 or FIG. 4. Namely, the OLED D is formed in each of the red, green and blue pixels RP, GP and BP and provides the blue light.

The color conversion layer 680 includes a first color conversion layer 682 corresponding to the red pixel RP and a second color conversion layer 684 corresponding to the green pixel GP. For example, the color conversion layer 680 may include an inorganic color conversion material such as a quantum dot.

The blue light from the OLED D is converted into the red light by the first color conversion layer 682 in the red pixel RP, and the blue light from the OLED D is converted into the green light by the second color conversion layer 684 in the green pixel GP.

Accordingly, the organic light emitting display device 600 can display a full-color image.

On the other hand, when the light from the OLED D passes through the first substrate 610, the color conversion layer 680 is disposed between the OLED D and the first substrate 610.

It will be apparent to those skilled in the art that various modifications and variations can be made in the embodiments of the present disclosure without departing from the spirit or scope of the present disclosure. Thus, it is intended that the modifications and variations cover this disclosure provided they come within the scope of the appended claims and their equivalents.

What is claimed is:

1. An organic light emitting device, comprising:
a substrate; and
an organic light emitting diode positioned on the substrate and including:
a first electrode;
a second electrode facing the first electrode;
a first emitting material layer positioned between the first electrode and the second electrode and including (i) a first host of an anthracene derivative and (ii) a first dopant of a boron derivative; and
an electron blocking layer including an electron blocking material and positioned between the first electrode and the first emitting material layer,
wherein an anthracene core of the first host is deuterated, and the first dopant is a compound in Formula 4:

[Formula 4]

Dopant 3-5

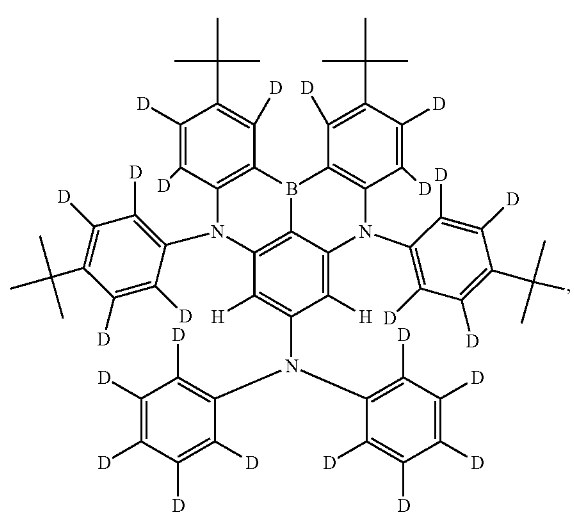

wherein the electron blocking material is represented by Formula 5:

[Formula 5]

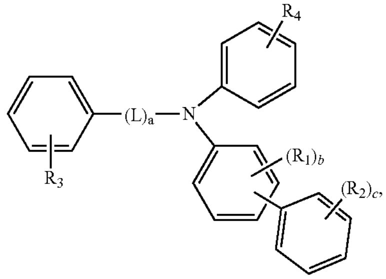

wherein in the Formula 5, L is C6 to C30 arylene group, wherein $R_1$ and $R_2$ is $C_1$ to C10 alkyl, or adjacent two of $R_1$ and $R_2$ or adjacent two of $R_2$ form an unsubstituted fused ring, wherein $R_3$ is C5 to C30 heteroaryl group containing O as the heteroatom, and $R_4$ is hydrogen or C6 to C12 aryl, wherein "a" is 0 or 1, "b" is an integer of 0 to 4, and "c" is an integer of 0 to 5, wherein the first host is one of compounds represented by Formula 2:

[Formula 2]

Host 1

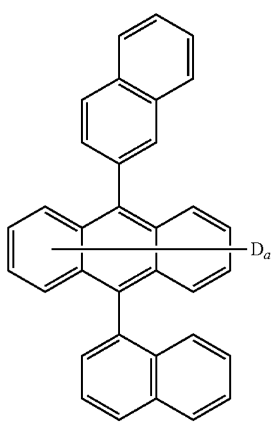

Host 2

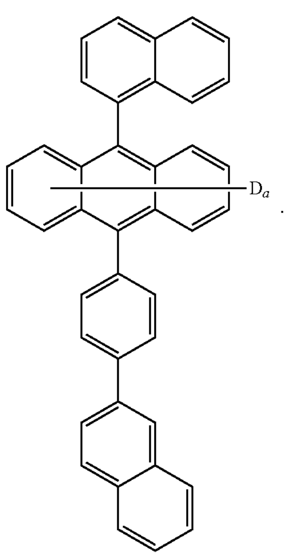

-continued

Host 4

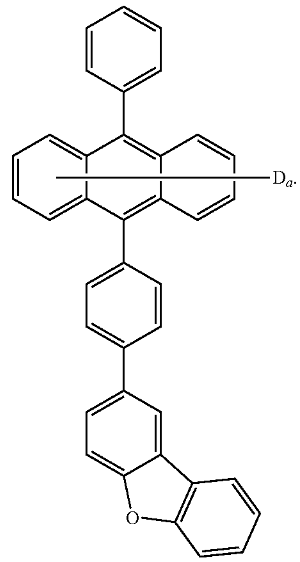

2. The organic light emitting device of claim 1, wherein the electron blocking material is one of the compounds represented by Formula 6.

[Formula 6]

E3

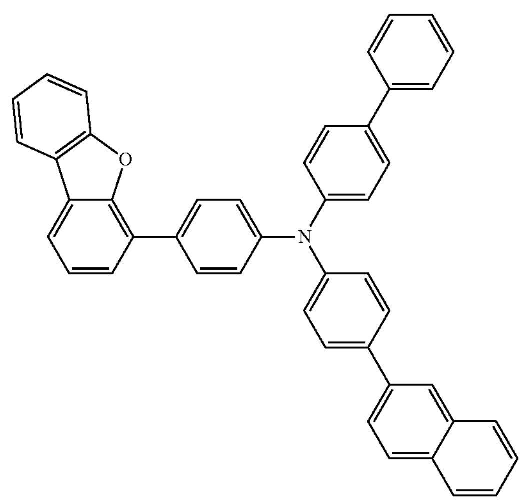

-continued
E6
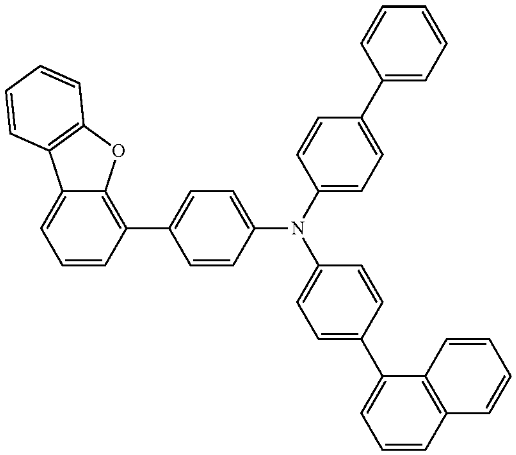
E9
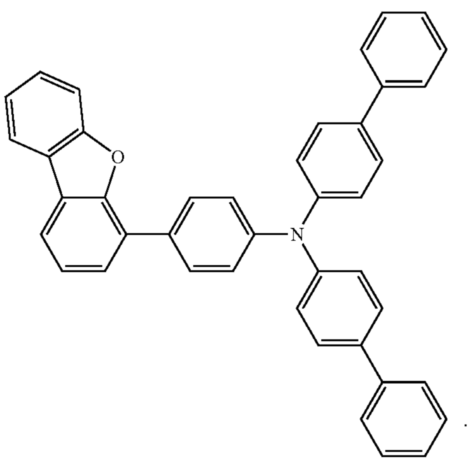
E10
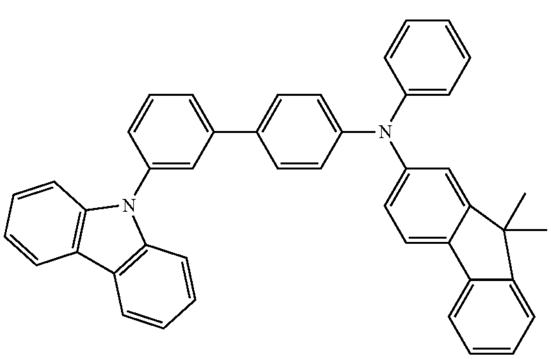
-continued
E11
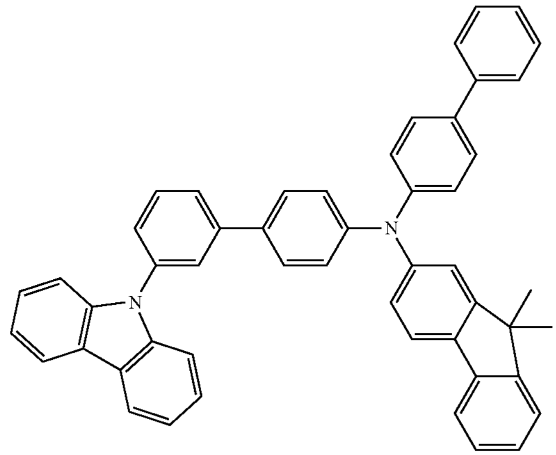
E12
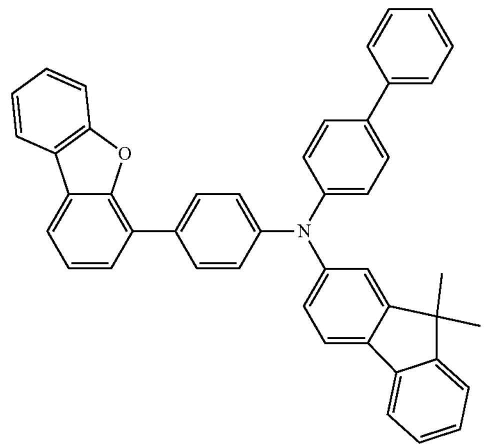
E13
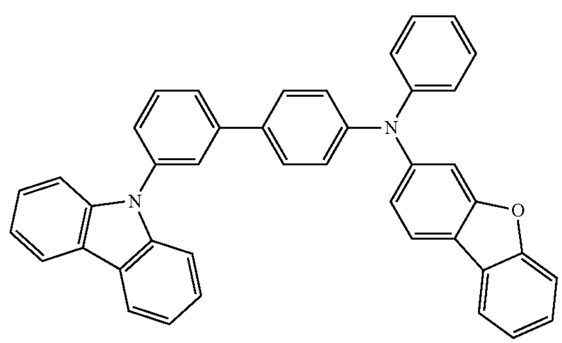

-continued
E14
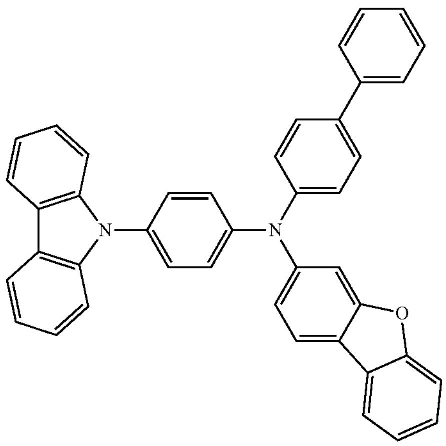
E15
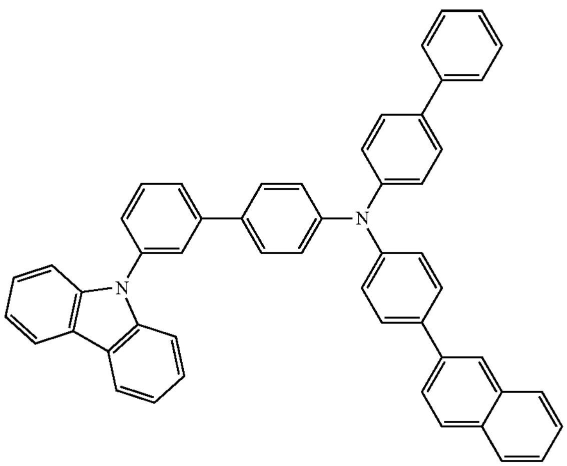
E16
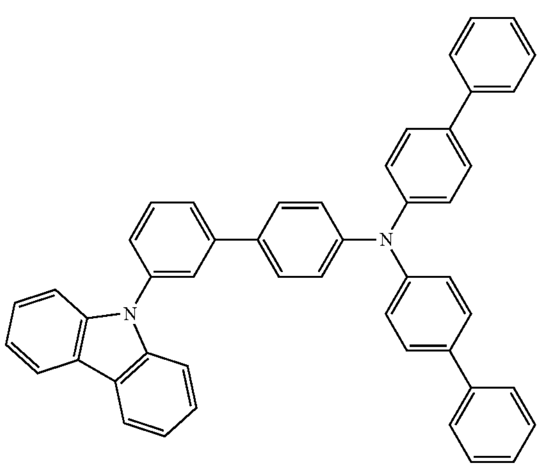
-continued
E17
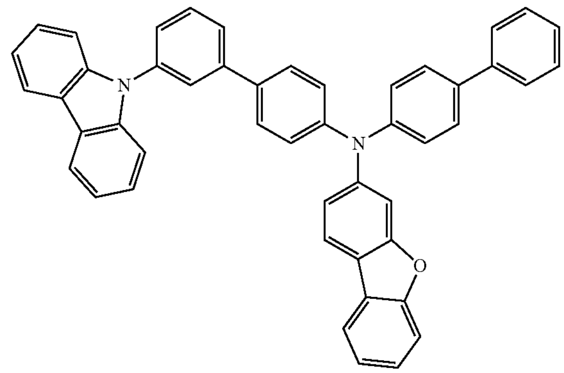
E18
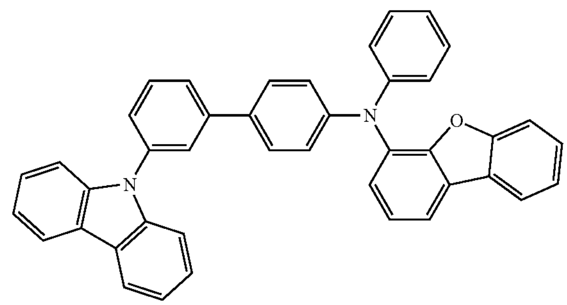
E19
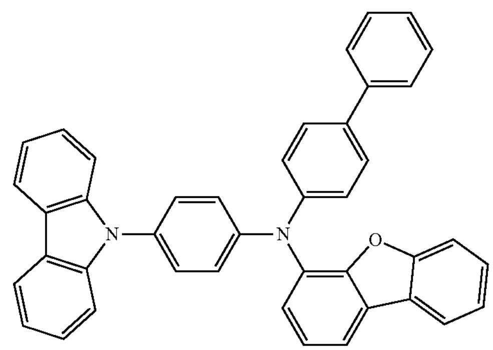
E20
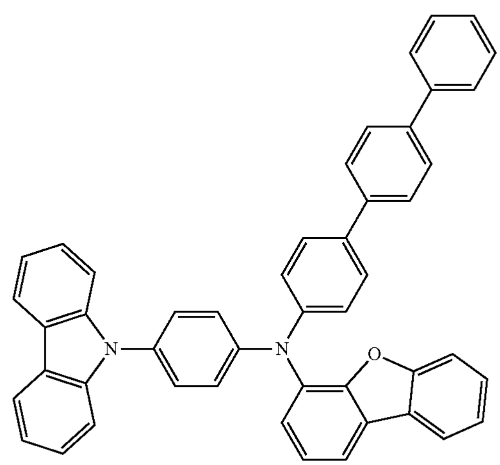

-continued

E21

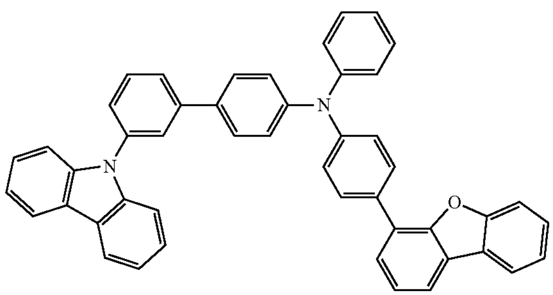

E22

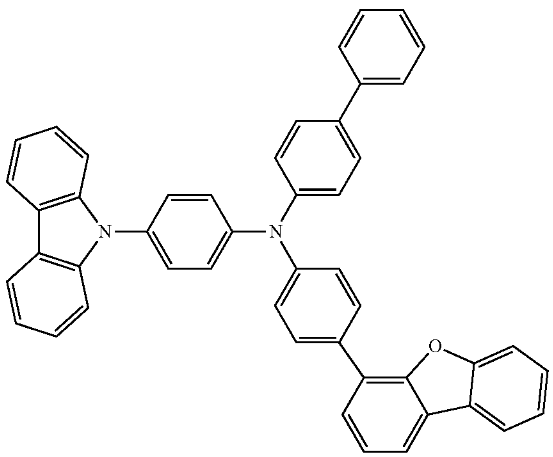

E23

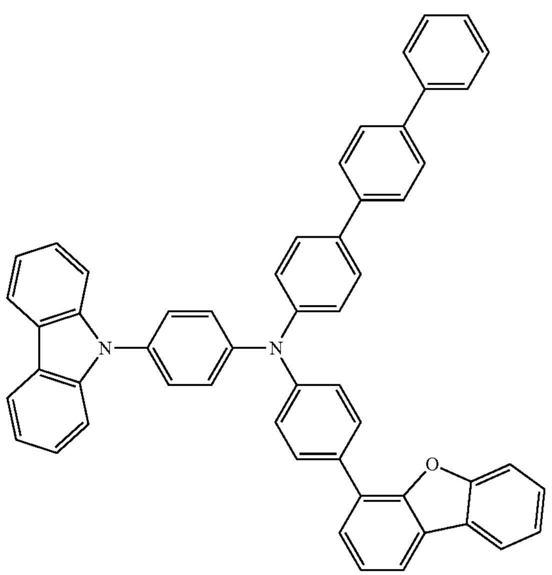

3. The organic light emitting device of claim 1, wherein the organic light emitting diode further includes a hole blocking layer including a hole blocking material and positioned between the second electrode and the first emitting material layer, wherein the hole blocking material is represented by Formula 7:

[Formula 7]

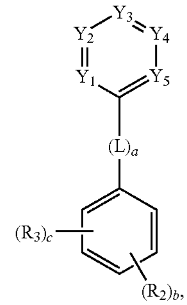

wherein each of $Y_1$ to $Y_5$ is independently $CR_1$ or N, and one to three of $Y_1$ to $Y_5$ is N, wherein $R_1$ is independently hydrogen or C6 to C30 aryl group, and L is C6 to C30 arylene group, wherein $R_2$ is C6 to C50 aryl group or C5 to C50 heteroaryl group, and $R_3$ is $C_1$ to $C_{10}$ alkyl group, or adjacent two of $R_3$ form a fused ring, and wherein "a" is 0 or 1, "b" is 1 or 2, and "c" is an integer of 0 to 4.

4. The organic light emitting device of claim 3, wherein the hole blocking material is one of the compounds represented by Formula 8:

[Formula 8]

H1

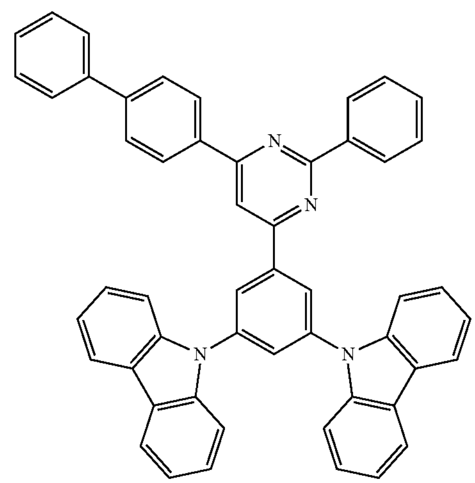

H2

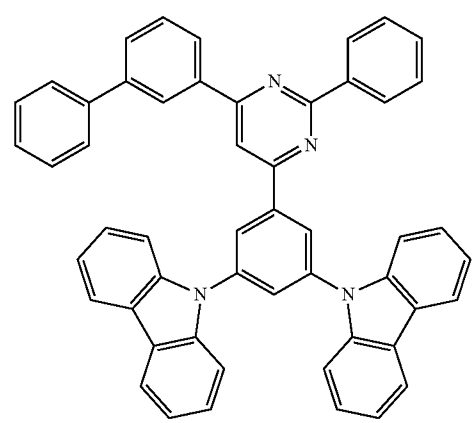

-continued
H3
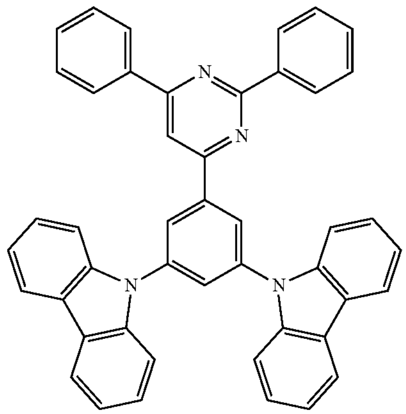
H4
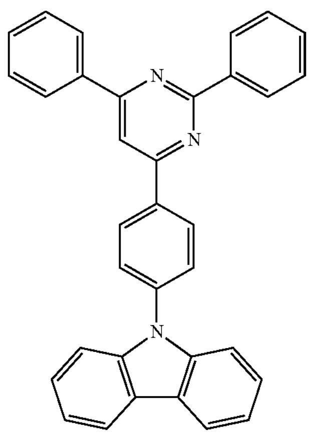
H5
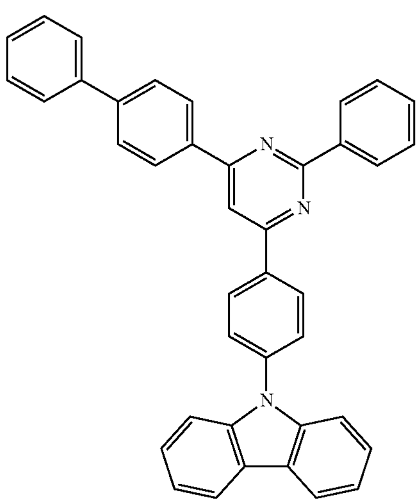
-continued
H6
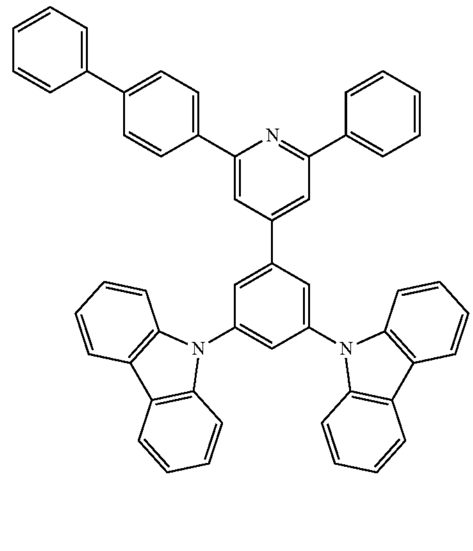
H7
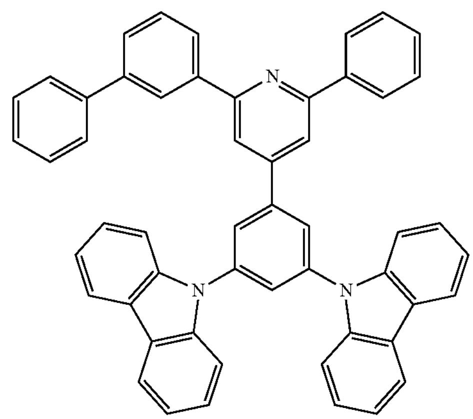
H8
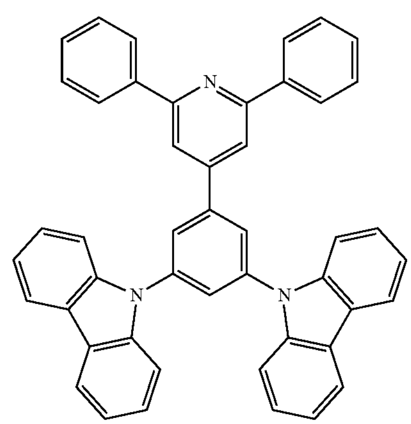

-continued
H9
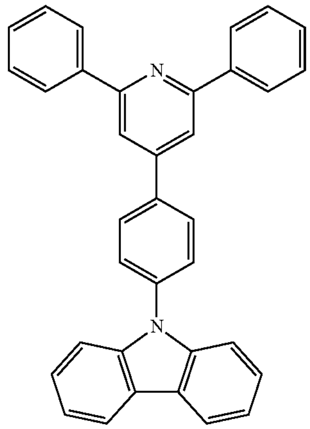
H10
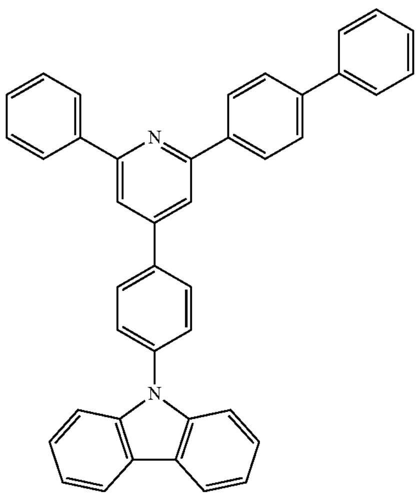
H11
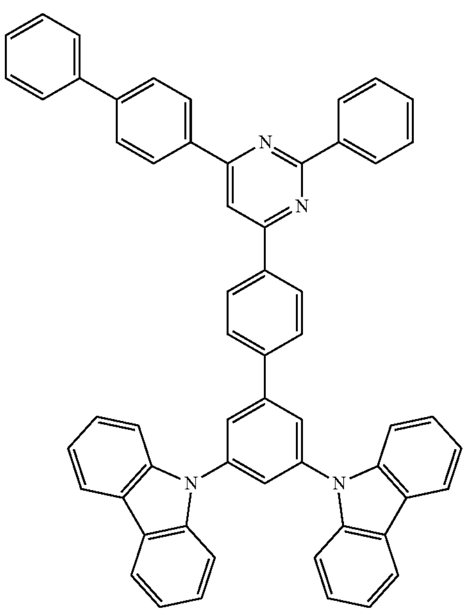
-continued
H12
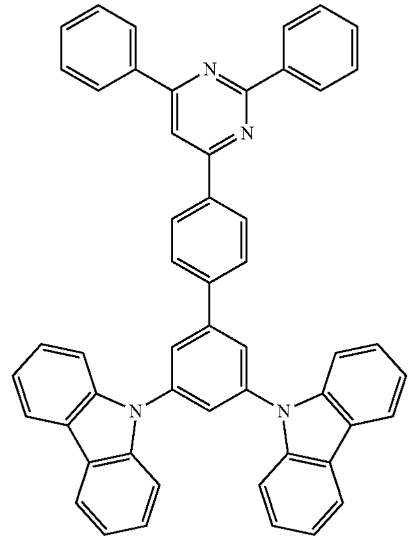
H13
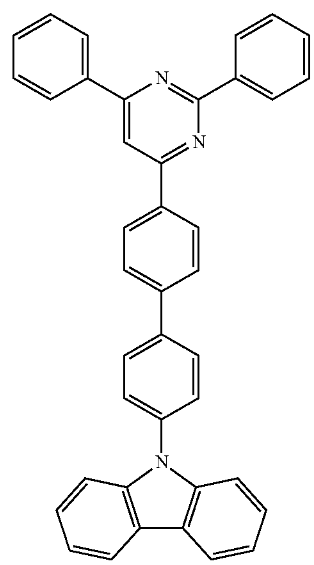

-continued
H14
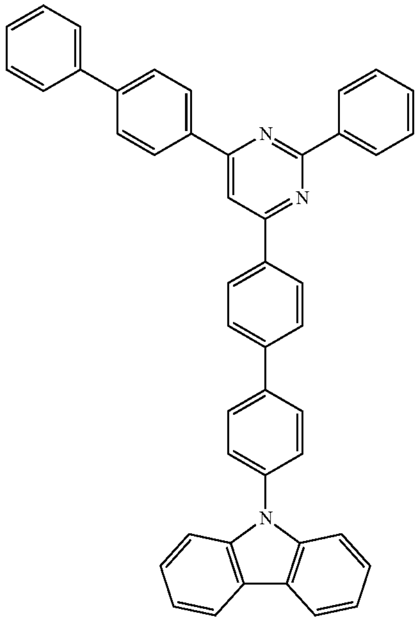
H15
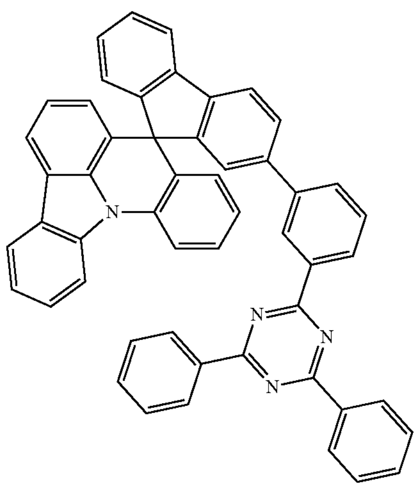
H16
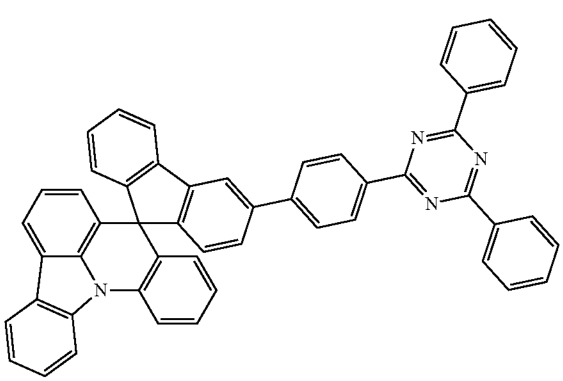
-continued
H17
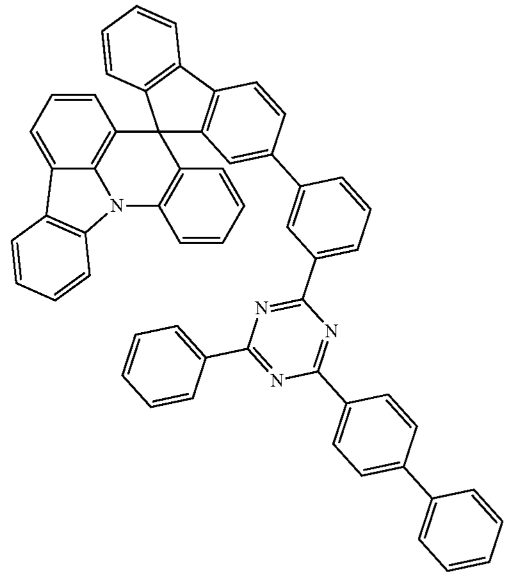
H18
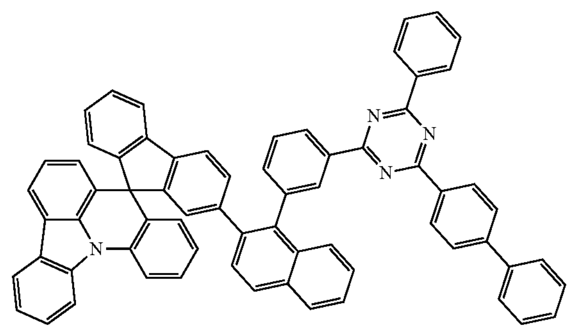
H19
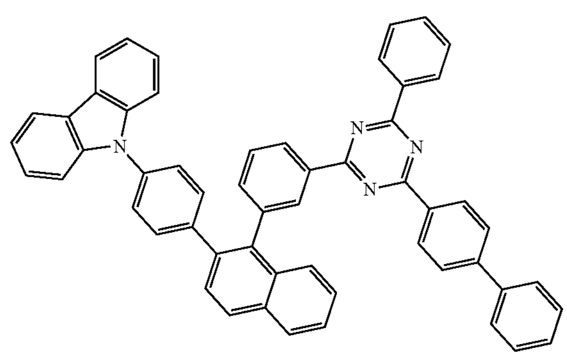

-continued

H20

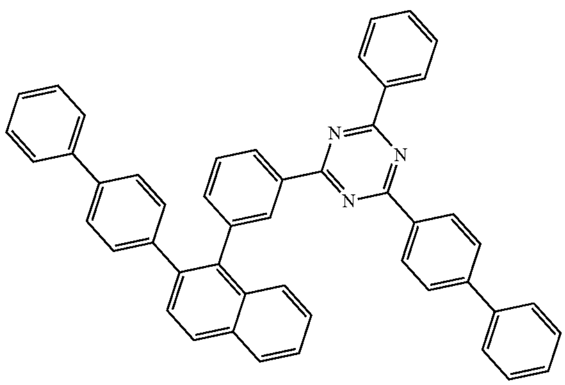

H21

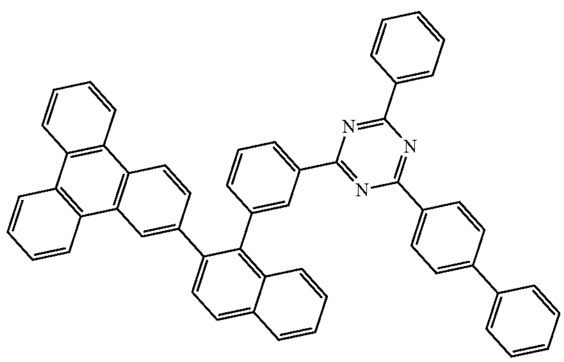

H22

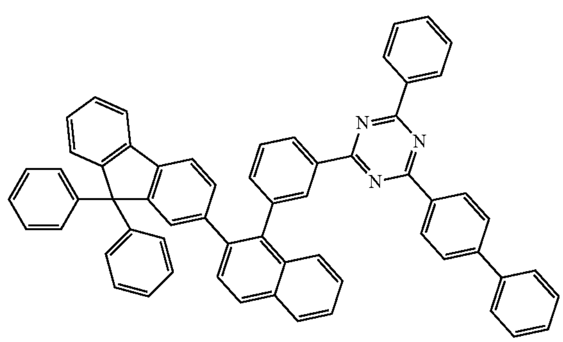

H23

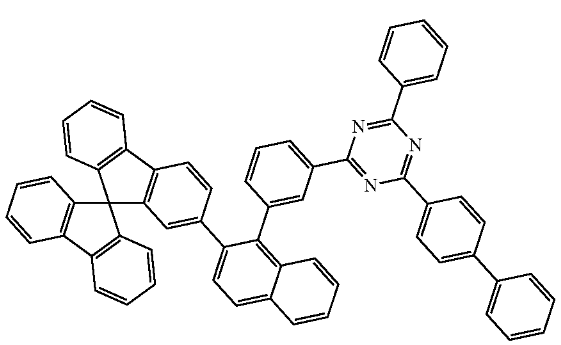

5. The organic light emitting device of claim 1, wherein the organic light emitting diode further includes a hole blocking layer including a hole blocking material and positioned between the second electrode and the first emitting material layer, wherein the hole blocking material is represented by Formula 9:

[Formula 9]

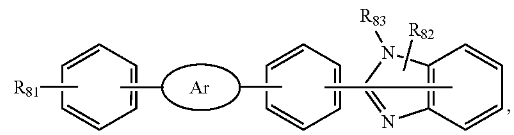

wherein Ar is C10-C30 arylene group, and wherein $R_{81}$ is C6-C30 aryl group unsubstituted or substituted with C1-C10 alkyl group or C5-C30 heteroaryl group unsubstituted or substituted with C1-C10 alkyl group, and each of $R_{82}$ and $R_{83}$ is independently hydrogen, C1-C10 alkyl group or C6-C30 aryl group.

6. The organic light emitting device of claim 5, wherein the hole blocking material is one of the compounds represented by Formula 10:

[Formula 10]

H31

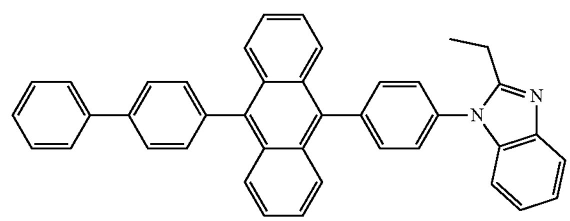

H32

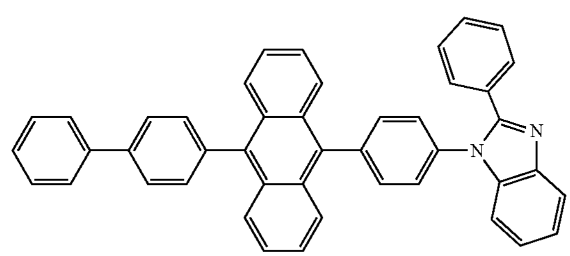

H33

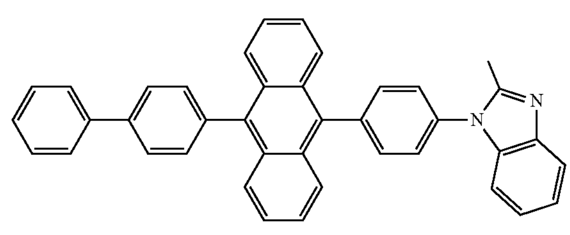

H34

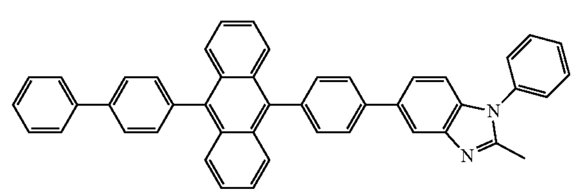

-continued

H35

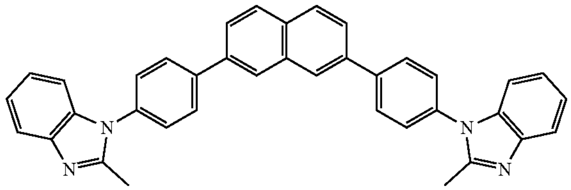

H36

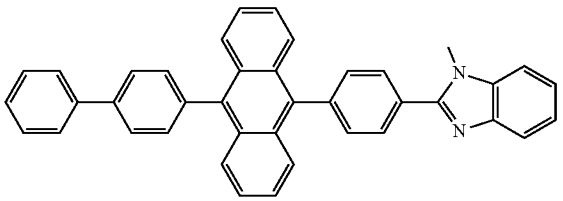

7. The organic light emitting device of claim 1, wherein the organic light emitting diode further includes:

a second emitting material layer including a second host of an anthracene derivative and a second dopant of a boron derivative and positioned between the first emitting material layer and the second electrode; and a first charge generation layer between the first and second emitting material layers.

8. The organic light emitting device of claim 7, wherein an anthracene core of the second host is deuterated.

9. The organic light emitting device of claim 1, wherein the organic light emitting diode further includes:

a second emitting material layer emitting a blue light and positioned between the first emitting material layer and the second electrode; and a first charge generation layer between the first and second emitting material layers.

10. The organic light emitting device of claim 1, wherein a red pixel, a green pixel and a blue pixel are defined on the substrate, and the organic light emitting diode corresponds to each of the red, green and blue pixels, and wherein the organic light emitting device further includes:

a color conversion layer disposed between the substrate and the organic light emitting diode or on the organic light emitting diode and corresponding to the red and green pixels.

11. The organic light emitting device of claim 7, wherein the organic light emitting diode further includes:

a third emitting material layer emitting a yellow-green light and positioned between the first charge generation layer and the second emitting material layer; and a second charge generation layer between the second and third emitting material layers.

12. The organic light emitting device of claim 7, wherein the organic light emitting diode further includes:

a third emitting material layer emitting a red light and a green light and positioned between the first charge generation layer and the second emitting material layer; and a second charge generation layer between the second and third emitting material layers.

13. The organic light emitting device of claim 7, wherein the organic light emitting diode further includes:

a third emitting material layer including a first layer and a second layer and positioned between the first charge generation layer and the second emitting material layer, wherein the first layer emits a red light, and the second layer emits a yellow-green light; and a second charge generation layer between the second and third emitting material layers.

14. The organic light emitting device of claim 13, wherein the third emitting material layer further includes a third layer emitting a green light.

15. The organic light emitting device of claim 1, wherein the organic light emitting diode further includes:

a second emitting material layer emitting a yellow-green light and positioned between the first emitting material layer and the second electrode; and a first charge generation layer between the first and second emitting material layers.

16. The organic light emitting device of one of claim 11, wherein a red pixel, a green pixel and a blue pixel are defined on the substrate, and the organic light emitting diode corresponds to each of the red, green and blue pixels, and wherein the organic light emitting device further includes:

a color filter layer disposed between the substrate and the organic light emitting diode or on the organic light emitting diode and corresponding to the red, green and blue pixels.

17. The organic light emitting device according to claim 1, further comprising:

a hole blocking layer including a hole blocking material and positioned between the second electrode and the first emitting material layer, wherein the electron blocking material is represented by Formula 6-1:

[Formula 6-1]

E3

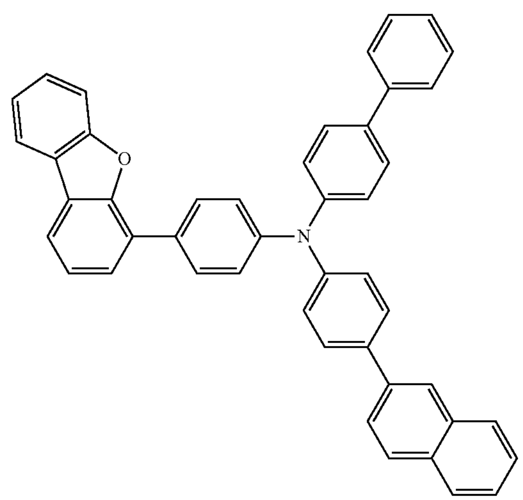

and wherein the hole blocking material is one of the compounds represented by Formula 8-1:

[Formula 8-1]
H1
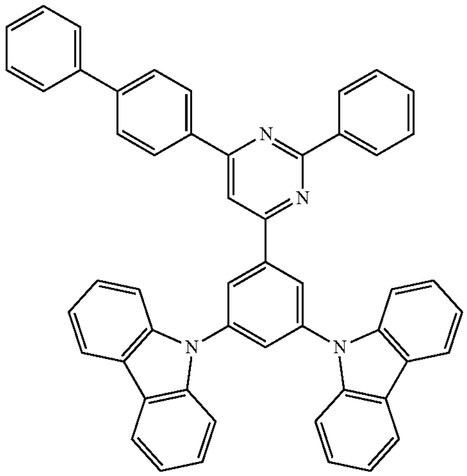
H31
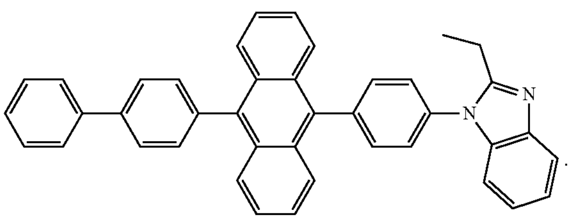
* * * * *